United States Patent
Wang et al.

(10) Patent No.: US 12,490,589 B2
(45) Date of Patent: Dec. 2, 2025

(54) DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Qiwei Wang, Beijing (CN); Yuanjie Xu, Beijing (CN); Cong Liu, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/034,069

(22) PCT Filed: Apr. 28, 2022

(86) PCT No.: PCT/CN2022/089823
§ 371 (c)(1),
(2) Date: Apr. 27, 2023

(87) PCT Pub. No.: WO2023/206218
PCT Pub. Date: Nov. 2, 2023

(65) Prior Publication Data
US 2024/0389382 A1 Nov. 21, 2024

(51) Int. Cl.
*H10K 59/131* (2023.01)
*H10K 59/121* (2023.01)
*H10K 59/65* (2023.01)

(52) U.S. Cl.
CPC ......... *H10K 59/121* (2023.02); *H10K 59/131* (2023.02); *H10K 59/65* (2023.02)

(58) Field of Classification Search
CPC .................... H10K 59/121; H10K 59/131
See application file for complete search history.

(56) References Cited

U.S. PATENT DOCUMENTS

2019/0051670 A1* 2/2019 Bei ................. H10D 86/60
2022/0069023 A1 3/2022 Lou et al.
(Continued)

FOREIGN PATENT DOCUMENTS

| CN | 110783384 A | 2/2020 |
| CN | 111048005 A | 4/2020 |

(Continued)

OTHER PUBLICATIONS

European Search Report for 22939070.3 Mailed Dec. 12, 2024.

*Primary Examiner* — Douglas M Menz
(74) *Attorney, Agent, or Firm* — Ling Wu; Stephen Yang; Ling and Yang Intellectual Property

(57) ABSTRACT

A display substrate includes a base substrate, multiple pixel circuits, multiple first light emitting elements, multiple second light emitting elements, and at least one first signal line extending along the first direction. The base substrate includes a first display area and at least one second display area. The first display area at least partially surrounds the second display area. A first signal line is located in the first display area, and is electrically connected with multiple pixels circuits of the first display area. The first signal line is partitioned into at least two first sub-signal lines by at least one second display area. Adjacent first sub-signal lines of the at least two first sub-signal lines are electrically connected by a first connector line. At least part of line segments of the first connector line are located between the multiple first pixel circuits.

20 Claims, 22 Drawing Sheets

(56) References Cited

U.S. PATENT DOCUMENTS

| | | |
|---|---|---|
| 2022/0069047 A1* | 3/2022 | Yang .................. H10K 59/131 |
| 2022/0069052 A1 | 3/2022 | Liu et al. |
| 2022/0157895 A1 | 5/2022 | Xu et al. |
| 2022/0344432 A1 | 10/2022 | Shi et al. |
| 2022/0406257 A1 | 12/2022 | Gu et al. |

FOREIGN PATENT DOCUMENTS

| | | |
|---|---|---|
| CN | 111508377 A | 8/2020 |
| CN | 112562586 A | 3/2021 |
| CN | 112599580 A | 4/2021 |
| CN | 113160742 A | 7/2021 |
| CN | 113299201 A | 8/2021 |
| CN | 113571570 A | 10/2021 |
| CN | 113745273 A | 12/2021 |
| CN | 113823642 A | 12/2021 |
| CN | 113870767 A | 12/2021 |
| CN | 114122025 A | 3/2022 |
| CN | 114373774 A | 4/2022 |
| EP | 4075512 A1 | 10/2022 |
| JP | 2010230797 A | 10/2010 |

* cited by examiner

DISPLAY SUBSTRATE AND DISPLAY DEVICE

CROSS-REFERENCE TO RELATED APPLICATION

The present application is a U.S. National Phase Entry of International Application PCT/CN2022/089823 having an international filing date of Apr. 28, 2022, and entitled "Display Substrate and Display Device", the contents of the above-identified application are incorporated herein by reference.

TECHNICAL FIELD

The present disclosure relates to, but is not limited to, the field of display technology, in particular to a display substrate and a display device.

BACKGROUND

An Organic Light Emitting Diode (OLED) and a Quantum dot Light Emitting Diode (QLED) are active light emitting display devices and have advantages such as self-luminescence, wide viewing angle, high contrast ratio, low power consumption, very high response speed, lightness and thinness, bendability, and a low cost, etc. An under display camera technology is a brand-new technology proposed for increasing a screen-to-body ratio of a display device.

SUMMARY

The following is a summary of subject matter described herein in detail. The summary is not intended to limit the protection scope of claims.

Embodiments of the present disclosure provide a display substrate and a display device.

In one aspect, an embodiment of the present disclosure provides a display substrate including a base substrate, multiple pixel circuits, multiple first light emitting elements, multiple second light emitting elements, and at least one first signal line extending along the first direction. The substrate includes a first display area and at least one second display area, wherein the first display area at least partially surrounds the at least one second display area. The multiple pixel circuits and the multiple first light emitting elements are located in the first display area. The multiple pixel circuits include multiple first pixel circuits and multiple second pixel circuits, wherein the multiple second pixel circuits include multiple second valid pixel circuits and multiple invalid pixel circuits. The multiple second light emitting elements are located in the at least one second display area. At least one first pixel circuit of the multiple first pixel circuits is electrically connected to at least one first light emitting element of the multiple first light emitting elements, and is configured to drive the at least one first light emitting element to emit light. At least one second valid pixel circuit of the multiple second valid pixel circuits is electrically connected with at least one second light emitting element of the multiple second light emitting elements, and is configured to drive the at least one second light emitting element to emit light. At least one first signal line extending along the first direction is located in the first display area and electrically connected with the multiple pixel circuits of the first display area, and the at least one first signal line is partitioned into at least two first sub-signal lines by the at least one second display area. Adjacent first sub-signal lines of the at least two first sub-signal lines are electrically connected through a first connector line, and at least part of line segments of the first connector line is located between the multiple first pixel circuits.

In some exemplary implementations, an orthographic projection of the first connector line on the base substrate satisfies at least one of the following: the orthographic projection of the first connector line on the base substrate is overlapped with an orthographic projection of at least one invalid pixel circuit of the first display area on the base substrate; the orthographic projection of the first connector line on the base substrate is located between the multiple first pixel circuits and the multiple second pixel circuits; and the orthographic projection of the first connector line on the base substrate is located in an edge region of the at least one second display area.

In some exemplary implementations, the first connector line at least includes: a first line segment, a second line segment and a third line segment which are connected sequentially; and an extension direction of the first line segment is the same as an extension direction of the third line segment, and an extension direction of the second line segment intersects with the extension direction of the first line segment.

In some exemplary implementations, orthographic projections of the first line segment and third line segment on the base substrate are overlapped with an orthographic projection of multiple invalid pixel circuits of the first display area on the base substrate, and an orthographic projection of the second line segment on the base substrate is located among the multiple pixel circuits; or an orthographic projection of the first line segment, the second line segment and the third line segment on the base substrate are overlapped with the orthographic projection of multiple invalid pixel circuits of the first display area on the base substrate.

In some exemplary implementations, the first line segment, the second line segment and the third line segment are in a structure of a same layer; or the first line segment and the third line segment are in a structure of a same layer, and the first line segment and the second line segment are located in different conductive layers.

In some exemplary implementations, in a direction perpendicular to the display substrate, each pixel circuit at least includes: an active layer, a first gate metal layer, a second gate metal layer and a first source-drain metal layer which are arranged on the base substrate; and the active layer, the first gate metal layer and the second gate metal layer of the invalid pixel circuit are all arranged discontinuously. An orthographic projection of the second line segment of the first connector line on the base substrate is located in a region where the invalid pixel circuits are located, and the orthographic projection of the second line segment on the base substrate is not overlapped with the orthographic projections of the active layer, the first gate metal layer and the second gate metal layer of the invalid pixel circuits on the base substrate.

In some exemplary implementations, the first source-drain metal layer of an invalid pixel circuit which is overlapped with the orthographic projection of the first line segment or the third line segment of the first connector line on the base substrate is not electrically connected to the active layer, the first gate metal layer, and the second gate metal layer of the invalid pixel circuit.

In some exemplary implementations, the first line segment and the third line segment of the first connector line are located on a side of the first source-drain metal layer away from the base substrate, and the second line segment and the first gate metal layer or the second gate metal layer are in a structure of a same layer.

In some exemplary implementations, when the orthographic projection of the first connector line on the base substrate is located in the edge region of the at least one second display area, the edge region of the at least one second display area is provided with a shielding trace, and an orthographic projection of the shielding trace on the base substrate covers the orthographic projection of the first connector line on the base substrate.

In some exemplary implementations, the at least one first signal line includes at least one of the followings: a light emitting control line, a first reset control line, a second reset control line, a scan line, a first initial signal line and a second initial signal line.

In some exemplary implementations, the display substrate further includes at least one second signal line which is located in the first display area and extends along the second direction, and the second direction intersects with the first direction. Among them, each second signal line is partitioned into at least two second sub-signal lines by the at least one second display area, and adjacent second sub-signal lines of the at least two second sub-signal lines are electrically connected through a second connector line.

In some exemplary implementations, the at least one second signal line includes a data line.

In some exemplary implementations, in a direction perpendicular to the display substrate, the second connector line is located on a side of the second signal line close to the base substrate.

In some exemplary implementations, the first connector line is located on a side of the second connector line away from the second display area.

In some exemplary implementations, an orthographic projection of the second connector line on the base substrate is located in an edge region of the at least one second display area; and the edge region of the at least one second display area is provided with a shielding trace, and an orthographic projection of the shielding trace on the base substrate covers the orthographic projection of the second connector line on the base substrate.

In some exemplary implementations, the shielding trace is electrically connected to a first power supply line.

In some exemplary implementations, the multiple first signal lines are divided into two groups, and each second display area has a first side and a second side which are opposite in the second direction, wherein the first group of the first signal lines bypass the second display area from the first side of the second display area through the first connector lines, and the second group of the first signal lines bypass the second display area from the second side of the second display area through the first connector line; and the second direction intersects with the first direction.

In some exemplary implementations, the base substrate includes two second display areas that are aligned in the first direction.

In some exemplary implementations, each first signal line is partitioned into three first sub-signal lines by the two second display areas; and the $1^{st}$ first sub-signal line and the $2^{nd}$ first sub-signal line are electrically connected through the $1^{st}$ first connector line, and the $2^{nd}$ first sub-signal line and the $3^{rd}$ first sub-signal line are electrically connected through the $2^{nd}$ first connector line. The $1^{st}$ first connector line bypasses the first one of the second display areas, and the $2^{nd}$ first connector line bypasses the second one of the second display areas.

In some exemplary implementations, the $1^{st}$ first connector line and the $2^{nd}$ first connector line are located on a same side of the two second display areas in the second direction, and the second direction intersects with the first direction.

In another aspect, an embodiment of the present disclosure provides a display device, which includes the aforementioned display substrate.

Other aspects may be understood upon reading and understanding the drawings and detailed description.

BRIEF DESCRIPTION OF DRAWINGS

Accompanying drawings are used for providing further understanding of technical solutions of the present disclosure, constitute a part of the specification, and are used for explaining the technical solutions of the present disclosure together with the embodiments of the present disclosure, but not to constitute limitations on the technical solutions of the present disclosure. Shapes and sizes of one or more components in the drawings do not reflect actual scales, and are only intended to schematically describe contents of the present disclosure.

DETAILED DESCRIPTION

Figure 1:
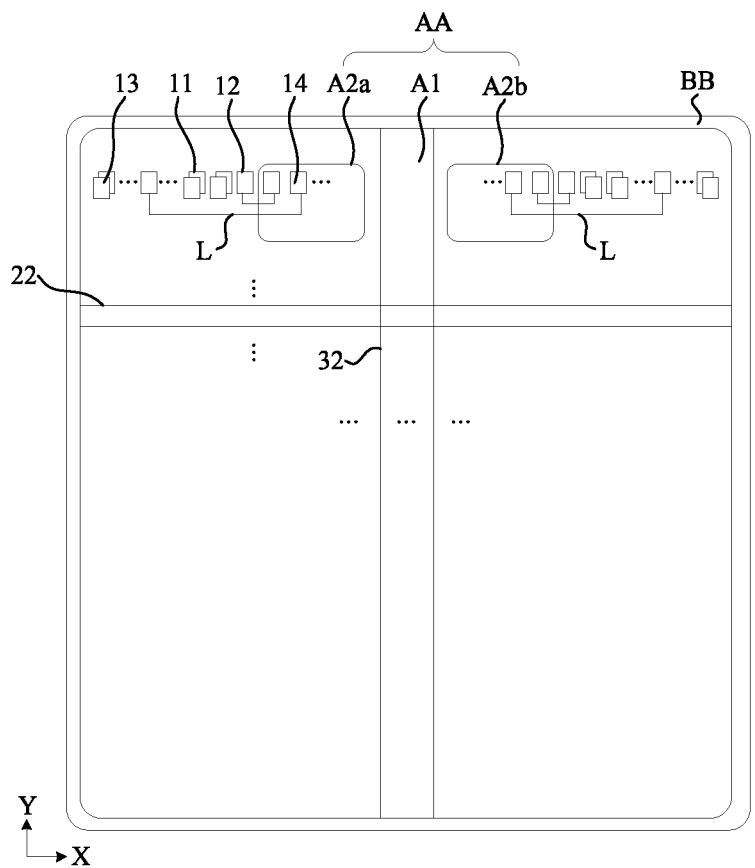
FIG. 1 is a schematic diagram of a display substrate according to at least one embodiment of the present disclosure.

The embodiments of the present disclosure will be described below with reference to the drawings in detail. Implementations may be practiced in multiple different forms. Those of ordinary skills in the art may easily understand such a fact that implementations and contents may be transformed into other forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, an implementation of the present disclosure is not necessarily limited to the size, and a shape and a size of one or more components in the drawings do not reflect an actual scale. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion between constituent elements, but not to set a limit in quantity. In the present disclosure, "multiple" represents two or more than two.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred device or element must have a particular orientation and be constructed and operated in the particular orientation. Therefore, they cannot be understood as limitations on the present disclosure. The positional relationships between the constituent elements are changed as appropriate according to a direction where the constituent elements are described. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, a detachable connection, or an integrated connection; it may be a mechanical connection or an electrical connection; it may be a direct connection, an indirect connection through an intermediate component, or an internal communication between two components. Those of ordinary skills in the art may understand meanings of the above-mentioned terms in the present disclosure according to situations.

In the specification, "electrical connection" includes a case that constituent elements are connected together through an element with a certain electrical effect. The "element with the certain electrical function" is not particularly limited as long as electrical signals can be transmitted between the connected constituent elements. Examples of the "element with the certain electrical function" not only include an electrode and a wiring, but further include a switch element such as a transistor, a resistor, an inductor, a capacitor, another element with multiple functions, etc.

In the specification, a transistor refers to an element which at least includes three terminals, i.e., a gate electrode, a drain electrode, and a source electrode. The transistor has a channel region between the drain electrode (drain terminal, drain region, or drain) and the source electrode (source terminal, source region, or source), and a current can flow through the drain electrode, the channel region, and the source electrode. In the specification, the channel region refers to a region through which a current mainly flows.

In the specification, a first electrode may be a drain electrode and a second electrode may be a source electrode, or, the first electrode may be a source electrode and the second electrode may be a drain electrode. In a case that transistors with opposite polarities are used, or in a case that a direction of a current changes during operation of a circuit, or the like, functions of the "source electrode" and the "drain electrode" may sometimes be interchangeable. Therefore, the "source electrode" and the "drain electrode" may be interchangeable in the specification. In addition, the gate may also be referred to as a control electrode.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be chamfers, arc edges and deformations, etc.

A "light transmittance" in the present disclosure refers to an ability of light passing through a medium, and is a percentage of luminous flux passing through a transparent or translucent body to its incident luminous flux.

In the present disclosure, "about" and "substantially" refer to a case that a boundary is not defined strictly and a process and measurement error within a range is allowed. In the present disclosure, "substantially the same" is a case where numerical values differ by less than 10%.

An embodiment of the present disclosure provides a display substrate including a base substrate, multiple pixel circuits, multiple first light emitting elements, multiple second light emitting elements, and at least one first signal line. The base substrate includes a first display area and at least one second display area, wherein the first display area at least part partially surrounds the at least one second display area. The multiple pixel circuits and the multiple first light emitting elements are located in the first display area. The multiple pixel circuits include multiple first pixel circuits, multiple second pixel circuits, wherein the multiple second pixel circuits include multiple second valid pixel circuits and multiple invalid pixel circuits. The multiple second light emitting elements is located in the at least one second display area. At least one first pixel circuit of the multiple first pixel circuits is electrically connected with at least one first light emitting element of the multiple first light emitting elements, and is configured to drive the at least one first light emitting element to emit light. At least one second valid pixel circuit of the multiple second valid pixel circuits is electrically connected with at least one second light emitting element of the multiple second light emitting elements, and is configured to drive the at least one second light emitting element to emit light. At least one first signal line extending along the first direction is located in the first display area and electrically connected with the multiple pixel circuits of the first display area, and the first signal line is partitioned into at least two first sub-signal lines by the at least one second display area. Adjacent first sub-signal lines of the at least two first sub-signal lines are electrically connected through a first connector line. At least part of line segments of the first connector line is located between the multiple first pixel circuits.

The display substrate according to this embodiment utilizes the first connector line to connect the adjacent first sub-signal lines of the first signal lines, which may ensure signal transmission of the first signal lines, for example, a bilateral drive may be supported. Moreover, the at least part of the line segments of the first connector line are located between multiple first pixel circuits, for example, may be arranged in a region where the invalid pixel circuits are located, or in an interval between the pixel circuits, or an edge region of the at least one second display area, so that the space may be reasonably arranged and a size of the at least one second display area can be guaranteed.

In some exemplary implementations, an orthographic projection of the first connector line on the base substrate may satisfy at least one of the following: the orthographic projection of the first connector line on the base substrate is overlapped with an orthographic projection of at least one invalid pixel circuit of the first display area on the base substrate. The orthographic projection of the first connector line on the base substrate is located between the multiple first pixel circuits and the multiple second pixel circuits. The orthographic projection of the first connector line on the base substrate is located in an edge region of the at least one second display area.

In some examples, an orthographic projection of at least one first connector line on the base substrate may be overlapped with an orthographic projection of the at least one invalid pixel circuit on the base substrate. In some other examples, an orthographic projection of the at least one first connector line may be located between adjacent pixel circuits. In some other examples, an orthographic projection of the at least one first connector line on the base substrate may be located in an edge region of a second display area. In some other examples, an orthographic projection of a portion of the at least one first connector line on the base substrate may be overlapped with an orthographic projection of the at least one invalid pixel circuit on the base substrate, and an orthographic projection of the other portion of the at least one invalid pixel circuit on the base substrate may be located between adjacent pixel circuits. In some other examples, an orthographic projection of a portion of the at least one first connector line on the base substrate may be overlapped with an orthographic projection of at least one invalid pixel circuit on the base substrate, and an orthographic projection of the other portion of at least one invalid pixel circuit on the base substrate may be located in an edge region of the second display area. In some other examples, an orthographic projection of one portion of the at least one first connector line on the base substrate may be located between adjacent pixel circuits, and the other portion may be located in an edge region of the second display area. In some examples, an edge region of a second display area may refer to a region of a periphery of light emitting elements of the second display area where no pixel circuit is provided.

In some examples, the number of second display areas may be one, two or more. However, this embodiment is not limited thereto.

In some examples, the orthographic projection of the first connector line on the base substrate is overlapped with the orthographic projection of the at least one invalid pixel circuit on the base substrate, so that the first connector line does not need to occupy the arrangement space of the valid pixel circuits, and does not occupy the space of the at least one second display area either, which not only ensures that a drive signal is provided to the pixel circuit, but also ensures the size of the at least one second display area.

In some exemplary implementations, the first connector line may at least include a first line segment, a second line segment, and third line segment which are sequentially connected. Among them, an extension direction of the first line segment may be the same as an extension direction of the third line segment, and the extension direction of the second line segment may intersect with the extension direction of the first line segment. For example, the extension direction of the second line segment may be perpendicular to the extension direction of the first line segment.

In some exemplary implementations, orthographic projections of the first line segment and the third line segment of the first connector line on the base substrate may be overlapped with an orthographic projection of the multiple invalid pixel circuits on the base substrate, and an orthographic projection of the second line segment on the base substrate is located between the multiple pixel circuits. Or, the orthographic projections of the first line segment, the second line segment and the third line segment on the base substrate are overlapped with an orthographic projection of the multiple invalid pixel circuits of the first display area on the base substrate. For example, the first line segment and the third line segment may be in a structure of a same layer, and the second line segment may be located on a side of the first line segment close to the base substrate. However, this embodiment is not limited thereto.

In some exemplary implementations, the first line segment, the second line segment and the third line segment of the first connector line may be located on a side of the first signal line away from the base substrate. For example, the first line segment, the second line segment and the third line segment of the first connector line may be in a structure of a same layer. In other words, the first connector line may have an integral structure. However, this embodiment is not limited thereto.

In some exemplary implementations, in a direction perpendicular to the display substrate, a pixel circuit may include: an active layer, a first gate metal layer, a second gate metal layer and a first source-drain metal layer which are arranged on the base substrate. The active layer, the first gate metal layer, and the second gate metal layer of the invalid pixel circuit may be arranged discontinuously. The active layer of the invalid pixel circuits may be discontinuous, the first gate metal layer may be discontinuous, and the second gate metal layer may also be discontinuous. An orthographic projection of the second line segment of the first connector line on the base substrate may be located in a region where an invalid pixel circuit is located, and the orthographic projection of the second line segment of the first connector line on the base substrate may not be overlapped with orthographic projections of the active layer, the first gate metal layer and the second gate metal layer of the invalid pixel circuits on the base substrate. In some examples, the first gate metal layer may include gate electrodes of transistors and first capacitor plates of storage capacitors of the pixel circuits, the second gate metal layer may include second capacitor plates of the storage capacitor of the pixel circuits, and the first source-drain metal layer may include multiple connection electrodes. In this example, by removing part of film layer structures of the invalid pixel circuits, the second line segment may be provided with arrangement space and a capacitance of the second line segment may be reduced.

In some exemplary implementations, the first source-drain metal layer of an invalid pixel circuit which is overlapped with the orthographic projection of the first line segment or the third line segment of the first connector line on the base substrate may be not electrically connected to the active layer, the first gate metal layer, and the second gate metal layer of the invalid pixel circuit. In this example, by removing part of the film layer structures of the invalid pixel circuits, the first line segment may be provided with the arrangement space and the capacitance of the first line segment may be reduced.

In some exemplary implementations, the first line segment and the third line segment of the first connector line may be located on a side of the first source-drain metal layer away from the base substrate, and the second line segment of the first connector line may be in a same layer with the first gate metal layer or the second gate metal layer. However, this embodiment is not limited thereto.

In some exemplary implementations, the at least one first signal line may include at least one of the followings: a light emitting control line, a first reset control line, a second reset control line, a scan line, a first initial signal line and a second initial signal line. For example, the first signal line may include a light emitting control line and a first reset control line.

In some exemplary implementations, the orthographic projection of the first connector line on base substrate may be located in an edge region of a second display area. For example, the edge region of the second display area may be provided with a shielding trace, and an orthographic projection of the shielding trace on the base substrate may cover the orthographic projection of the first connector line on the base substrate. In this example, the first signal line may be wound in the edge region of the second display area, which may reduce the load of the first signal line, so that the display uniformity is improved. Moreover, the first connector line in the edge region of the second display area is shielded by the shielding trace, which may improve the interference caused by gaps between multiple first connector lines.

In some exemplary implementations, the display substrate may further include at least one second signal line which is located in the first display area and extends along a second direction. The second direction may interact with the first direction. Among them, a second signal line may be partitioned into at least two second sub-signal lines by the at least one second display area. Adjacent second sub-signal lines of the at least two second sub-signal lines may be electrically connected through a second connector line. In this example, with the second connector line, the at least one second signal line may bypass the at least one second display area, so that the space of the at least one second display area may be avoided from being occupied.

In some exemplary implementations, the at least one second signal line may include a data line. However, this embodiment is not limited thereto. In some other examples, the at least one second signal line may include an initial signal line (for example, including a first initial signal line and a second initial signal line).

In some exemplary implementations, in a direction perpendicular to the display substrate, the second connector line may be located on a side of the at least one second signal line close to the base substrate. However, this embodiment is not limited thereto. For example, the second connector line may be located on a side of the second signal line away from the base substrate.

In some exemplary implementations, the first connector line may be located on a side of the second connector line away from the second display area. In this example, the traces may be effectively prevented from intersecting.

In some exemplary implementations, the orthographic projection of the second connector line on base substrate may be located in an edge region of a second display area. The edge region of the second display area may be provided with a shielding trace. An orthographic projection of the shielding trace on the base substrate may cover the orthographic projection of the second connector line on the base substrate. In this example, the at least one second signal line may be wound in the edge region of the second display area, which may reduce the load of the at least one second signal line, so that the display uniformity is improved. Moreover, the second connector line in the edge region of the second display area is shielded by the shielding trace, which may improve the interference caused by gaps between multiple second connector lines.

In some exemplary implementations, the shielding trace may be electrically connected to a first power supply line. However, this embodiment is not limited thereto. For example, the shielding trace may be electrically connected with another trace that transmits a direct-current voltage signal.

In some exemplary implementations, multiple first signal lines may be divided into two groups, and the second display area has a first side and a second side which are opposite in the second direction. The first group of the first signal lines may bypass the second display area from the first side of the second display area through a first connector line, and the second group of first signal lines may bypass the second display area from the second side of the second display area through a first connector line. The second direction interacts with the first direction. In some examples, by arranging the multiple first signal lines to bypass the second display area from the upper and lower sides of the second display area, the arrangement of the multiple first signal lines and the first connector lines is facilitated, and adverse effects caused by too dense traces are avoided.

In some exemplary implementations, the base substrate may include two second display areas that may be aligned in the first direction. However, this embodiment is not limited thereto. For example, the two second display areas may be arranged sequentially along the first direction, and there may be some misalignment in the second direction.

Solutions of the embodiment will be described below through some examples.

FIG. 1 is a schematic diagram of a display substrate according to at least one embodiment of the present disclosure. In some exemplary implementations, as shown in FIG. 1, the display substrate may include a display area AA and a peripheral region BB located on a periphery of the display area AA. The display area AA of the display substrate may include a first display area A1 and two second display areas (for example, a second display area A2a and a second display area A2b). The first display area A1 may be located on at least one side of the two second display areas A2a and A2b. For example, the first display area A1 may surround the two second display areas A2a and A2b. However, this embodiment is not limited thereto. For example, the first display area A1 may surround the second display area A2a and partially surround the second display area A2b. Or, the first display area A1 may partially surround the second display area A2a and partially surround the second display area A2b.

In some exemplary implementations, as shown in FIG. 1, the display area AA may have a shape of a rectangle, e.g., a rounded rectangle. The second display areas A2a and A2b may be rectangles, for example, rounded rectangles. However, this embodiment is not limited thereto. For example, the display area AA may be circular, elliptical, pentagonal, or in another shape. For another example, the second display area may be circular, elliptical, hexagonal, pentagonal or in another shape.

In some exemplary implementations, as shown in FIG. 1, the two first display areas A2a and A2b may be arranged sequentially along the first direction X. For example, the two second display areas A2a and A2b may have the shapes and sizes, and may be aligned in the first direction X and may not be misaligned in the second direction Y. For example, distances from upper edges of the second display areas A2a and A2b to an upper edge of the display area AA may be the same. In some example, the first direction X intersects with the second direction Y, for example, the first direction X may be perpendicular to the second direction Y. However, this embodiment is not limited thereto. For example, the shapes or sizes of the two second display areas A2a and A2b may be different. For another example, the two second display areas A2a and A2b may be misaligned in the second direction Y, for example, the distance from the upper edge of the second display area A2a to the upper edge of the display area AA may be less than or equal to the distance from the upper edge of the second display area A2b to the upper edge of the display area AA.

In some exemplary implementations, as shown in FIG. 1, the two second display areas A2a and A2b may be light-transmissive display areas and may also be referred to as Under Display Camera (UDC) regions. The first display area A1 may be a non-light-transmissive display area and may also be referred to as a normal display area. For example, an orthographic projection of a photosensitive sensor (such as a camera and other hardware) on the display substrate may be located in the second display areas A2a and A2b of the display substrate. In some examples, as shown in FIG. 1, the second display area A2a may be a rectangle (for example, a rounded rectangle), and a size of the orthographic projection of the photosensitive sensor on the display substrate may be less than or equal to a size of an inscribed circle of the second display area A2a. However, this embodiment is not limited thereto. In some other examples, a second display area may be a circle, and the size of the orthographic projection of the photosensitive sensor on the display substrate may be less than or equal to the size of the second display area.

In some exemplary implementations, as shown in FIG. 1, the two second display areas A2a and A2b may be located at a center position of the top of the display area AA. The first display area A1 may surround the second display areas A2a and A2b. However, this embodiment is not limited thereto. For example, the two second display areas A2a and A2b may be located in other positions such as an upper left corner or an upper right corner of the display area AA. For example, the first display area A1 may surround at least one side of the second display area A2a, and the first display area A1 may surround at least one side of the second display area A2b.

In some exemplary implementations, the display area AA may be provided with multiple sub-pixels. At least one sub-pixel may include a pixel circuit and a light emitting element. The pixel circuit may be configured to drive a light emitting element connected to the pixel circuit. For example, the pixel circuit may be configured to provide a drive current for driving the light emitting element to emit light. For example, the pixel circuit may include multiple transistors and at least one capacitor, for example, the pixel circuit may be in a 3T1C (i.e. three transistors and one capacitor) structure, a 7T1C (i.e. seven transistors and one capacitor) structure, a 5T1C (i.e. five transistors and one capacitor) structure, a 8T1C (i.e. eight transistors and one capacitor) structure, or a 8T2C (i.e. eight transistors and two capacitors) structure. In some examples, the light emitting element may be an Organic Light Emitting Diode (OLED), and the light emitting element emits red light, green light, blue light, or white light, etc. when driven by a pixel circuit corresponding to the light emitting element. A color of light emitted from the light emitting element may be determined as required. In some examples, the light emitting element may include an anode, a cathode, and an organic emitting layer disposed between the anode and the cathode. The anode of the light emitting element may be electrically connected with a corresponding pixel circuit. However, this embodiment is not limited thereto.

In some exemplary implementations, a pixel unit in the display area AA may include three sub-pixels, wherein the three sub-pixels may be a red sub-pixel, a green sub-pixel, and a blue sub-pixel respectively. However, this embodiment is not limited thereto. In some examples, one pixel unit may include four sub-pixels, which may be a red sub-pixel, a green sub-pixel, a blue sub-pixel, and a white sub-pixel respectively.

In some exemplary implementations, a shape of the light emitting element may be a rectangle, a rhombus, a pentagon, or a hexagon. When a pixel unit includes three sub-pixels, light emitting elements of the three sub-pixels may be arranged side by side horizontally, side by side vertically, or in a triangle-shaped arrangement. When a pixel unit includes four sub-pixels, light emitting elements of the four sub-pixels may be arranged side by side horizontally, side by side vertically, or in a square-shaped arrangement. However, this embodiment is not limited thereto.

Figure 2:
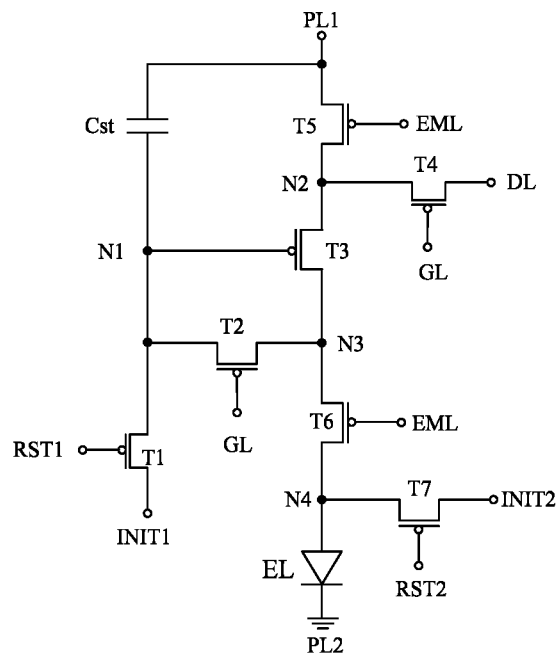
FIG. 2 is an equivalent circuit diagram of a pixel circuit according to at least one embodiment of the present disclosure.
Figure 3:
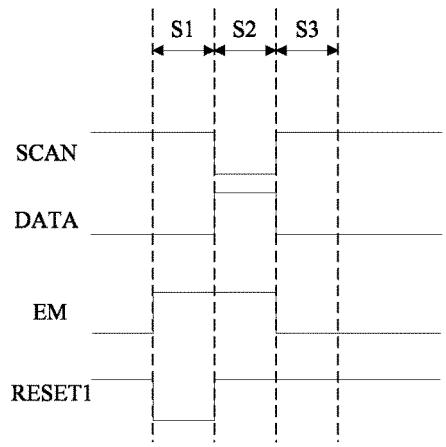
FIG. 3 is an operating timing diagram of the pixel circuit shown in FIG. 2.

FIG. 2 is an equivalent circuit diagram of a pixel circuit according to at least one embodiment of the present disclosure. FIG. 3 is an operating timing diagram of the pixel circuit provided in FIG. 2. The pixel circuit of the present exemplary embodiment is described by taking a 7T1C structure as an example. However, this embodiment is not limited thereto.

In some exemplary implementations, as shown in FIG. 2, the pixel circuit of this example may include six switching transistors (T1, T2, and T4 to T7), one drive transistor T3, and one storage capacitor Cst. The six switching transistors are respectively a data writing transistor T4, a threshold compensation transistor T2, a first light emitting control transistor T5, a second light emitting control transistor T6, a first reset transistor T1, and a second reset transistor T7. The light emitting element EL may include an anode, a cathode and an organic light emitting layer arranged between the anode and the cathode.

In some exemplary implementations, the drive transistor and the six switching transistors may be P-type transistors or may be N-type transistors. Use of a same type of transistors in the pixel circuit may simplify a process flow, reduce a process difficulty of the display substrate, and improve a yield of products. In some exemplary implementations, the drive transistor and the six switching transistors may include a P-type transistor and an N-type transistor.

In some exemplary implementations, Low Temperature Poly-Silicon thin film transistors, or oxide thin film transistors, or a Low Temperature Poly-Silicon thin film transistor and an oxide thin film transistor may be used for the drive transistor and the six switching transistors. An active layer of the Low Temperature Poly-Silicon thin film transistor is made of Low Temperature Poly-Silicon (LTPS), and an active layer of the oxide thin film transistor is made of an oxide semiconductor (Oxide). A Low temperature Poly-Silicon thin film transistor has advantages such as a high mobility and fast charging, while an oxide thin film transistor has an advantage such as a low leakage current. The Low Temperature Poly-Silicon thin film transistor and the oxide thin film transistor are integrated on one display substrate to form a Low Temperature Polycrystalline Oxide (LTPO) display substrate, and advantages of both the Low Temperature Poly-Silicon thin film transistor and the oxide thin film transistor may be utilized, which may achieve low frequency drive, reduce power consumption, and improve display quality.

In some exemplary implementations, as shown in FIG. 2, a display substrate may include a scan line GL, a data line DL, a first power supply line PL1, a second power supply line PL2, a light emitting control line EML, a first initial signal line INIT1, a second initial signal line INIT2, a first reset control line RST1, and a second reset control line RST2. In some examples, the first power supply line PL1 may be configured to provide a constant first voltage signal VDD to a pixel circuit, the second power supply line PL2 may be configured to provide a constant second voltage signal VSS to the pixel circuit, wherein the first voltage signal VDD is greater than the second voltage signal VSS. The scan line GL may be configured to provide a scan signal SCAN to the pixel circuit, the data line DL may be configured to provide a data signal DATA to the pixel circuit, the light emitting control line EML may be configured to provide a light emitting control signal EM to the pixel circuit, the first reset control line RST1 may be configured to provide a first reset control signal RESET1 to the pixel circuit, and the second reset control line RST2 may be configured to provide a second reset control signal RESET2 to the pixel circuit. In some examples, in a pixel circuit of an n-th row, a first reset control line RST1 (n) may be electrically connected with a scan line GL of a pixel circuit of an (n−1)-th row to be inputted with a scan signal SCAN (n−1), that is, the first reset control signal RESET1 (n) is the same as the scan signal SCAN (n−1). A second reset control line RST2 (n) may be electrically connected with a scan line GL of a pixel circuit of the n-th row, to be inputted with a scan signal SCAN (n), that is, the second reset control signal RESET2 (n) is the same as the scan signal SCAN (n−1). In some examples, a second reset control line RST2 with which the pixel circuit of the n-th row is electrically connected and a first reset control line RST1 with which a pixel circuit of an (n+1)-th row is electrically connected may be of an integral structure. Herein, n is an integer greater than 0. Thus, signal lines of the display substrate may be reduced, and a narrow bezel design of the display substrate may be achieved. However, this embodiment is not limited thereto.

In some exemplary implementations, the first initial signal line INIT1 may be configured to provide a first initial signal to the pixel circuit, the second initial signal line INIT2 may be configured to provide a second initial signal to the pixel circuit. For example, the first initial signal may be from the second initial signal. The first initial signal and the second initial signal may be constant voltage signals, and their magnitudes may be between magnitudes of a first voltage signal VDD and a second voltage signal VSS, but are not limited thereto. In some other examples, the first initial signal and the second initial signal may be the same, and only the first initial signal line may be provided to provide the first initial signal.

In some exemplary implementations, as shown in FIG. 2, the drive transistor T3 is electrically connected with the light emitting element EL, and outputs a drive current for driving the light emitting element EL to emit light under control of the scan signal SCAN, the data signal DATA, the first voltage signal VDD, the second voltage signal VSS and etc. A gate of the data writing transistor T4 is electrically connected with the scan line GL, a first electrode of the data writing transistor T4 is electrically connected with the data line DL, and a second electrode of the data writing transistor T4 is electrically connected with a first electrode of the drive transistor T3. A gate of the threshold compensation transistor T2 is electrically connected with the scan line GL, a first electrode of the threshold compensation transistor T2 is electrically connected with a gate of the drive transistor T3, and a second electrode of the threshold compensation transistor T2 is electrically connected with a second electrode of the drive transistor T3. A gate of the first light emitting control transistor T5 is electrically connected with the light emitting control line EML, a first electrode of the first light emitting control transistor T5 is electrically connected with the first power supply line PL1, and a second electrode of the first light emitting control transistor T5 is electrically connected with the first electrode of the drive transistor T3. A gate of the second light emitting control transistor T6 is electrically connected with the light emitting control line EML, a first electrode of the second light emitting control transistor T6 is electrically connected with the second electrode of the drive transistor T3, and a second electrode of the second light emitting control transistor T6 is electrically connected with an anode of the light emitting element EL. The first reset transistor T1 is electrically connected with the gate of the drive transistor T3 and configured to reset the gate of the drive transistor T3, and the second reset transistor T7 is electrically connected with the anode of the light emitting element EL and configured to reset the anode of the light emitting element EL. A gate of the first reset transistor T1 is electrically connected with the first reset control line RST1, a first electrode of the first reset transistor T1 is electrically connected with the first initial signal line INIT1, and a second electrode of the first reset transistor T1 is electrically connected with the gate of the drive transistor T3. A gate of the second reset transistor T7 is electrically connected with the second reset control line RST2, a first electrode of the second reset transistor T7 is electrically connected with the second initial signal line INIT2, and a second electrode of the second reset transistor T7 is electrically connected with the anode of the light emitting element EL. A first capacitor plate of the storage capacitor Cst is electrically connected with the gate of the drive transistor T3, and a second capacitor plate of the storage capacitor Cst is electrically connected with the first power supply line PL1.

In this example, a first node N1 is a connection point of the storage capacitor Cst, the first reset transistor T1, the drive transistor T3, and the threshold compensation transistor T2. A second node N2 is a connection point of the first light emitting control transistor T5, the data writing transistor T4, and the drive transistor T3. A third node N3 is a connection point of the drive transistor T3, the threshold compensation transistor T2, and the second light emitting control transistor T6. The fourth node N4 is a connection point of the second light emitting control transistor T6, the second reset transistor T7, and the light emitting element EL.

An operating process of the pixel circuit illustrated in FIG. 2 will be described below with reference to FIG. 3. The description is given by taking a case in which multiple transistors included in the pixel circuit shown in FIG. 2 are all P-type transistors as an example.

In some exemplary implementations, as shown in FIG. 3, during one frame of display period, the operating process of the pixel circuit may include a first stage S1, a second stage S2, and a third stage S3.

In the first stage S1, which is referred to as a reset stage, a first reset control signal RESET1 provided by the first reset control line RST1 is a low-level signal, so that the first reset transistor T1 is turned on, and a first initial signal provided by the first initial signal line INIT1 is provided to the first node N1 to initialize the first node N1 and clear an original data voltage in the storage capacitor Cst. A scan signal SCAN according to the scan line GL is a high-level signal, and a light emitting control signal EM according to the light emitting control line EML is a high-level signal, so that the data writing transistor T4, the threshold compensation transistor T2, the first light emitting control transistor T5, the second light emitting control transistor T6, and the second reset transistor T7 are turned off. In this stage, the light emitting element EL does not emit light.

In the second stage S2, which is referred to as a data writing stage or a threshold compensation stage, the scan signal SCAN provided by the scan line GL is a low-level signal, the first reset control signal RESET1 provided by the first reset control line RST1 and the emitting control signal EM provided by the light emitting control line EML are both high-level signals, and the data line DL outputs a data signal DATA. In this stage, the first capacitor plate of the storage capacitor Cst is at a low level, such that the drive transistor T3 is turned on. The scan signal SCAN is the low-level signal, so that the threshold compensation transistor T2, the data writing transistor T4, and the second reset transistor T7 are turned on. The threshold compensation transistor T2 and the data writing transistor T4 are turned on, so that a data voltage Vdata output by the data line DL is provided to the first node N1 through the second node N2, the turned-on drive transistor T3, the third node N3, and the turned-on threshold compensation transistor T2, and the storage capacitor Cst is charged with a difference between the data voltage Vdata output by the data line DL and a threshold voltage of the drive transistor T3. A voltage of a first capacitor plate (that is, the first node N1) of the storage capacitor Cst is Vdata-|Vth|, wherein Vdata is the data voltage output by the data line DL, and Vth is the threshold voltage of the drive transistor T3. The second reset transistor T7 is turned on, so that a second initial signal provided by the second initial signal line INIT2 is provided to the anode of the light emitting element EL to initialize (reset) the anode of the light emitting element EL and clear a pre-stored voltage therein, so as to complete initialization, thereby ensuring that the light emitting element EL does not emit light. The first reset control signal RESET1 provided by the first reset control line RST1 is the high-level signal, so that the first reset transistor T1 is turned off. The light emitting control signal EM provided by the light emitting control signal line EML is the high-level signal, so that the first light emitting control transistor T5 and the second light emitting control transistor T6 are turned off.

In the third stage S3, which is referred to as a light emitting stage, the light emitting control signal EM provided by the light emitting control signal line EML is a low-level signal, and the scan signal SCAN according to the scan line GL and the first reset control signal RESET1 according to the first reset control line RST1 are high-level signals. The light emitting control signal EM provided by the light emitting control signal line EML is the low-level signal, so that the first light emitting control transistor T5 and the second light emitting control transistor T6 are turned on, and a first voltage signal VDD output by the first power supply line PL1 provides a drive voltage to the anode of the light emitting element EL through the turned-on first light emitting control transistor T5, the drive transistor T3, and the second light emitting control transistor T6 to drive the light emitting element EL to emit light.

In a driving process of the pixel circuit, a drive current flowing through the drive transistor T3 is determined by a voltage difference between the gate and the first electrode of the drive transistor T3. Because the voltage of the first node N1 is Vdata-|Vth|, the drive current of the drive transistor T3 is as follows.

$$I = K \times (Vgs - Vth)^2 = K \times [(VDD - Vdata + |Vth|) - Vth]^2 = K \times [VDD - Vdata]^2.$$

Among them, I is the drive current flowing through the drive transistor T3, that is, the drive current for driving the light emitting element EL; K is a constant; Vgs is the voltage difference between the gate and the first electrode of the drive transistor T3; Vth is the threshold voltage of the drive transistor T3; Vdata is the data voltage output by the data line DL; and VDD is the first voltage signal output by the first power supply line PL1.

It may be seen from the above formula that a current flowing through the light emitting element EL has nothing to do with the threshold voltage of the drive transistor T3. Therefore, the pixel circuit of this embodiment may better compensate the threshold voltage of the drive transistor T3.

In some exemplary implementations, as shown in FIG. 1, the first display area A1 may be provided with multiple first light emitting elements 13 and multiple pixel circuits, and the second display areas A2a and A2b may each be provided with multiple second light emitting elements 14. The multiple pixel circuits of the first display area A1 may include multiple first pixel circuits 11 and multiple second pixel circuits. The multiple second pixel circuit may include multiple second valid pixel circuits 12 and multiple invalid pixel circuits. At least one first pixel circuit 11 of the first display area A1 is electrically connected with at least one first light emitting element 13, and is configured to drive the at least one first light emitting element 13 to emit light. An orthographic projection of at least one first pixel circuit 11 of the first display area A1 on the base substrate may be partially overlapped with an orthographic projection of the at least one first light emitting element 13 on the base substrate. For example, the at least one first pixel circuit 11 and the at least one first light emitting element 13 may be in a one-to-one correspondence relationship. At least one second valid pixel circuit 12 of the first display area A1 may be electrically connected with at least one second light emitting element 14 of the second display areas A2a or A2b through a transparent conductive line L, and is configured to drive the at least one second light emitting element 14 to emit light. The invalid pixel circuits may be conducive to improving the uniformity of components of multiple film layers in an etching process. For example, each invalid pixel circuit may have the same structure as the first pixel circuits 11 and the second valid pixel circuits 12 in the row or column in which the invalid pixel circuit is located, except that the invalid pixel circuit is not connected to any light emitting element.

In some exemplary implementations, as shown in FIG. 1, one end of the transparent conductive line L may be connected with the second valid pixel circuit 12, and the other end may be connected with a second light emitting element 14. The transparent conductive line L may extend from the first display area A1 to the second display area A2a or from the first display area A1 to the second display area A2b. For example, the transparent conductive line L may extend from the first display area A1 to the second display area A2a along the first direction X. Or, the transparent conductive line L may first extend in the first display area A1 along the second direction Y, and then extend along the first direction X to the second display area A2a. The transparent conductive line L may be made of a transparent conductive material, for example, may be made of a conductive oxide material, such as Indium Tin Oxide (ITO). However, this embodiment is not limited thereto. In some examples, multiple transparent conductive lines L may be arranged in one transparent conductive layer, or may be arranged in two or three transparent conductive layers. For example, each transparent conductive line L may be connected to one second valid pixel circuit 12 and one second light emitting element 14. For another example, one second valid pixel circuit 12 may be electrically connected to one second light emitting element 14 through the multiple transparent conductive lines L which are connected sequentially.

In some exemplary implementations, a light transmittance of the first display area A1 may be less than a light transmittance of each of the second display areas A2a and A2b. The pixel circuit is provided only in the first display area A1, and no pixel circuit is provided in the second display areas A2a and A2b, so that the light transmittance of each of the second display areas A2a and A2b may be improved.

In some exemplary implementations, in order to improve the display effect, densities of the second light emitting elements 14 in the second display areas A2a and A2b may be less than or equal to a density of the first light emitting elements 13 in the first display area A1. However, this embodiment is not limited thereto.

In some exemplary implementations, a resolution of the first display area A1 may be less than or equal to resolutions of the second display areas A2a and A2b. However, this embodiment is not limited thereto.

Figure 4:
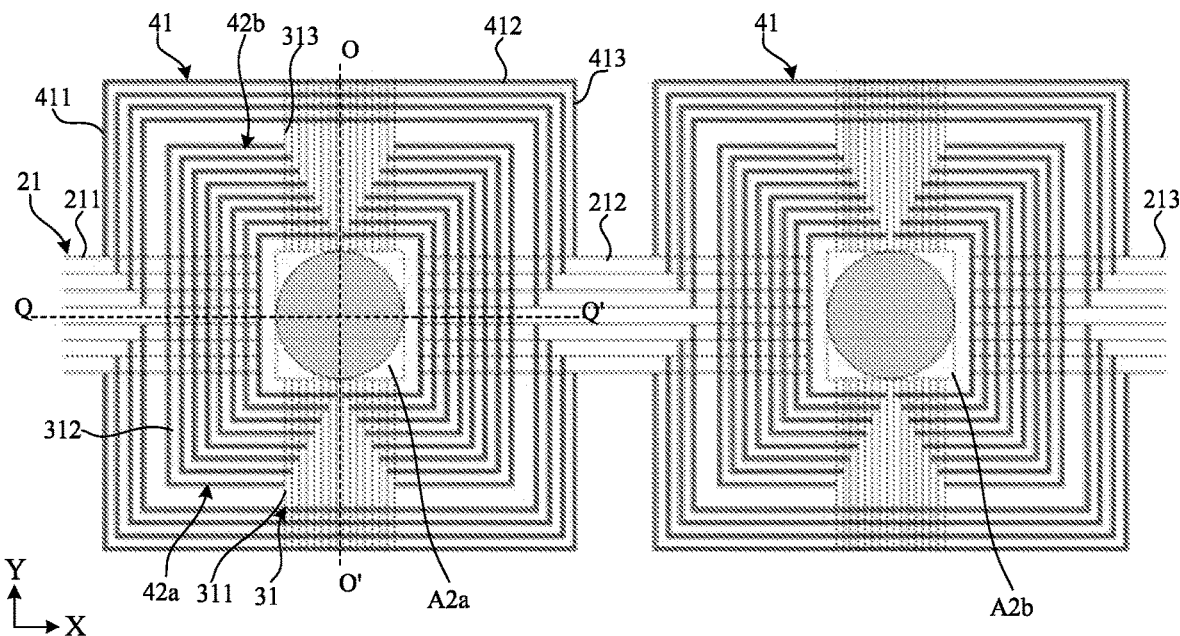
FIG. 4 is a schematic diagram of a partial trace of a first display area according to at least one embodiment of the present disclosure.

FIG. 4 is a schematic diagram of a partial trace of a first display area according to at least one embodiment of the present disclosure. In some exemplary implementations, as shown in FIG. 1 and FIG. 4, the first display area A1 of the display substrate may be provided with multiple first signal lines 21 and multiple third signal lines 22 extending along the first direction X, and multiple second signal lines 31 and multiple fourth signal lines 32 extending along the second direction Y. The first signal lines 21 and the third signal lines 22 may be electrically connected to multiple pixel circuits arranged sequentially in the first direction X. Each second signal line 31 is partitioned by the second display area A2a or A2b in the second direction Y. The fourth signal lines 32 may be electrically connected to multiple first pixel circuits 11 arranged sequentially in the second direction Y, or may be electrically connected to multiple invalid pixel circuits. Each first signal line 21 is partitioned into three first sub-signal lines by the second display areas A2a and A2b in the first direction X, and adjacent first sub-signal lines may be electrically connected through a first connector line 41. In some examples, the first signal lines 21 and the third signal lines 22 may include a scan line and a light emitting control line, and the second signal lines 31 and the fourth signal lines 32 may include a data line. One end of each third signal line 22 may be electrically connected to a gate drive circuit in a peripheral region on the left side of the display area AA, and the other end of the third signal line 22 may be electrically connected to a gate drive circuit located in a peripheral region on the right side of the display area AA. In this way, a bilateral drive of the pixel circuit of the first display area may be achieved to improve the display effect.

One first signal line 21 is taken as an example for following description. In some examples, as shown in FIG. 4, the first signal line 21 is partitioned into three first sub-signal lines extending along the first direction X by the two second display areas A2a and A2b in the first direction X, which include, for example, a $1^{st}$ first sub-signal line 211, a $2^{nd}$ first sub-signal line 212 and a $3^{rd}$ first sub-signal line 213. The $1^{st}$ first sub-signal line 211 may be electrically connected to a gate drive circuit in a peripheral region on the left side of the second display area A2a, and may also be electrically connected to one row of pixel circuits in the first display area A1 on the left side of the second display area A2a. The $2^{nd}$ first sub-signal line 212 may be electrically connected to one row of pixel circuits in the first display area A1 between the second display areas A2a and A2b. The $3^{rd}$ first sub-signal line 213 may be electrically connected to a gate drive circuit in a right peripheral region of the second display area A2b, and may also be electrically connected to one row of pixel circuits within the first display area A1 on the right side of the second display area A2b. In some examples, the pixel circuits to which the $1^{st}$ first sub-signal line 211, the $2^{nd}$ first sub-signal line 212 and the $3^{rd}$ first sub-signal line 312 are connected may be located in a same row. In this example, the $1^{st}$ first sub-signal line 211, the $2^{nd}$ first sub-signal line 212 and the $3^{rd}$ first sub-signal line 213 are electrically connected sequentially, so that bilateral drive may be achieved, thereby improving the display effect. The $1^{st}$ first sub-signal line 211 and the $2^{nd}$ first sub-signal line 212 may be electrically connected through one first connector line 41, and similarly, the $2^{nd}$ first sub-signal line 212 and the $3^{rd}$ first sub-signal line 213 may be electrically connected through another first connector line 41.

In some examples, as shown in FIG. 4, the first connector line 41 which is electrically connected between the $1^{st}$ first sub-signal line 211 and the $2^{nd}$ first sub-signal line 212 may at least include a first line segment 411 and a third line segment 413 extending along the second direction Y, and a second line segment 412 extending along the first direction X. The second line segment 412 is connected between the first line segment 411 and the third line segment 413. For example, one end of the first line segment 411 may be electrically connected to the $1^{st}$ first sub-signal line 211, and the other end of the first line segment 411 may be electrically connected to a first end of the second line segment 412. One end of the third line segment 413 may be electrically connected to the $2^{nd}$ first sub-signal line 212, and the other end of the third line segment 413 may be electrically connected to a second end of the second line segment 412.

In some examples, as shown in FIG. 4, a centerline of the second display area A2a in the first direction X is a first centerline OO', and a centerline of the second display area A2a in the second direction Y is a second centerline QQ'. The multiple first signal lines 21 partitioned by the second display area A2a may be divided into two groups. The number of the first signal lines 21 in the two groups may be the same or may be different. For example, the multiple first signal lines 21 may be divided into two groups by utilizing the second centerline QQ', wherein the first group may include multiple first signal lines 21 located on an upper side of the second centerline QQ', and the second group may include multiple first signal lines 21 located on a lower side of the second centerline QQ'. Among them, the first group of first signal lines 21 may bypass the second display area A2a from a first side (e.g., the upper side) of the second display area A2a in the second direction Y by utilizing first connector lines 41, and the other group of first signal lines 21 may bypass the second display area A2a from a second side (e.g., the lower side) of the second display area A2a in the second direction Y by utilizing first connector lines 41. In this example, by transferring the first signal lines from both the upper side and the lower side of the second display area, influence on the display effect caused by dense arrangement of the traces may be avoided. In some examples, in a region on a side of the second centerline QQ', a first connector lines 41 electrically connected to a first signal line 21 close to the second centerline QQ' may be located on a side close to the second display area A2a, of a first connector line 41 which is electrically connected to a first signal line 21 away from the second centerline QQ'. In this way, intersection of the first connector lines may be avoided.

The connection mode between the $2^{nd}$ first sub-signal line 212 and the $3^{rd}$ first sub-signal line 213 is substantially the same as the connection mode between the $1^{st}$ first sub-signal line 211 and the $2^{nd}$ first sub-signal line 212, and thus will not be repeated here. Among them, the first connector line to which the $1^{st}$ first sub-signal line 211 is connected and the first connector line to which the $3^{rd}$ first sub-signal line 213 is connected may be located on a same side of the second display areas A2a and A2b in the second direction Y. However, this embodiment is not limited thereto. In some other examples, the first connector line to which the $1^{st}$ first sub-signal line 211 is connected and the first connector line to which the $3^{rd}$ first sub-signal line 213 is connected may be located on different sides of the second display areas A2a and A2b in the second direction Y. For example, the first connector line to which the $1^{st}$ first sub-signal line 211 is connected may be located on an upper side of the second display area A2a in the second direction Y, and the first connector line to which the $3^{rd}$ first sub-signal line 213 is connected may be located on a lower side of the second display area A2b in the second direction Y.

One third signal line 31 is taken as an example for following description. In some examples, as shown in FIG. 4, the third signal line 31 is partitioned by the second display area A2a in the second direction Y. The third signal line 31 may include three second sub-signal lines (e.g. the $1^{st}$ second sub-signal line 311, the $2^{nd}$ second sub-signal line 312 and the $3^{rd}$ second sub-signal line 313). The $1^{st}$ second sub-signal line 311 may be electrically connected to multiple first pixel circuits in the first display area on a lower side of the second display area A2a. The second sub-signal line 312 may be electrically connected to multiple second valid pixel circuits within the first display area left of the second display area A2a. The $3^{rd}$ second sub-signal line 313 may be electrically connected to multiple first pixel circuits in the first display area on the upper side of the second display area A2a. For example, the pixel circuits which are electrically connected to the $1^{st}$ second sub-signal line 311 and the $3^{rd}$ second sub-signal line 313 of the same second signal line 31 may be located in a same column, and a second light emitting element which is electrically connected to a second valid pixel circuit that is electrically connected to the $2^{nd}$ second sub-signal line 312 of the same second signal line 31 may be in the same column as a first light emitting element which is electrically connected to the first pixel circuit that is electrically connected to the $1^{st}$ second sub-signal line 311. The 1st second sub-signal line 311 and the $2^{nd}$ second sub-signal line 312 may be electrically connected through a second connector line 42a, and the $3^{rd}$ second sub-signal line 313 and the $2^{nd}$ second sub-signal line 312 may be electrically connected through a second connector line 42b. The three second sub-signal lines 311, 312, and 313 may all extend along the second direction Y, and the second connector lines 42a and 42b may both extend along the first direction X.

In some examples, as shown in FIG. 4, multiple second signal lines 31 partitioned by the second display area A2a may be divided into two groups, and the number of second signal lines 31 within the two groups may be the same or may be different. For example, the multiple second signal lines 31 may be divided into two groups by utilizing the first centerline OO', wherein the first group may include multiple second signal lines 31 located on the left of the first centerline OO', and the second group may include multiple second signal lines 31 located on the right of the first centerline OO'. Among them, the first group of second signal lines 31 may bypass the second display area A2a from one side (e.g. the left side) of the second display area A2a in the first direction X, and the second group of second signal lines 31 may bypass the second display area A2a from the other side (e.g. right side) of the second display area A2a in the first direction X. In this example, by transferring the second signal lines from both the left side and the right side of the second display area, dense arrangement of traces may be avoided. In some examples, in a region on a side of the first centerline OO', a second signal line 31 close to the first centerline OO' is electrically connected to one column of second valid pixel circuits close to the second display area A2a, and a second signal line 31 away from the first centerline OO' is electrically connected to one column of second invalid pixel circuits away from the second display area A2a. A second connector line which is electrically connected to the second signal line 31 close to the first centerline QQ' may be located on a side close to the second display area A2a, of a second connector line which is electrically connected to second signal line 31 away from the second centerline OO'. However, this embodiment is not limited thereto. For example, in a region on a side of the first centerline OO', the second connector line which is electrically connected to the second signal line away from the first centerline OO' may be located on a side close to the second display area A2a, of the second connector line which is electrically connected to the second signal line close to the first centerline OO'.

A transferring mode of the second signal line partitioned by the second display area A2b is substantially the same as a transferring mode of the second signal line partitioned by the second display area A2a, and thus will not be repeated here.

In some examples, as shown in FIG. 4, the first connector lines 41 to which the first signal lines 21 are electrically connected may be located at a periphery of the second connector lines 42a and 42b to which the second signal lines 31 are electrically connected. That is, the first connector lines 41 may be located on a side of the second connector lines 42a or the second connector lines 42b away from the second display area A2a. In this example, by arranging the second valid pixel circuits in the adjacent region of the second display area, the transparent conductive lines electrically connected with the second valid pixel circuits and the second light emitting elements may be avoided from being too long, thereby ensuring the display effect.

Figure 5:
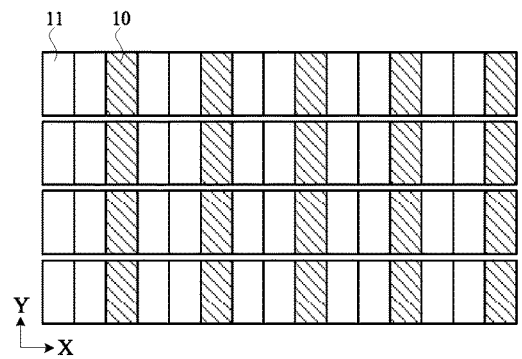
FIG. 5 is a schematic diagram of an arrangement of pixel circuits of a first display area according to at least one embodiment of the present disclosure.

FIG. 5 is a schematic diagram of an arrangement of pixel circuits of a first display area according to at least one embodiment of the present disclosure. In some exemplary implementations, as shown in FIG. 5, the multiple pixel circuits of the first display area may be arranged in an array. Multiple pixel circuits arranged along the first direction X sequentially may be referred to as one row of pixel circuits, and multiple pixel circuits arranged along the second direction Y sequentially may be referred to as one column of pixel circuits.

In some examples, as shown in FIG. 5, at least one second pixel circuit 10 may be arranged between the multiple first pixel circuits 11 arranged along the first direction X. The at least one second pixel circuit 10 may be arranged between multiple columns of first pixel circuits 11. For example, one column of second pixel circuits 10 may be provided between every M columns of first pixel circuits 11. Compared with the first display area in which only the first pixel circuits are arranged, the every M columns of the original first pixel circuits may be compressed along the first direction X, so that arrangement space for one column of second pixel circuits 10 is newly added, and space occupied by the M columns of the pixel circuits before compression may be the same as space occupied by the M+1 columns of pixel circuits after compression. Among them, M may be an integer greater than or equal to 2. In this example, as shown in FIG. 5, M may be 2, that is, the original two columns of first pixel circuits may be compressed along the first direction X to newly add the arrangement space for one column of second pixel circuits, and space occupied by the two columns of pixel circuits before compression may be the same as space occupied by the three columns of pixel circuits after compression. In some other examples, M may be 4 or may be 8. However, this embodiment is not limited thereto. In some other examples, the first pixel circuits may be compressed along the second direction Y to increase space for arranging the second pixel circuits. For example, the original R rows of first pixel circuits may be compressed along the second direction Y, thereby newly adding arrangement space for one row of second pixel circuits, and space occupied by the R rows of pixel circuits before compression may be the same as space occupied by the R+1 rows of pixel circuits after compression, wherein R may be an integer greater than 1.

Figure 6:
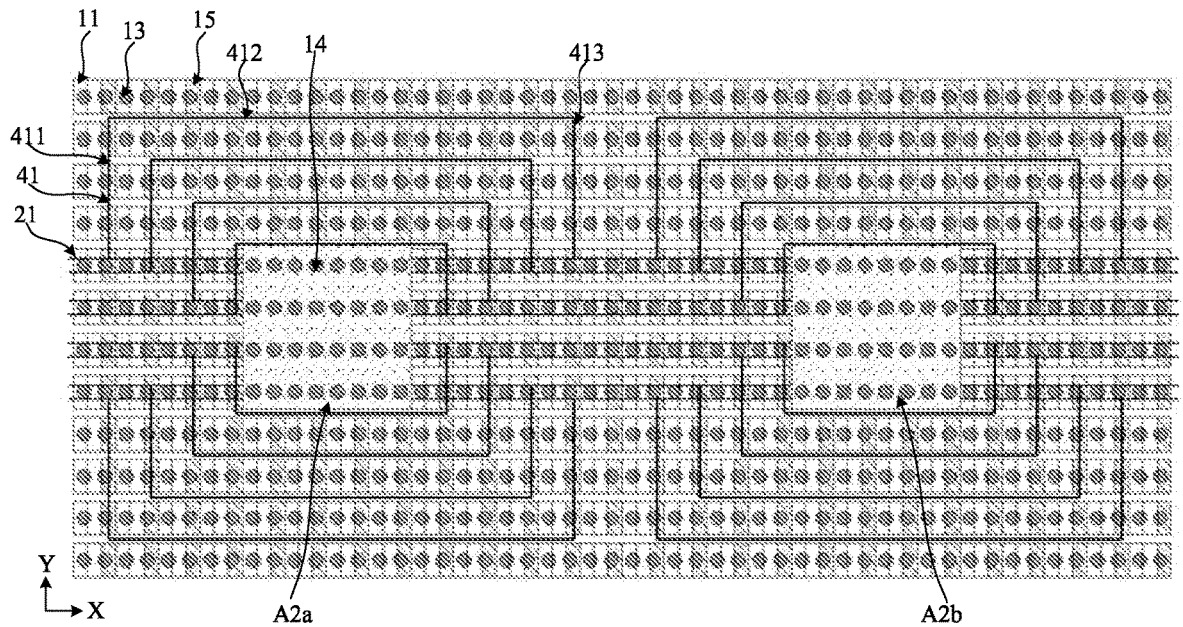
FIG. 6 is a schematic diagram of an arrangement of first signal lines according to at least one embodiment of the present disclosure.

In some examples, one column of second pixel circuits 10 may include multiple second valid pixel circuits and multiple invalid pixel circuits, or may include multiple invalid pixel circuits. The second valid pixel circuits may be located in the first display area around the second display area, FIG. 6 is a schematic diagram of an arrangement of first signal lines according to at least one embodiment of the present disclosure. In FIG. 6, illustration is made by taking only several first signal lines as an example, and second valid pixel circuits arranged around the second display area is omitted. In some examples, as shown in FIG. 6, a first signal line 21 may be electrically connected to one row of pixel circuits in the first display area, and bypass the second display area from an upper side or a lower side of the second display area through the first connector line 41 to achieve signal transmission. An orthographic projection of a first line segment 411 and a third line segment 413 of a first connector line 41 to which the first signal line 21 is electrically connected on the base substrate may be overlapped with an orthographic projection of multiple invalid pixel circuits 15 on the base substrate. An orthographic projection of a second line segment 412 of the first connector line 41 on the base substrate may be located between adjacent pixel circuit rows. In this example, by arranging the first line segment 411 and the third line segment 413 of the first connector line 41 in a region where the invalid pixel circuits are located, space of the valid pixel circuits may be avoided from being occupied, and space of the second display area may be avoided from being occupied due to winding in the second display area, thereby ensuring a size of the second display area. However, this embodiment is not limited thereto. In some other examples, when the first pixel circuits are compressed along the second direction to newly add second pixel circuits, the first line segment and the third line segment of the first connector line may be arranged between adjacent pixel circuit columns, and the orthographic projection of the second line segment on the base substrate may be overlapped with an orthographic projection of multiple invalid pixel circuits on the base substrate.

In some examples, as shown in FIG. 6, orthographic projections of the first connector lines 41 to which different first signal lines 21 are electrically connected on the base substrate may be overlapped with orthographic projections of different invalid pixel circuits on the base substrate respectively. For example, one first connector line may be arranged in a region where multiple invalid pixel circuits are located. However, this embodiment is not limited thereto. For example, the multiple first connector lines may be arranged in a region where one same column of invalid pixel circuits are located.

Figure 7:
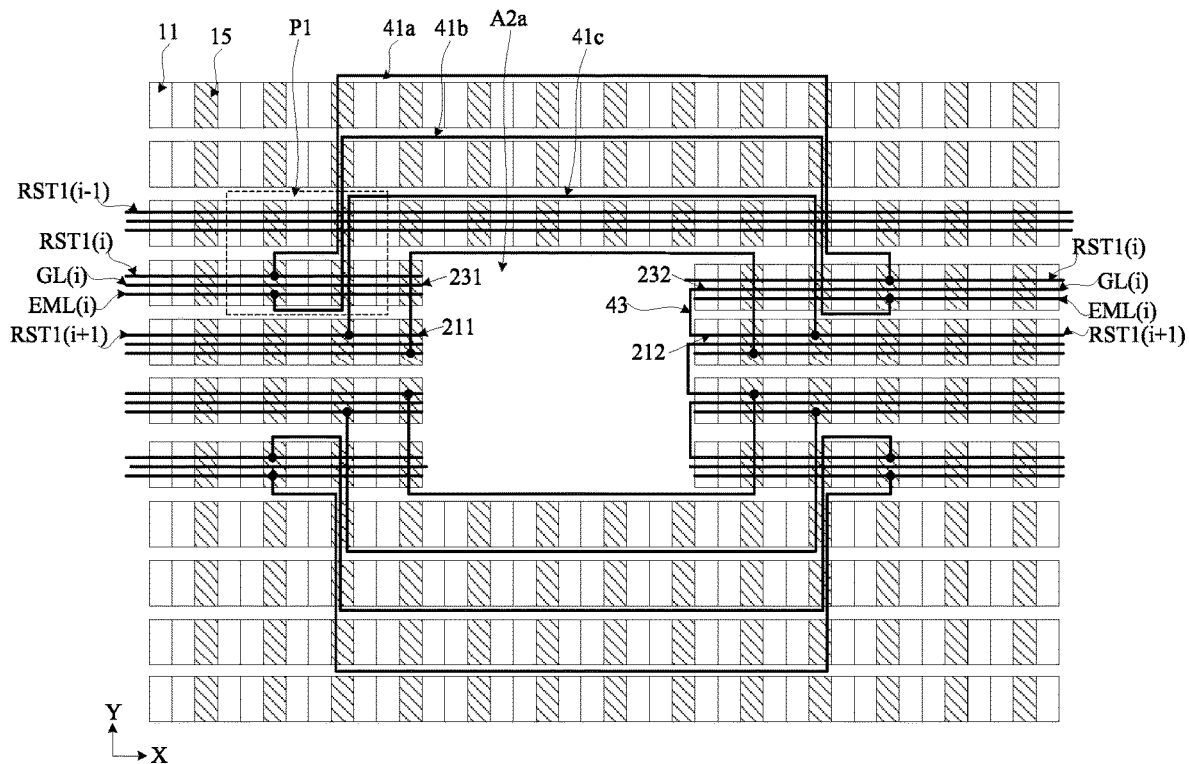
FIG. 7 is a schematic diagram of another arrangement of first signal lines according to at least one embodiment of the present disclosure.

FIG. 7 is a schematic diagram of another arrangement of first signal lines according to at least one embodiment of the present disclosure. In FIG. 7, illustration is made by taking the first signal lines around the second display area A2a as an example. Transparent conductive lines and light emitting elements are omitted in FIG. 7. The pixel circuit of this example is illustrated by taking a 7T1C pixel circuit as an example. In this example, a first reset control signal received by an i-th row of pixel circuits may be the same as a scan signal received by an (i−1)-th row of pixel circuits, that is, the gate of the first reset transistor T1 of the i-th row of pixel circuits and the gate of the threshold compensation transistor T2 of the (i−1)-th row of pixel circuits may receive a same signal. A second reset control signal received by the i-th row of pixel circuits may be the same as a scan signal received by the i-th row of pixel circuits, that is, the gate of the threshold compensation transistor T2, the gate of the data writing transistor T4 and the gate of the second reset transistor T7 of the pixel circuit may receive a same signal. In this example, the first reset control line RST1 ($i$) to which the pixel circuits of the i-th row are electronically connected and the scan signal GL (i) to which the pixel circuits of the (i−1)-th row are electronically connected may transmit a same signal. Herein, i is an integer greater than 0.

In some examples, as shown in FIG. 7, the first signal lines of this example may include first reset control lines and light emitting control lines. The first signal lines are partitioned by the second display area A2a. The first reset control lines partitioned by the second display area A2a in FIG. 7 are illustrated by taking the first reset control lines RST1 ($i$) and RST1 (i+1) as an example. The light emitting control lines partitioned by the second display area A2a in FIG. 7 are illustrated by taking the light emitting control line EML (i) as an example. For example, the first reset control line RST1 ($i$) may bypass the second display area A2a from an upper side of the second display area A2a by being electrically connected to the first connector line 41a, the light emitting control line EML (i) may bypass the second display area A2a from the upper side of the second display area A2a by being electrically connected to the first connector line 41b, and the first reset control line RST1 (i+1) may bypass the second display area A2a from the upper side of the second display area A2a by being electrically connected to the first connector line 41c. The third signal lines of this example may include a first reset control line, a scan line and a light emitting control line. The third signal lines are not partitioned by the second display area. The first reset control line which is not partitioned by the second display area A2a in FIG. 7 are illustrated by taking the first reset control line RST1 (i−1) as an example.

In some examples, the display substrate may further include a fifth signal line. The fifth signal line is partitioned by the second display area and does not bypass the second display area through the first connector line. The fifth signal line may be electrically connected through a third connector line to an adjacent first signal line or a third signal line transmitting a same signal, so that the first connector line for bypassing the second display area from an upper side or a lower side of the second display area is not required to be connected.

In some examples, the fifth signal line may include a scan line. In FIG. 7, the scan line partitioned by the second display area A2a and not bypassing the second display area A2a through a first connector line is illustrated by taking the scan line GL (i) as an example. In some examples, the scan line GL (i) may include three fifth sub-signal lines formed by the partition by two second display areas. In FIG. 7, illustration is made by taking a first fifth sub-signal line 231 and a second fifth sub-signal line 232 formed by the partition by the second display area A2a as examples. One end of the first fifth sub-signal line 231 of the scan line GL (i) may be electrically connected to a scan drive circuit of peripheral region on the left side to receive the scan signal, and the other end of the first fifth sub-signal line 231 may extend to an edge close to the second display area A2a. One end of a third fifth sub-signal line may be electrically connected to a scan drive circuit of a peripheral region on the right side to receive the scan signal, and the other end of the third fifth sub-signal line may extend to an edge close to the second display area A2b. The second fifth sub-signal line 232 may be located in the first display area between the second display areas A2a and A2b. In this example, the first signal line is illustrated by taking the first reset control line RST1 (i+1) as an example, and the first reset control line RST1 (i+1) may include three first sub-signal lines formed by the partition by the two second display areas, which are illustrated in FIG. 7 by taking a $1^{st}$ first sub-signal line 211 and a $2^{nd}$ first sub-signal line 212 formed by the partition by the second display area A2a as examples. The $1^{st}$ first sub-signal line 211 may be electrically connected to one end of the $2^{nd}$ first sub-signal line 212 through the first connector line 41c, and the other end of the $2^{nd}$ first sub-signal line 212 may be electrically connected to the $3^{rd}$ first sub-signal line through another first connector line. One end of the second fifth sub-signal line 232 of the scan line GL (i) (for example, one end close to the second display area A2a) may be electrically connected to one end of the $2^{nd}$ first sub-signal line 212 of the first reset control line RST1 (i+1) (for example, one end close to the second display area A2a) through the third connector line 43. For example, the second fifth sub-signal line 232 of the scan line GL (i), the $2^{nd}$ first sub-signal line 212 of the first reset control line RST1 (i+1), and the third connector line 43 may be in an integral structure. In some examples, the third connector line 43 may be located at an edge of the second fifth sub-signal line 232 of the scan line GL (i) close to the second display area A2a. In some other examples, one end of the second fifth sub-signal line 232 of the scan line GL (i) close to the second display area A2b may be electrically connected to one end of the $2^{nd}$ first sub-signal line 212 of the first reset control line RST1 (i+1) close to the second display area A2b through a third connector line, which may be located close to the edge of the second display area A2b. In some other examples, two ends of the second fifth sub-signal line 232 of the scan line GL (i) may be electrically connected to two ends of the $2^{nd}$ first sub-signal line 212 of the first reset control line RST1 (i+1) respectively through third connector lines. However, this embodiment is not limited thereto. In some other examples, the third connector lines 43, the second fifth sub-signal line 232 of the scan line GL (i), and the $2^{nd}$ first sub-signal line 212 of the first reset control line RST1 (i+1) may be located in different conductive layers, for example, may be located on a side of the scan line GL (i) and the first reset control line RST1 (i+1) away from the base substrate. In this example, the scan lines partitioned by the second display area may be electrically connected with adjacent first signal lines transmitting the same signal to achieve signal transmission, and the number of connector lines may be reduced.

In some other examples, the first signal lines may include scan lines and light emitting control lines, and the fifth signal line may include first reset control lines. Among them, the scan lines partitioned by the second display area may be transferred by the first connector lines to bypass the second display area, and the first reset control lines partitioned by the second display area may be electrically connected with adjacent scan lines transmitting the same signal to achieve the signal transmission. However, this embodiment is not limited thereto.

In some examples, as shown in FIG. 7, an orthographic projection of the first connector line 41a, the second connector line 41b and the third connector line 41c on the base substrate may be overlapped with the orthographic projection of multiple same invalid pixel circuits on the base substrate. Among them, the multiple first connector lines may be arranged in the region where one column of invalid pixel circuits are located.

Figure 8:
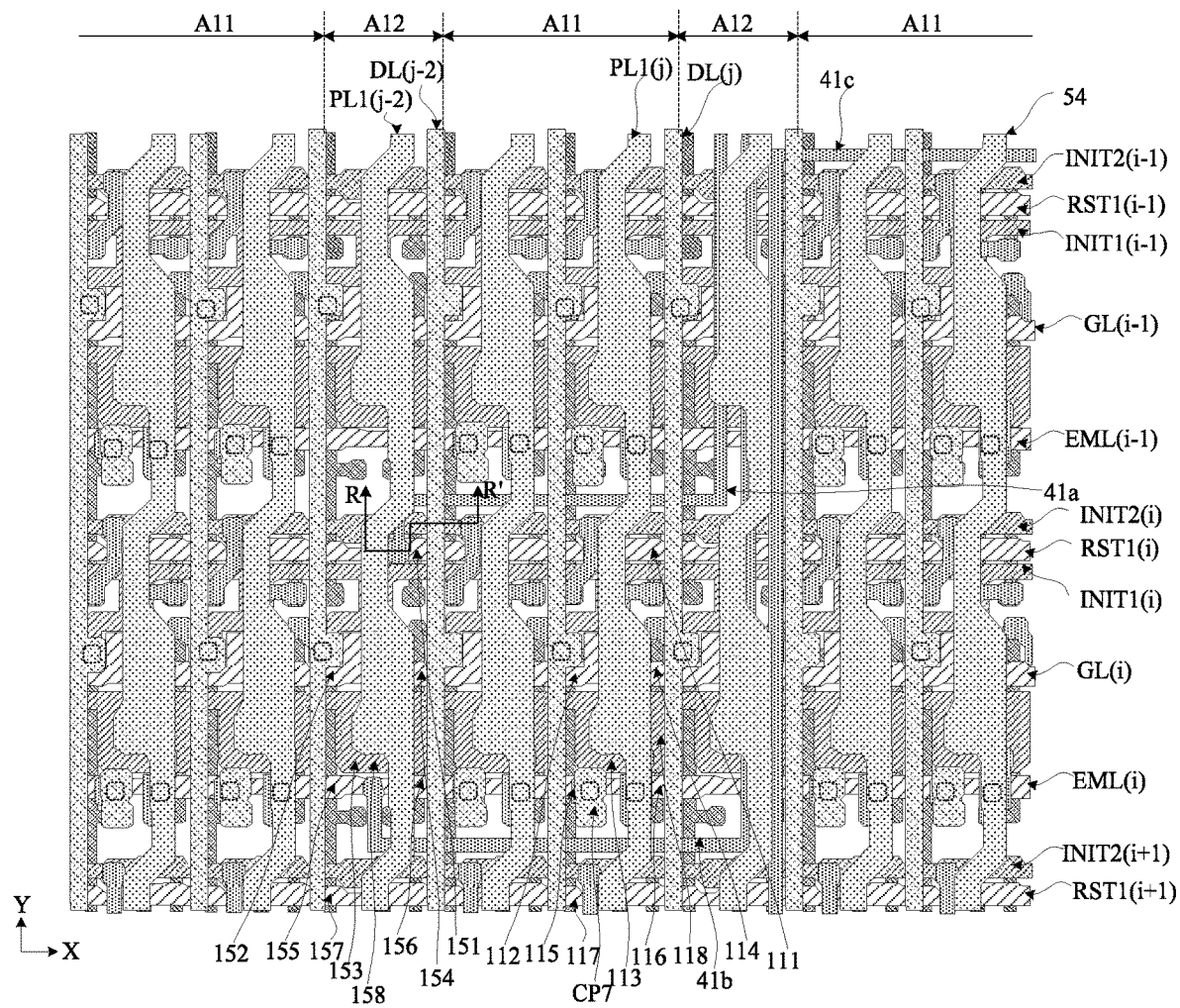
FIG. 8 is a schematic partial top view of a display substrate of a region P1 in FIG. 7.
Figure 9:
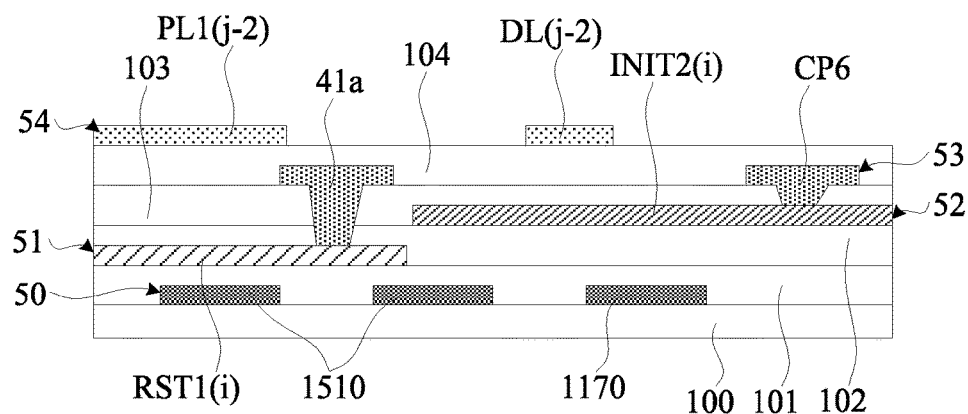
FIG. 9 is a partial sectional view along an R-R' direction in FIG. 8.
Figure 10A:
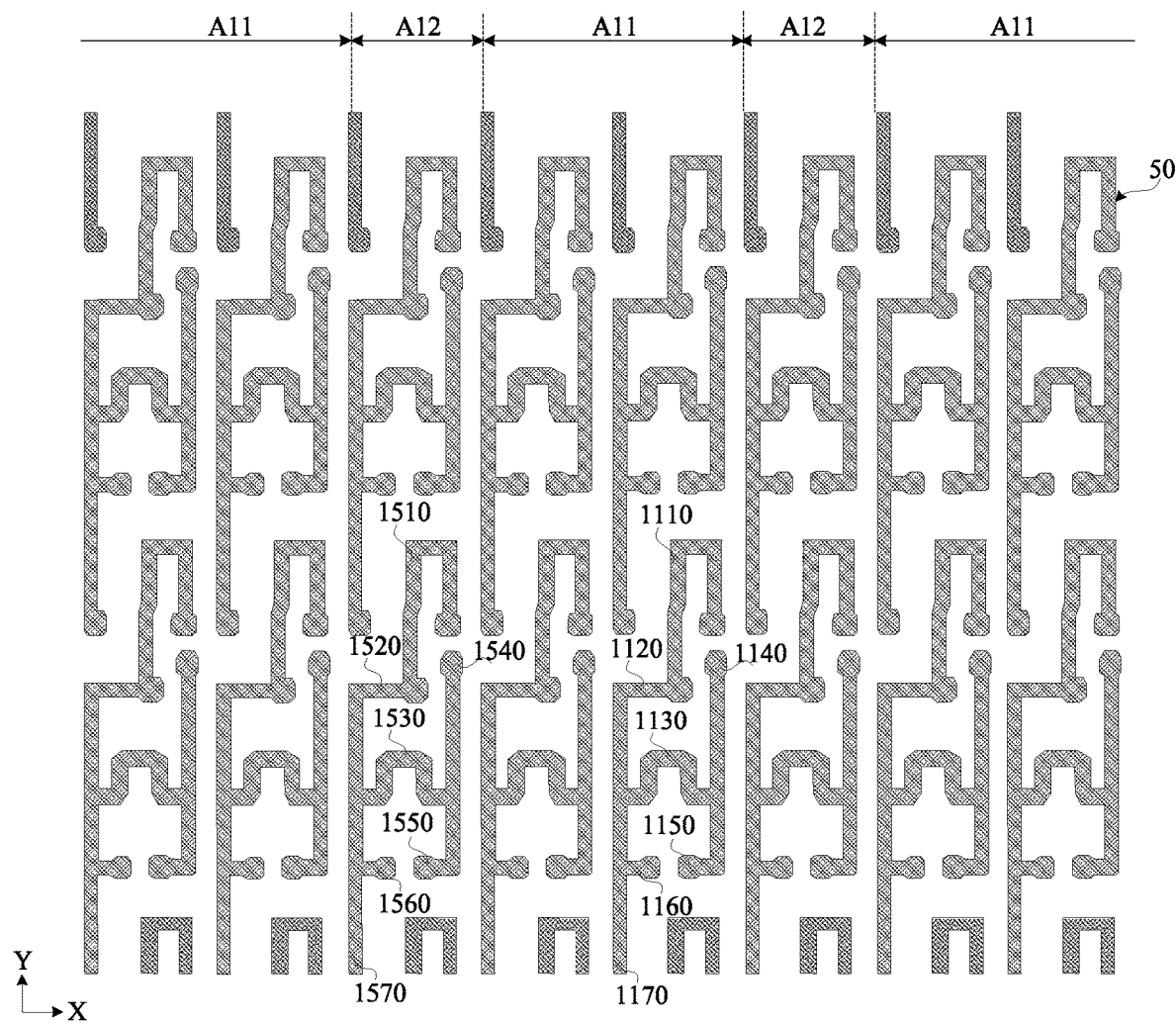
FIG. 10A is a schematic partial top view of a display substrate after a semiconductor layer is formed in FIG. 8.
Figure 10B:
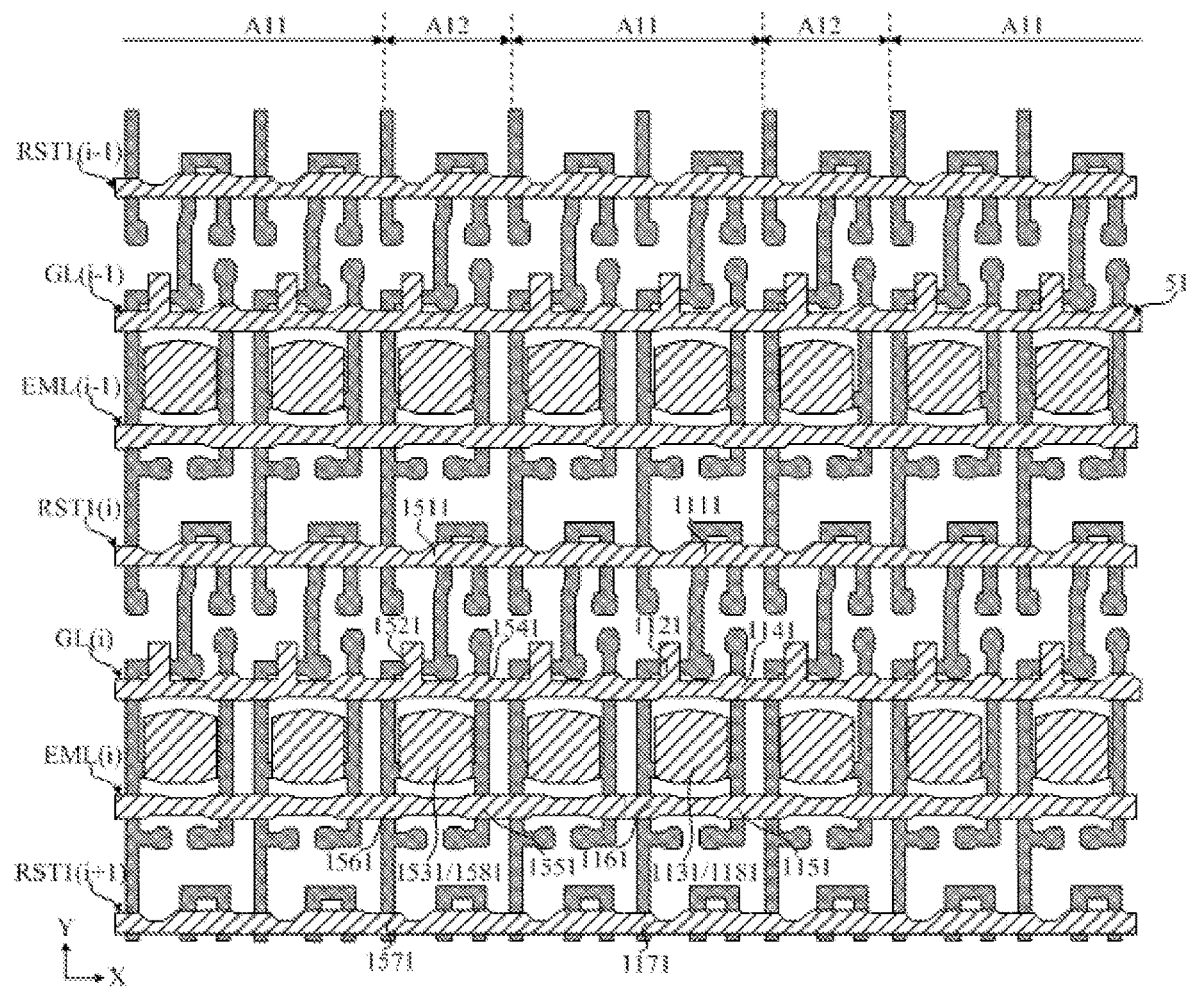
FIG. 10B is a schematic partial top view of a display substrate after a first conductive layer is formed in FIG. 8.
Figure 10C:
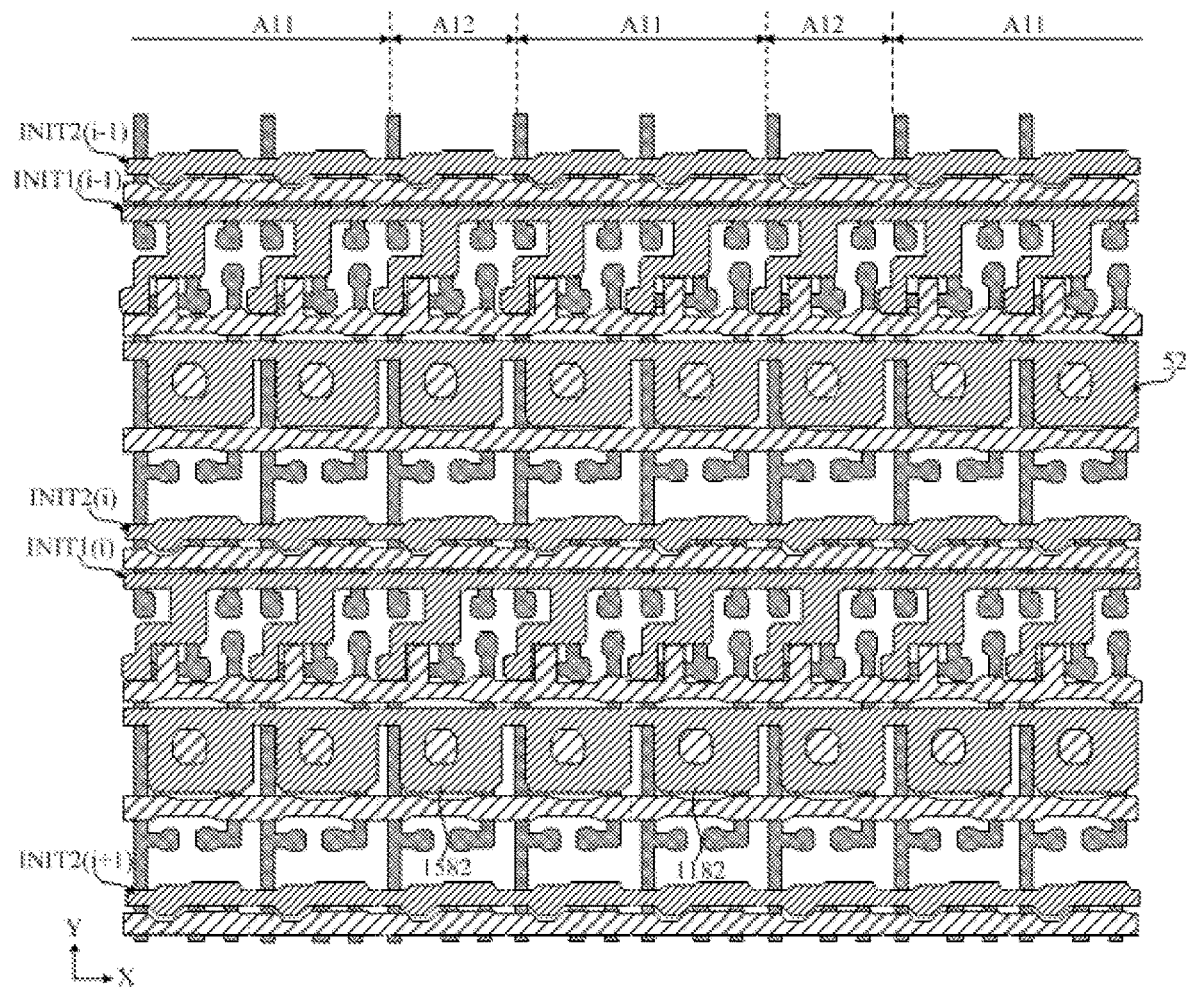
FIG. 10C is a schematic partial top view of a display substrate after a second conductive layer is formed in FIG. 8.
Figure 10D:
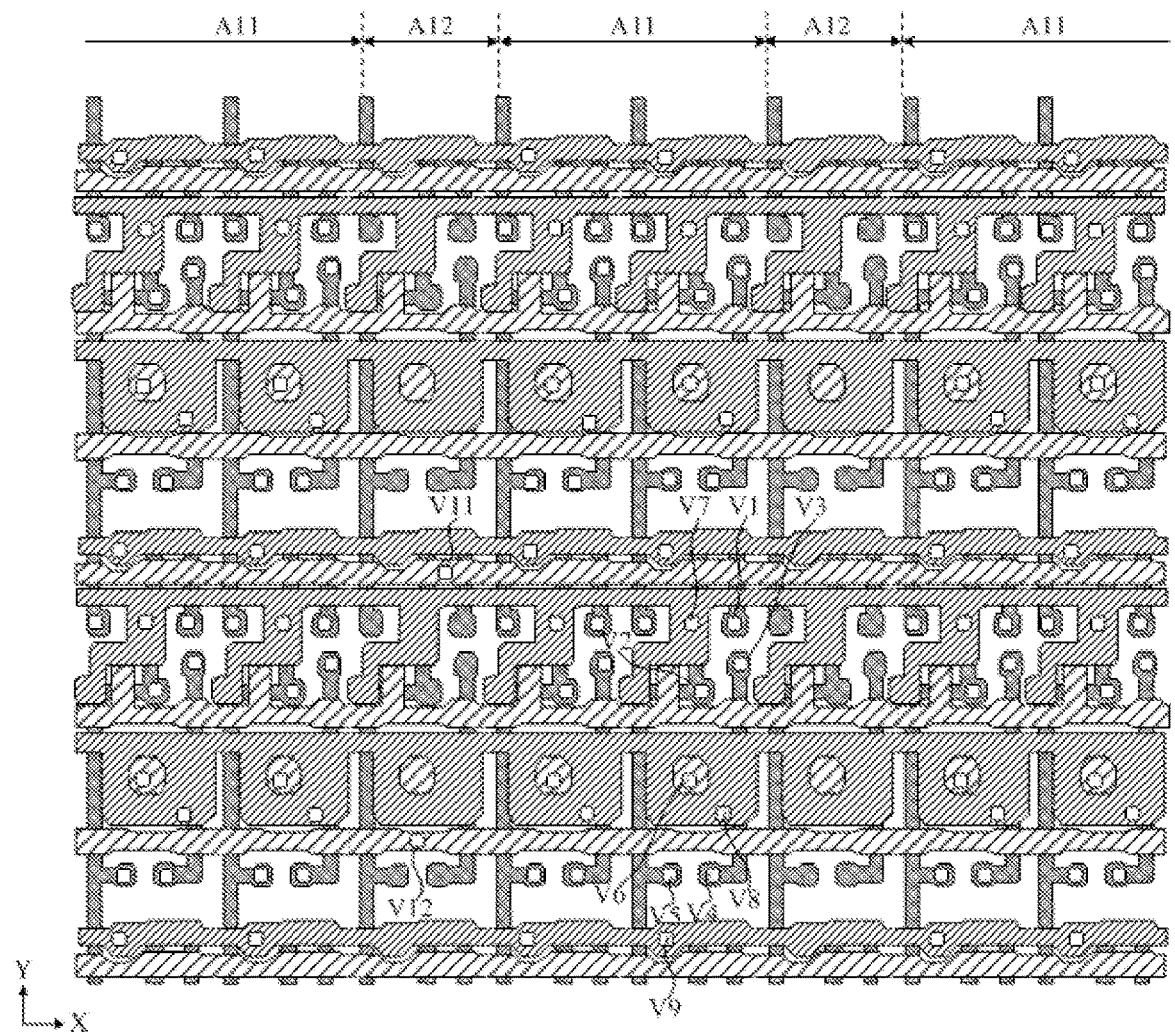
FIG. 10D is a schematic partial top view of a display substrate after a third insulation layer is formed in FIG. 8.
Figure 10E:
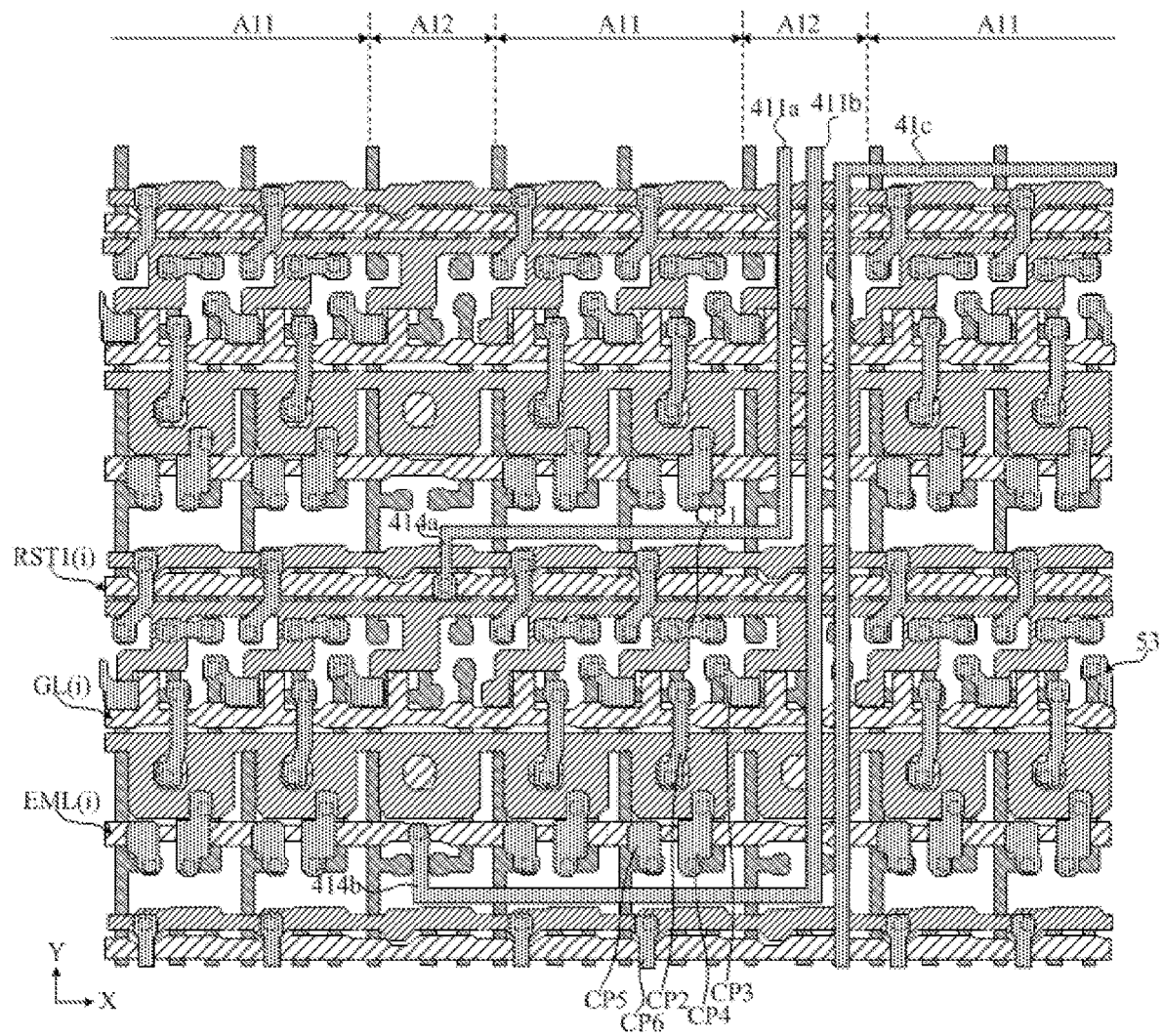
FIG. 10E is a schematic partial top view of a display substrate after a third conductive layer is formed in FIG. 8.
Figure 10F:
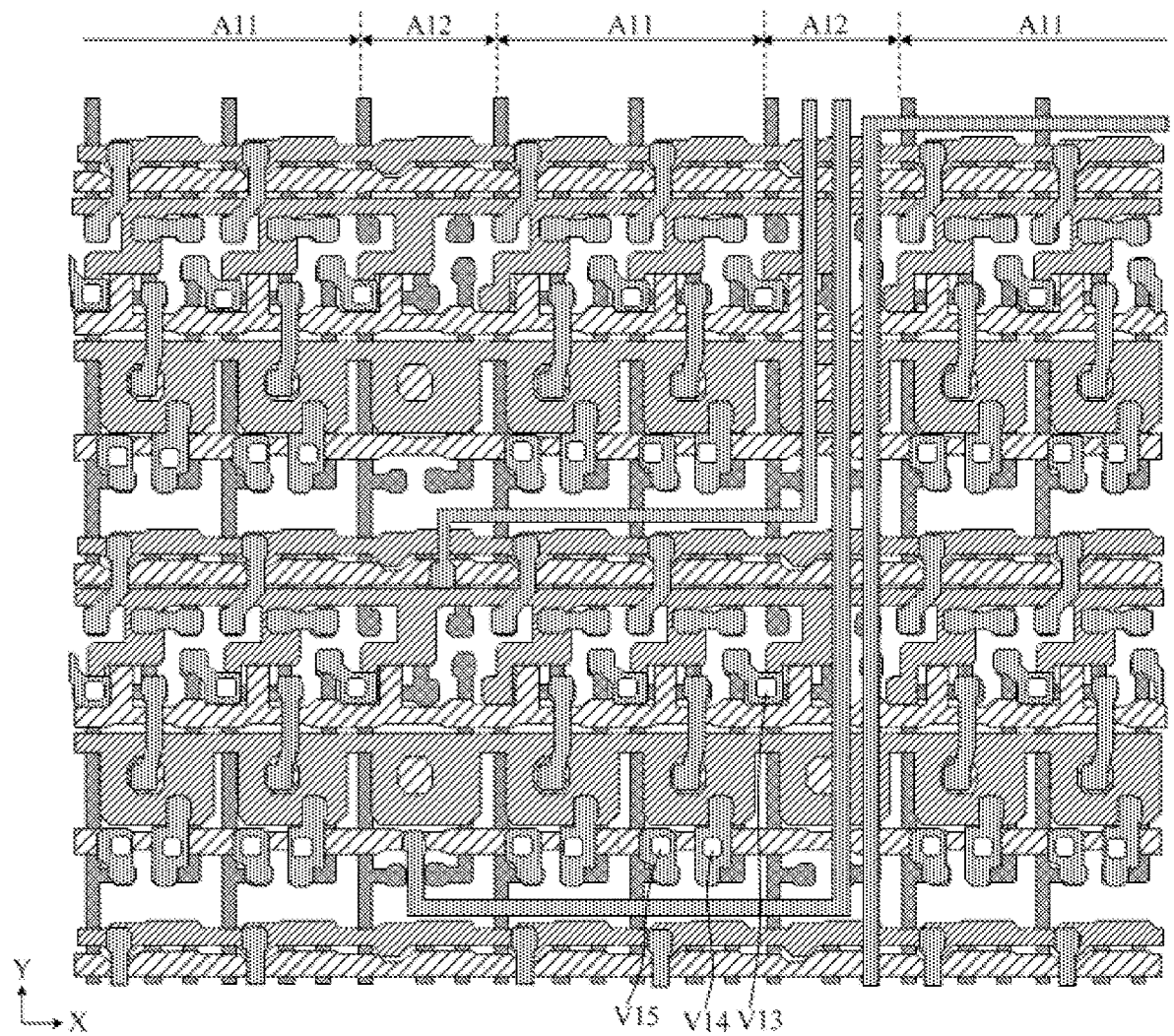
FIG. 10F is a schematic partial top view of a display substrate after a fourth insulation layer is formed in FIG. 8.

FIG. 8 is a schematic partial top view of a display substrate of a region P1 in FIG. 7. FIG. 9 is a partial sectional view along an R-R' direction in FIG. 8. FIG. 10A is a schematic partial top view of a display substrate after a semiconductor layer is formed in FIG. 8. FIG. 10B is a schematic partial top view of a display substrate after a first conductive layer is formed in FIG. 8. FIG. 10C is a schematic partial top view of a display substrate after a second conductive layer is formed in FIG. 8. FIG. 10D is a schematic partial top view of a display substrate after a third insulation layer is formed in FIG. 8. FIG. 10E is a schematic partial top view of a display substrate after a third conductive layer is formed in FIG. 8. FIG. 10F is a schematic partial top view of a display substrate after a fourth insulation layer is formed in FIG. 8.

In some examples, as shown in FIG. 7 and FIG. 8, a first circuit region A11 and a second circuit region A12 are arranged at an interval in the first display area in the first direction X. The first circuit region A11 is provided with multiple columns of first pixel circuits 11 (e.g., two columns of first pixel circuits 11), and the second circuit region A12 is provided with one row of second pixel circuits (e.g., including multiple invalid pixel circuits 15, or may include multiple second valid pixel circuits and multiple invalid pixel circuits). In FIG. 8, illustration is made by taking of two rows and multiple columns of pixel circuit as an example.

In some examples, as shown in FIG. 8 and FIG. 9, in a direction perpendicular to the display substrate, the display substrate of the first display area A1 may include a base substrate 100, and a circuit structure layer arranged on the base substrate 100. The circuit structure layer may include: a semiconductor layer 50, a first conductive layer 51, a second conductive layer 52, a third conductive layer 53, and a fourth conductive layer 54 arranged sequentially on the base substrate 100. A first insulation layer 101 is arranged between the semiconductor layer 50 and the first conductive layer 51. A second insulation layer 102 is arranged between the first conductive layer 51 and the second conductive layer 52. A third insulation layer 103 is arranged between the second conductive layer 52 and the third conductive layer 53. A fourth insulation layer 104 is arranged between the third conductive layer 53 and the fourth conductive layer 54. In some examples, the first insulation layer 101 to the fourth insulation layer 104 may all be inorganic insulation layers. Or, the first insulation layer 101 to the third insulation layer 103 may be inorganic insulation layers, and the fourth insulation layer 104 may be an organic insulation layer. In some examples, at least one transparent conductive layer and a light emitting structure layer may be provided on a side of the circuit structure layer away from the base substrate 100. The transparent conductive layer may include multiple transparent conductive lines. The transparent conductive lines may be configured to be electrically connected to second valid pixel circuits and anodes of second light emitting elements. The light emitting structure layer may include the multiple first emitting light elements and the multiple second emitting light elements. The light emitting structure layer may include an anode layer, a pixel definition layer, an organic light emitting layer and a cathode layer which are arranged sequentially. However, this embodiment is not limited thereto.

In some exemplary implementations, as shown in FIG. 8 to FIG. 10A, the semiconductor layer 50 of the first display area A1 may at least include active layers of multiple transistors of multiple pixel circuits (e.g., including an active layer 1510 of a first reset transistor 151, an active layer 1520 of a threshold compensation transistor 152, an active layer 1530 of a drive transistor 153, an active layer 1540 of a data writing transistor 154, an active layer 1550 of a first light emitting control transistor 155, an active layer 1560 of a second light emitting control transistor 156, and an active layer 1570 of a second reset transistor 157 of the invalid pixel circuit 15, and an active layer 1110 of a first reset transistor 111, an active layer 1120 of a threshold compensation transistor 112, an active layer 1130 of a drive transistor 113, an active layer 1140 of a data writing transistor 114, an active layer 1150 of a first light emitting control transistor 115, an active layer 1160 of a second light emitting control transistor 116, and an active layer 1170 of a second reset transistor 117 of the first pixel circuit 11). In this example, the active layers of the seven transistors of one pixel circuit may be in an integral structure. In some examples, at least one active layer may at least include one channel region and multiple doped regions. The channel region may not be doped with an impurity, and has characteristics of a semiconductor. The multiple doped regions may be on two sides of the channel region and doped with impurities, and thus have conductivity. The impurities may be varied according to types of transistors. In some examples, a doped region of the active layer may be interpreted as a source or a drain of a transistor. A part of the active layer between the transistors may be interpreted as a wiring doped with an impurity, and may be used for electrically connection between the transistors.

In some exemplary implementations, as shown in FIG. 8 to FIG. 10B, the first conductive layer 51 of the first display area A1 may include gates of the multiple transistors of the multiple pixel circuits and a first capacitor plate of the storage capacitor (e.g., including a gate 1511 of the first reset transistor 151, a gate 1521 of the threshold compensation transistor 152, a gate 1531 of the drive transistor 153, a gate 1541 of the data writing transistor 154, a gate 1551 of the first light emitting control transistor 155, a gate 1561 of the second light emitting control transistor 156, and a gate 1571 of the second reset transistor 157 of the invalid pixel circuit 15, and a gate 1111 of the first reset transistor 111, a gate 1121 of the threshold compensation transistor 112, a gate 1131 of the drive transistor 113, a gate 1141 of the data writing transistor 114, a gate 1151 of the first light emitting control transistor 115, a gate 1161 of the second light emitting control transistor 116, a gate 1171 of the second reset transistor 117 of the first pixel circuit 11 and a first capacitor plate 1181 of the storage capacitor 118), multiple scan lines (e.g., a scan line GL (i−1) and a scan line GL (i)), multiple light emitting control lines (e.g., a light emitting control line EML (i−1) and a light emitting control line EML (i)), and multiple first reset control lines (e.g., a first reset control line RST1 (i−1), a first reset control line RST1 (i) and a first reset control line RST1 (i+1)).

In some examples, as shown in FIG. 10B, the first reset control line RST1 (i), the gates 1511 of the first reset transistors 151 of the i-th row of invalid pixel circuits 15, the gates 1111 of the first reset transistors 111 of the i-th row of first pixel circuits 11 and the gates of the second reset transistors of the (i−1)-th row of pixel circuits may be in an integral structure. The first reset control line RST1 (i+1), the gates 1571 of the second reset transistors 157 of the i-th row of pixel circuits 15, the gates 1171 of the second reset transistors 117 of the i-th row of first pixel circuits 11 and the gates of the first reset transistors of the (i+1)-th row of pixel circuits may be in an integral structure. The scan line GL (i), the gates 1541 of the data writing transistors 154 and the gates 1521 of the threshold compensation transistors 152 of the i-th row of invalid pixel circuits 15, and the gates 1141 of the data writing transistors 114 and the gates 1121 of the threshold compensation transistors 112 of the i-th row of first pixel circuits 11 may be in an integral structure. The light emitting control line EML (i), the gates 1551 of the first light emitting control transistors 155 and the gates 1561 of the second light emitting control transistors 156 of the i-th row of invalid pixel circuits 15, and the gates 1151 of the first light emitting control transistors 115 and the gates 1161 of the second light emitting control transistors 116 of the current row of first pixel circuits 11 may be in an integral structure. The first capacitor plate 1581 of the storage capacitors 158 and the gates 1531 of the drive transistors 153 of the invalid pixel circuits 15 may be in an integral structure. The first capacitor plates 1181 of the storage capacitors 118 and the gates 1131 of the drive transistors 113 of the first pixel circuits 11 may be in an integral structure. However, this embodiment is not limited thereto.

In some exemplary implementations, as shown in FIG. 8 to FIG. 10C, the second conductive layer 52 of the first display area A1 may include second capacitor plates of storage capacitors of multiple pixel circuits (e.g., including a second capacitor plate 1582 of the storage capacitor 158 of the invalid pixel circuit 15 and a second capacitor plate 1182 of the storage capacitor 118 of the first pixel circuit 11), multiple first initial signal lines (e.g., including a first initial signal line INIT1 (i−1), a first initial signal line INIT1 (i) and a first initial signal line INIT1 (i+1)), and multiple second initial signal lines (e.g., a second initial signal line INIT2 (i−1), a second initial signal line INIT2 (i) and a second initial signal line INIT2 (i+1)). The second capacitor plate 1182 of the storage capacitor 118 of the first pixel circuit 11 may have one hollowed region, and an orthographic projection of the gate 1131 of the drive transistor 113 on the base substrate may cover an orthographic projection of this hollowed region on the base substrate. The orthographic projection of this hollowed region on the base substrate may be polygonal. However, this embodiment is not limited thereto.

In some exemplary implementations, as shown in FIG. 8 to FIG. 10D, the third insulation layer 103 of the first display area A1 is provided with multiple via holes, which may include, for example, a first via hole V1 to a ninth via hole V9, and an eleventh via hole V11 and a twelfth via hole V12. The third insulation layer 103, the second insulation layer 102, and the first insulation layer 101 within the first via hole V1 to the fifth via hole V5 are removed to expose a surface of the semiconductor layer 50. The third insulation layer 103 and the second insulation layer 102 within the sixth via hole V6, the eleventh via hole V11 and the twelfth via hole V12 are removed to expose a surface of the first conductive layer 51. The third insulation layer 103 within the seventh via hole V7 to the ninth via hole V9 is removed to expose a surface of the second conductive layer 52.

In some exemplary implementations, as shown in FIG. 8 to FIG. 10E, the third conductive layer 53 of the first display area A1 may include multiple connection electrodes (e.g., including a first connection electrode CP1 to a six connection electrode CP6), and multiple first connector lines (e.g., a first connector line 41a, a first connector line 41b and a first connector line 41c). The first connection electrode CP1 may be electrically connected to a first doped region of the active layer 1110 of the first reset transistor 111 of the first pixel circuit 11 through the first via hole V1, and may also be electrically connected to a first initial signal line INIT (i) through the seventh via hole V7. The second connection electrode CP2 may be electrically connected to a first doped region of the active layer 1120 of the threshold compensation transistor 112 of the first pixel circuit 11 through the second via hole V2, and may also be electrically connected to a gate 1131 of the drive transistor 113 through the sixth via hole V6. The third connection electrode CP3 may be electrically connected to a first doped region of the active layer 1140 of the data writing transistor 114 through the third via hole V3. The fourth connection electrode CP4 may be electrically connected to a first doped region of the active layer 1150 of the first light emitting control transistor 115 through the fourth via hole V4, and may also be electrically connected to a second capacitor plate 1182 of the storage capacitor 118 through the eighth via hole V8. The fifth connection electrode CP5 may be electrically connected to a second doped region of the active layer 1160 of the second light emitting control transistor 116 through the fifth via hole V5. The sixth connection electrode CP6 may be electrically connected to the second initial signal line INIT2 (i+1) through the ninth via hole V9, and may also be electrically connected to a first doped region of the active layer 1170 of the second reset transistor 117.

In some examples, as shown in FIG. 7 and FIG. 10E, the first connector line 41a may include a fourth line segment 414a, a first line segment 411a, a second line segment, a third line segment, and a fifth line segment which are sequentially connected. The first connector line 41b may include a fourth line segment 414b, a first line segment 411b, a second line segment, a third line segment, and a fifth line segment which are sequentially connected. The first connector line 41c may include a first line segment, a second line segment and a third line segment which are sequentially connected. Among them, the first line segment and the third line segment each extends along the second direction Y, and the second line segment extends along the first direction X.

In some examples, as shown in FIG. 7 and FIG. 10E, one end of the fourth line segment 414a of the first connector line 41a may be electrically connected to a first reset control line RST1 (i) through the eleventh via hole V11, and the other end of the fourth line segment 414a may be electrically connected to the first line segment 411a extending along the second direction Y. The fourth line segment 414a of the first connector line 41a first extends along the second direction Y towards a side away from the light emitting control line EML (i), and then extends along the first direction X towards a side close to the second display area A2a. An orthographic projection of the fourth line segment 414a on the base substrate may be L-shaped. The first line segment 411a is located in a second circuit region A12, and a connection position between the fourth line segment 414a and the first reset control line RST1 (*i*) may be located in another second circuit region A12 adjacent to the second circuit region A12 where the first line segment 411*a* is located. However, this embodiment is not limited thereto. For example, at least one second circuit region may be spaced between the second circuit region in which the first line segment 411*a* is located and the second circuit region in which the connection position between the fourth line segment 414*a* and the first reset control line RST1 (*i*) is located.

In some examples, as shown in FIG. 7 and FIG. 10E, one end of the fourth line segment 414*b* of the first connector line 41*b* may be electrically connected to a light emitting control line EML (i) through the twelfth via hole V12, and the other end may be electrically connected to the first line segment 411*b* extending along the second direction Y. The fourth line segment 414*b* of the first connector line 41*b* first extends along the second direction Y towards a side away from the first reset control line RST1 (*i*), and then extends along the first direction X towards a side close to the second display area A2*a*. An orthographic projection of the fourth line segment 414*b* on the base substrate may be L-shaped. The first line segment 411*b* may be located in a second circuit region A12, and a connection position between the fourth line segment 414*b* and the light emitting control line EML (i) may be located in another second circuit region A12 adjacent to the second circuit region A12 where the first line segment 411*b* is located. However, this embodiment is not limited thereto.

In this example, the first signal line partitioned by the second display area is electrically connected by the first connector line located in the third conductive layer, and the first connector line is made of a metal material, so that influence of resistance on signal transmission may be reduced.

Arrangement of the third line segment and the fifth line segment of the first connector line may refer to the arrangement of the first line segment and the fourth line segment, and thus will not be repeated here. For example, a first line segment and a third line segment of one first connector line may be substantially symmetrical with respect to a first centerline of the second display area in the first direction, and a fourth line segment and a fifth line segment of the first connector line may be substantially symmetrical with respect to the first centerline of the second display area in the first direction.

In some exemplary implementations, as shown in FIG. 8 to FIG. 10F, the fourth insulation layer 104 of the first display area A1 is provided with multiple via holes, which may include, for example, a thirteenth via hole V13 to a fifteenth via hole V15. The fourth insulation layer 104 within the thirteenth via hole V13 to the fifteenth via hole V15 is removed to expose a surface of the third conductive layer 53.

In some exemplary implementations, as shown in FIG. 8 to FIG. 9, the fourth conductive layer 54 of the first display area A1 may include multiple data lines (e.g., including a data line DL (j) and a data line DL (j−2)), multiple first power supply lines (e.g., including a first power supply line PL1 (*j*) and a first power supply line PL1 (j−2)), and multiple anode connection electrodes (e.g., an anode connection electrode CP7). The anode connection electrode CP7 may be electrically connected with the fifth connection electrode CP5 through the fifteenth via hole V15. The data line DL (j) may be connected with the third connection electrode CP3 through the thirteenth via hole V13. The first power supply line PL1 (*j*) may be electrically connected with the fourth connection electrode CP4 through the fourteenth via hole V14.

In this example, the second circuit region A12, where the invalid pixel circuit which is overlapped with the orthographic projection of the first connector line on the base substrate is located, may be provided with a via hole only in the third insulation layer which is electrically connected to the first connector line, and the connection electrode of the third conductive layer electrically connected to the invalid pixel circuit may be removed to leave space for arranging the first connector line. Film layer structures of the remaining invalid pixel circuits in the second circuit region A12 may be substantially the same as the film layer structures of the first pixel circuit, and thus will not be repeated here.

Figure 11:
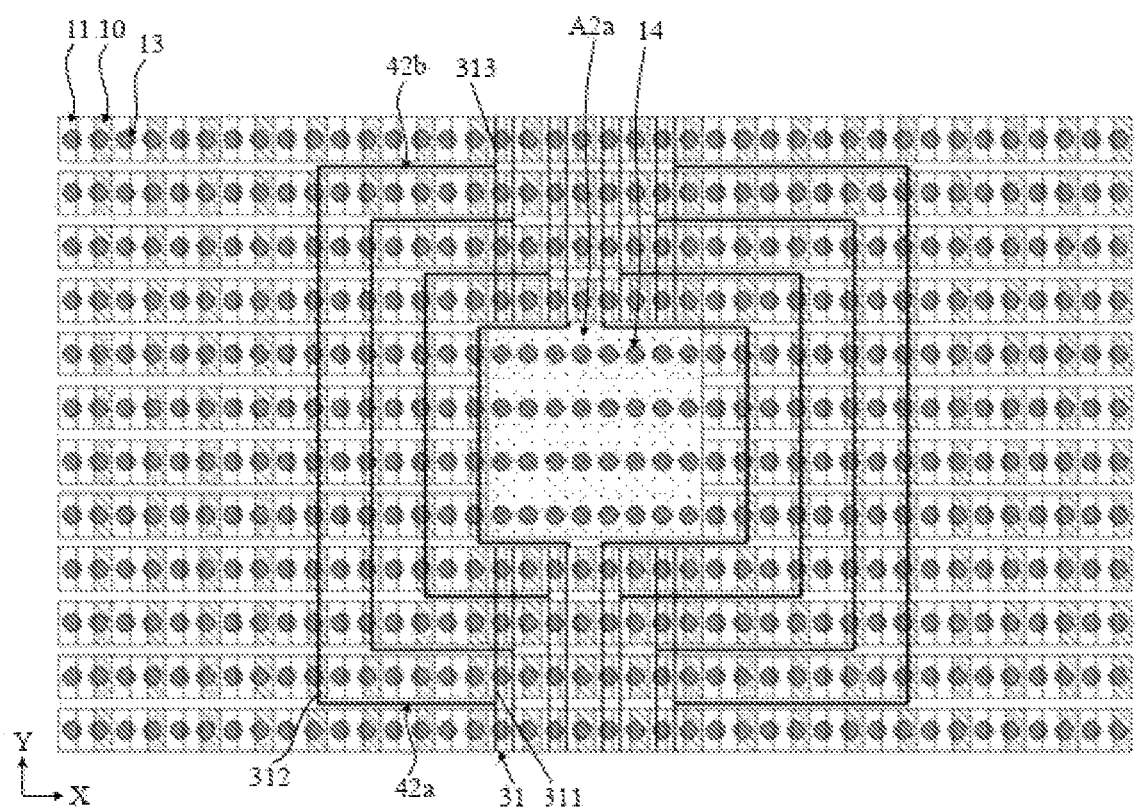
FIG. 11 is a schematic diagram of an arrangement of a second signal line according to at least one embodiment of the present disclosure.

FIG. 11 is a schematic diagram of an arrangement of a second signal line according to at least one embodiment of the present disclosure. In FIG. 11, illustration is made by only taking several second signal lines partitioned by the second display area A2*a* as an example. In some examples, as shown in FIG. 11, a second signal line 31 may include a $1^{st}$ second sub-signal line 311 and a $3^{rd}$ second sub-signal line 313 extending along the second direction Y, and a $2^{nd}$ second sub-signal line 312 extending along the second direction Y. The $2^{nd}$ second sub-signal line 312 may be electrically connected to one column of pixel circuits (e.g. including multiple second valid pixel circuits and multiple invalid pixel circuits, or may include only multiple second valid pixel circuits), and the $1^{st}$ second sub-signal line 311 and the $3^{rd}$ second sub-signal line 313 may be electrically connected to a same column of first pixel circuits 11. The 1st second sub-signal line 311 and the $2^{nd}$ second sub-signal line 312 may be electrically connected through a second connector line 42*a*, and the $3^{rd}$ second sub-signal line 313 and the $2^{nd}$ second sub-signal line 312 may be electrically connected through a second connector line 42*b*. The second connector line 42*a* and the second connector line 42*b* may extend along the first direction X, and may be located between adjacent pixel circuit rows.

Figure 12:
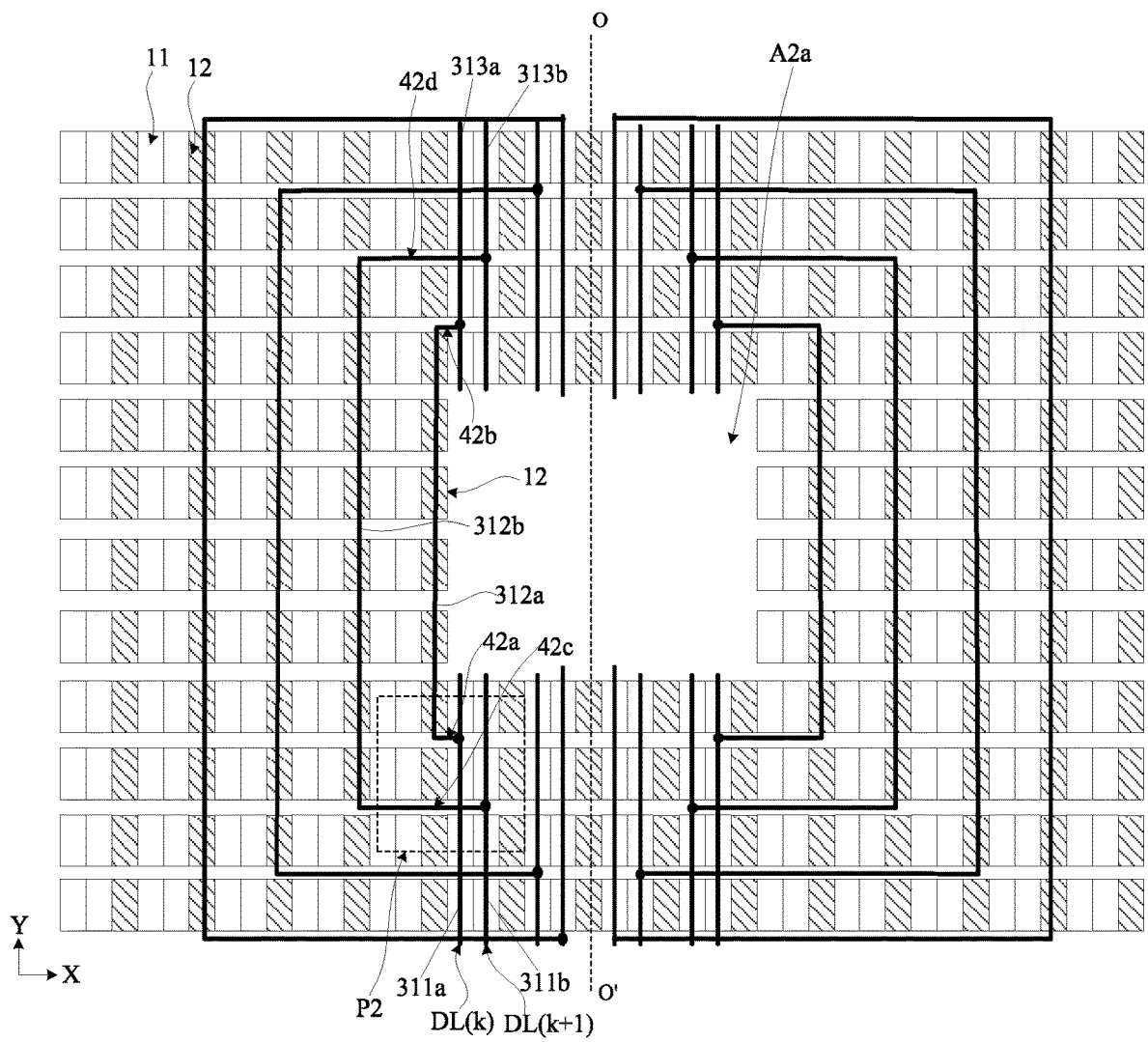
FIG. 12 is a schematic diagram of another arrangement of a second signal line according to at least one embodiment of the present disclosure.

FIG. 12 is a schematic diagram of another arrangement of a second signal line according to at least one embodiment of the present disclosure. In FIG. 12, illustration is made by taking the case as an example where the data lines around the second display area A2*a* are the second signal lines. Transparent conductive lines and light emitting elements are omitted in FIG. 12. In some examples, as shown in FIG. 12, the second signal lines are illustrated by taking a data line DL (k) and a data line DL (k+1) as examples. The data line DL (k) may include three second sub-signal lines 311*a*, 312*a* and 313*a*, and the data line DL (k+1) may include three second sub-signal lines 311*b*, 312*b* and 313*b*. The $1^{st}$ second sub-signal line 311*a* and the $3^{rd}$ second sub-signal line 313*a* of the data line DL (k) may be electrically connected to a same column of first pixel circuits 11, and the $2^{nd}$ second sub-signal line 312*a* may be electrically connected to one column of second valid pixel circuits 12. The $1^{st}$ second sub-signal line 311*b* and the $3^{rd}$ second sub-signal line 313*b* of the data line DL (k+1) may be electrically connected to a same column of first pixel circuits 11, and the $2^{nd}$ second sub-signal line 312*b* may be electrically connected to one column of second valid pixel circuits 12. The $1^{st}$ second sub-signal line 311*a* and the $2^{nd}$ second sub-signal line 312*a* of the data line DK (k) may be electrically connected through a second connector line 42*a*, and the $2^{nd}$ second sub-signal line 312*a* and the $3^{rd}$ second sub-signal line 313*a* may be electrically connected through a second connector line 42*b*. The $1^{st}$ second sub-signal line 311*b* and the $2^{nd}$ second sub-signal line 312b of the data line DK (k+1) may be electrically connected through a second connector line 42c, and the $2^{nd}$ second sub-signal line 312b and the $3^{rd}$ second sub-signal line 313b may be electrically connected through a second connector line 42d. For example, the second connector lines 42a, 42b, 42c and 42d may all extend along the first direction X.

In some examples, as shown in FIG. 12, the second display area A2a has a first centerline OO' in the first direction X. In a region on a side of the first centerline OO' (for example, a region on the left side of the first centerline OO'), the $1^{st}$ second sub-signal line 311a of the data line DL (k) is located on a side of the $1^{st}$ second sub-signal line 311b of the data line DL (k+1) away from the first centerline OO'. The $2^{nd}$ second sub-signal line 312a of the data line DL (k) is located on a side of the $2^{nd}$ second sub-signal line 312b of the data line DL (k+1) close to the second display area A2a. The second connector line 42a to which the $2^{nd}$ second sub-signal line 312a of the data line DL (k) is electrically connected may be located on a side close to the second display area A2a, of the second connector line 42c to which the $2^{nd}$ second sub-signal line 312b of the data line DL (k+1) is electrically connected. A length of the second connector line 42a along the first direction X may be smaller than a length of the second connector line 42c along the first direction X. The second connector line 42b to which the $2^{nd}$ second sub-signal line 312a of the data line DL (k) is electrically connected may be located on a side close to the second display area A2a, of the second connector line 42d which is electrically connected to the $2^{nd}$ second sub-signal line 312b of the data line DL (k+1). A length of the second connector line 42b along the first direction X may be smaller than a length of the second connector line 42d along the first direction X.

Figure 13:
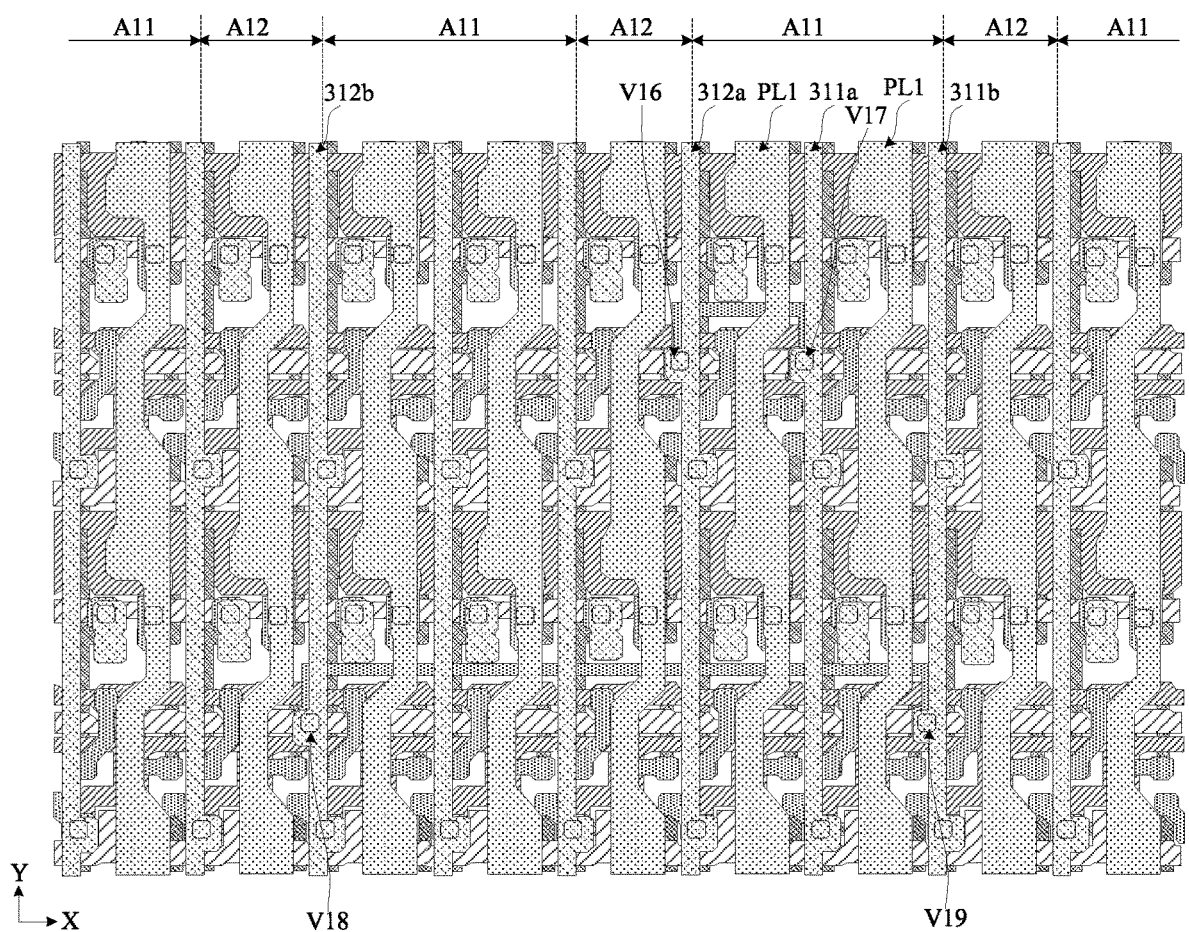
FIG. 13 is a schematic partial top view of the display substrate of a region P2 in FIG. 12.
Figure 14:
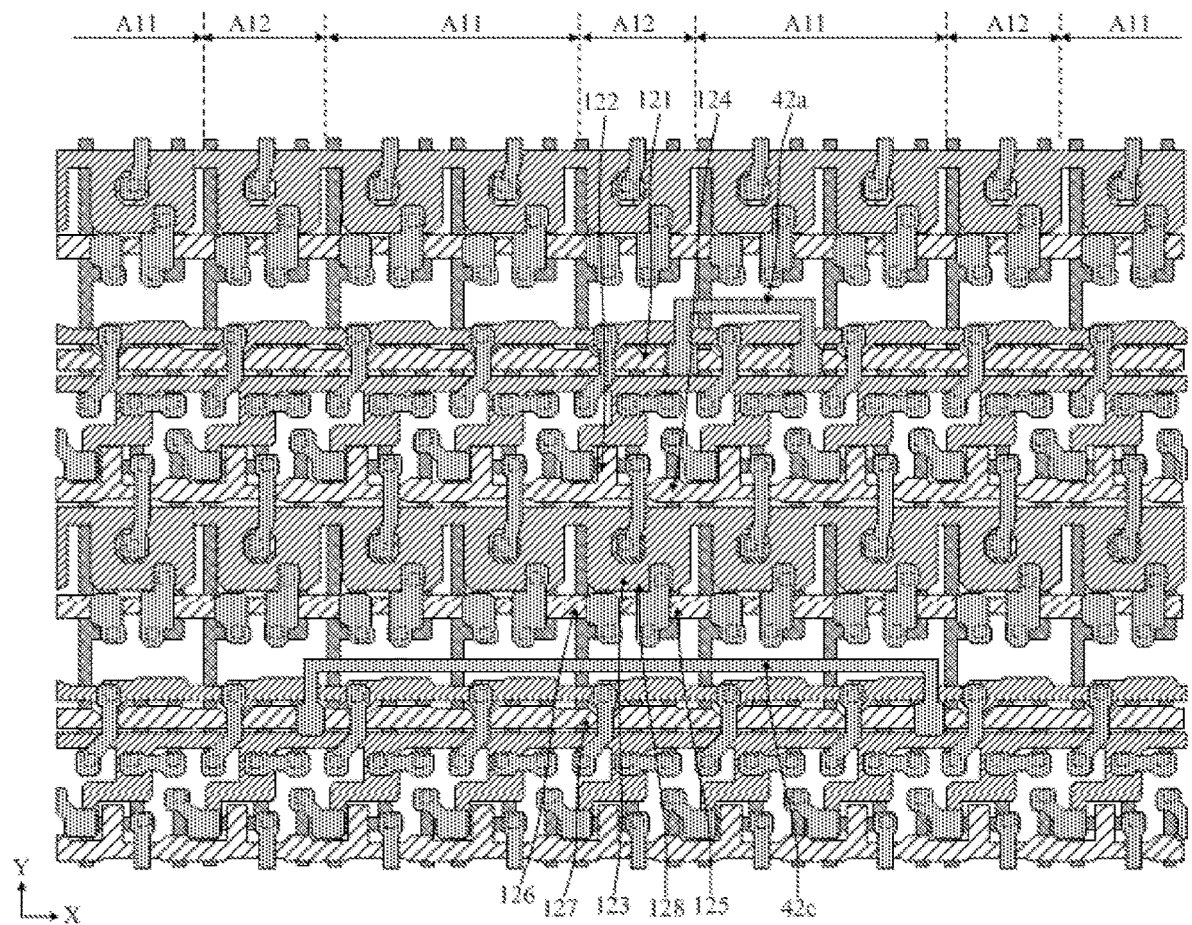
FIG. 14 is a schematic partial top view of a display substrate after a third conductive layer is formed in FIG. 13.

FIG. 13 is a schematic partial top view of a display substrate of a region P2 in FIG. 12. FIG. 14 is a schematic partial top view of a display substrate after a third conductive layer is formed in FIG. 13. In this example, film layer structures of the first reset transistor 121, the threshold compensation transistor 122, the drive transistor 123, the data writing transistor 124, the first light emitting control transistor 125, the second light emitting control transistor 126, the second reset transistor 127 and the storage capacitor 128 of the second valid pixel circuit 12 are substantially the same as film layer structures of the first reset transistor 111, the threshold compensation transistor 112, the drive transistor 113, the data writing transistor 114, the first light emitting control transistor 115, the second light emitting control transistor 116, the second reset transistor 117 and the storage capacitor 118 of the first pixel circuit 11, and thus will not be repeated here.

In some examples, as shown in FIG. 12 to FIG. 14, the second connector line 42a may be located in the third conductive layer, one end of the second connector line 42a may be electrically connected to the $1^{st}$ second sub-signal line 311a of the data line DL (k) through the seventeenth via hole V17 provided on the fourth insulation layer, and the other end of the second connector line 42a may be electrically connected to the $2^{nd}$ second sub-signal line 312a through the sixteenth via hole V16 provided on the fourth insulation layer. The second connector line 42c may be located in the third conductive layer, one end of the second connector line 42c may be electrically connected to the $1^{st}$ second sub-signal line 311b of the data line DL (k+1) through the nineteenth via hole V19 provided on the fourth insulation layer, and the other end of the second connector line 42c may be electrically connected to the $2^{nd}$ second sub-signal line 312b through the eighteenth via hole V18 provided on the fourth insulation layer.

In some examples, an orthographic projection of a connection position between the second connector line 42a and the $1^{st}$ second sub-signal line 311a, and an orthographic projection of the connection position between the second connector line 42a and the $2^{nd}$ second sub-signal line 312a on the base substrate may be overlapped with an orthographic projection of a same first reset control line on the base substrate. An orthographic projection of a connection position between the second connector line 42c and the $1^{st}$ second sub-signal line 311b, and an orthographic projection of the connection position between the second connector line 42c and the $2^{nd}$ second sub-signal line 312b on the base substrate may be overlapped with an orthographic projection of a same first reset control line on the base substrate.

Figure 15:
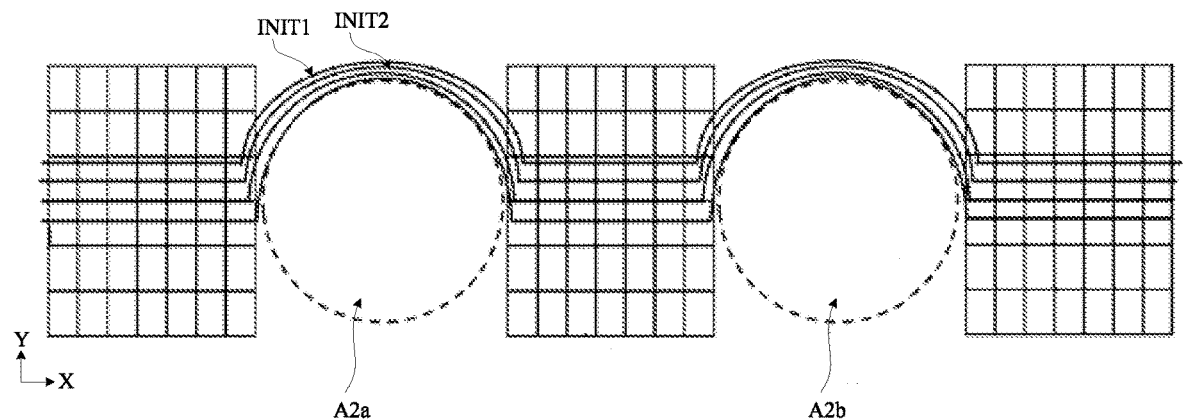
FIG. 15 is a schematic diagram of an arrangement of a first signal line and a second signal line according to at least one embodiment of the present disclosure.

FIG. 15 is a schematic diagram of arrangement of a first initial signal line and a second initial signal line according to at least one embodiment of the present disclosure. In some examples, as shown in FIG. 15, when a first initial signal provided by the first initial signal line INIT1 is different from a second initial signal provided by the second initial signal line INIT2, the first initial signal line INIT1 and the second initial signal line INIT2 may be routed along outer edges of the second display area A2a and the second display area A2b to bypass the two second display areas, avoid occupying the space of the second display area, and do not interfere with peripheral pixel circuits. When the first initial signal provided by the first initial signal line INIT1 and the second initial signal provided by the second initial signal line INIT2 are the same, a connection electrode may be arranged at the outer edges of both the second display areas A2a and A2b to connect the first initial signal line INIT1 located on two sides of the second display area A2a in the first direction X. However, this embodiment is not limited thereto.

Exemplary description is made below for a manufacturing process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film formed by a material on a base substrate through deposition, coating, or other processes. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern".

In some exemplary implementations, a manufacturing process of a display substrate may include following operations.

(1) A semiconductor layer is formed.

In some exemplary implementations, a semiconductor thin film is deposited on a base substrate 100, and the semiconductor thin film is patterned by a patterning process to form a semiconductor layer 50 in a first display area A1, as shown in FIG. 10A. Active layers of seven transistors of one pixel circuit may be in an integral structure in which the active layers are connected with each other. In some examples, a material of the semiconductor layer 50, for example, may include poly-silicon. However, this embodiment is not limited thereto.

In some exemplary implementations, the base substrate 100 may be a rigid substrate, e.g., a glass substrate. However, this embodiment is not limited thereto. For example, the base substrate may be a flexible substrate.

(2) A pattern of a first conductive layer is formed.

In some exemplary implementations, a first insulation thin film and a first conductive thin film are sequentially deposited on the base substrate 100 on which the aforementioned structures are formed, and the first conductive thin film is patterned by a patterning process to form a first insulation layer 101 covering the semiconductor layer 50 and a first conductive layer 51 arranged on the first insulation layer 101 in the first display area, as shown in FIG. 10B. The first conductive layer 51 may include a first gate metal layer (including a gate and a capacitor plate), a scan line, a first reset control line and a light emitting control line of the pixel circuit.

(3) A second conductive layer is formed.

In some exemplary implementations, a second insulation thin film and a second conductive thin film are sequentially deposited on the base substrate 100 on which the aforementioned structures are formed, and the second conductive thin film is patterned by a patterning process to form a second insulation layer 102 covering the first conductive layer 51 and a second conductive layer 52 arranged on the second insulation layer 102 in the first display area A1, as shown in FIG. 10C. The second conductive layer 52 may include a second first gate metal layer (e.g., including a capacitor plate), a first initial signal line and a second initial signal line of the pixel circuit.

(4) A third insulation layer is formed.

In some exemplary implementations, a third insulation thin film is deposited on the base substrate 100 on which the aforementioned patterns are formed, and the third insulation thin film is patterned through a patterning process to form a third insulation layer 103, as shown in FIG. 10D.

(5) A third conductive layer is formed.

In some exemplary implementations, a third conductive thin film is deposited on the base substrate where the aforementioned patterns are formed, and the third conductive thin film is patterned through a patterning process to form a third conductive layer 53 on the third insulation layer 103 in the first display area, as shown in FIG. 10E and FIG. 14. The third conductive layer 53 may include a first source-drain metal layer (for example, including multiple connection electrodes), a first connector line and a second connector line of the pixel circuit.

(6) A fourth insulation layer is formed.

In some exemplary implementations, a fourth insulation thin film is deposited on the base substrate 100 on which the aforementioned patterns are formed, and the fourth insulation thin film is patterned through a patterning process to form a fourth insulation layer 104, as shown in FIG. 10F.

(7) A fourth conductive layer is formed.

In some exemplary implementations, a fourth conductive thin film is deposited on the base substrate where the aforementioned patterns are formed, and the fourth conductive thin film is patterned by a patterning process to form the fourth conductive layer 54 on the fourth insulation layer 104 in the first display area A1, as shown in FIG. 8G and FIG. 13. The fourth conductive layer 54 may at least include a data line and a first power supply line.

So far, the manufacturing of the circuit structure layer of the first display area A1 is completed. The second display areas A2a and A2b may include the base substrate 100, the first insulation layer 101, the second insulation layer 102, the third insulation layer 103, and the fourth insulation layer 104 that are stacked on the base substrate 100.

(8) A first planarization layer, a first transparent conductive layer, a second planarization layer, a second transparent conductive layer, a third planarization layer, a third transparent conductive layer, a fourth planarization layer, an anode layer, a pixel definition layer, an organic light emitting layer and a cathode layer are formed sequentially.

In some exemplary implementations, a first planarization thin film is coated on the base substrate 100 on which the aforementioned patterns are formed, and the first planarization thin film is patterned through a patterning process to form a first planarization layer. Subsequently, a first transparent conductive thin film is deposited on the base substrate on which the aforementioned patterns are formed, and the first transparent conductive thin film is patterned through a patterning process to form a first transparent conductive layer. Subsequently, a second planarization thin film is coated on the base substrate on which the aforementioned patterns are formed, and the second planarization thin film is patterned through a patterning process to form a second planarization layer. Subsequently, a second transparent conductive thin film is deposited on the base substrate on which the aforementioned patterns are formed, and the second transparent conductive thin film is patterned through a patterning process to form a second transparent conductive layer. Subsequently, a third planarization thin film is coated on the base substrate on which the aforementioned patterns are formed, and the third planarization thin film is patterned through a patterning process to form a third planarization layer. Subsequently, a third transparent conductive thin film is deposited on the base substrate on which the aforementioned patterns are formed, and the third transparent conductive thin film is patterned through a patterning process to form a third transparent conductive layer. However, this embodiment is not limited thereto. In some other examples, only one or two transparent conductive layers may be provided.

In some exemplary implementations, an anode thin film is deposited on the base substrate on which the aforementioned patterns are formed, and the anode thin film is patterned through a patterning process to form an anode layer. Subsequently, a pixel definition thin film is coated on the base substrate on which the aforementioned patterns are formed, and a pixel definition layer is formed through mask, exposure, and development processes. The pixel definition layer is formed with multiple pixel openings exposing the anode layer. Subsequently, an organic emitting layer is formed in the aforementioned pixel openings, and the organic emitting layer is connected with an anode. Subsequently, a cathode thin film is deposited, the cathode thin film is patterned through a patterning process to form a cathode layer, and the cathode layer is electrically connected with the organic emitting layer and a second power supply line, respectively. In some examples, an encapsulation layer is formed on the cathode layer. The encapsulation layer may include a stacked structure of inorganic material/organic material/inorganic material.

In an exemplary implementations, the first conductive layer 51, the second conductive layer 52, the conductive metal layer 53 and the conductive metal layer 54 may be made of a metal material, such as any one or more of argentum (Ag), copper (Cu), aluminum (Al), and molybdenum (Mo), or an alloy material of the above metals, such as an Aluminum Neodymium alloy (AlNd) or a Molybdenum Niobium alloy (MoNb), and may be in a single-layer structure or a multi-layer composite structure, such as Mo/Cu/Mo. The first insulation layer 101, the second insulation layer 102, the third insulation layer 103, and the fourth insulation layer 104 may be made of any one or more of Silicon Oxide (SiOx), Silicon Nitride (SiNx), and Silicon Oxynitride (SiON), and may be a single layer, a multi-layer, or a composite layer. The first insulation layer 101 and the second insulation layer 102 may be referred to as Gate Insulation (GI) layers, and the third insulation layer 103 may be referred to as an Interlayer Dielectric (ILD) layer. The first planarization layer to the fourth planarization layer may be made of an organic material, such as polyimide, acrylic, or polyethylene terephthalate. The pixel definition layer may be made of an organic material, such as polyimide, acrylic, or polyethylene terephthalate. The anode layer may be made of a reflective material such as a metal, and the cathode layer may be made of a transparent conductive material. However, this embodiment is not limited thereto.

The structure and the manufacturing process of the display substrate of this embodiment are merely illustrative. In some exemplary implementations, a corresponding structure may be changed and a patterning process may be added or reduced according to actual needs. For example, a conductive layer is added on a side of the fourth conductive layer away from the base substrate, and the first connector line and the second connector line may be arranged within the added conductive layer. However, this embodiment is not limited thereto.

The manufacturing process of this exemplary embodiment may be implemented using an existing mature manufacture equipment, and is compatible well with an existing manufacturing process, simple in process implementation, easy to implement, high in a production efficiency, low in a production cost, and high in a yield.

Figure 16:
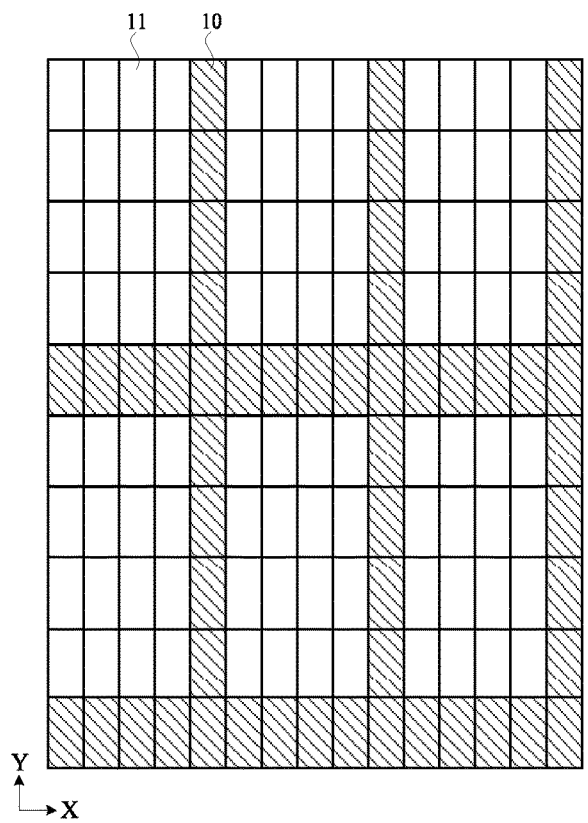
FIG. 16 is a schematic diagram of another arrangement of pixel circuits of a first display area according to at least one embodiment of the present disclosure.

FIG. 16 is a schematic diagram of another arrangement of pixel circuits of a first display area according to at least one embodiment of the present disclosure. In some examples, as shown in FIG. 16, second pixel circuits 10 may be arranged between multiple columns of the first pixel circuits 11 and multiple rows of the first pixel circuits 11. In some examples, a column of second pixel circuits 10 may be provided between first pixel circuits 11 per a columns, and a row of second pixel circuits 10 may be provided between first pixel circuits 11 per b rows, where a and b may be integers greater than or equal to 2. Compared with the first display area in which only the first pixel circuit is arranged, the original first pixel circuit arranged according to an a×b array may be compressed along the first direction X and the second direction Y, so that arrangement space of one row and one column of second pixel circuits 10 is newly added, and space occupied by the pixel circuits arranged according to the a×b array before compression may be the same as space occupied by the pixel circuits arranged according to a (A+1)× (b+1) array after compression. In this example, as shown in FIG. 16, a and b may both be 4. However, this embodiment is not limited thereto.

Figure 17:
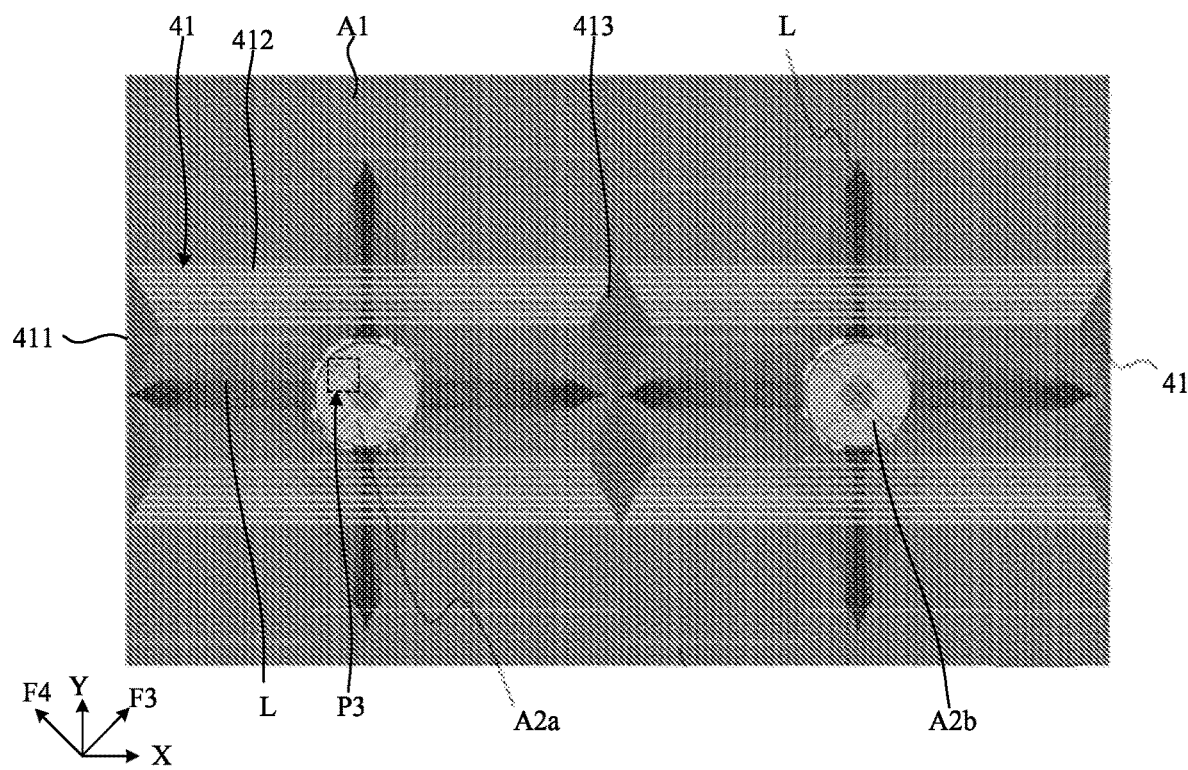
FIG. 17 is another schematic diagram of a display substrate according to at least one embodiment of the present disclosure.
Figure 18:
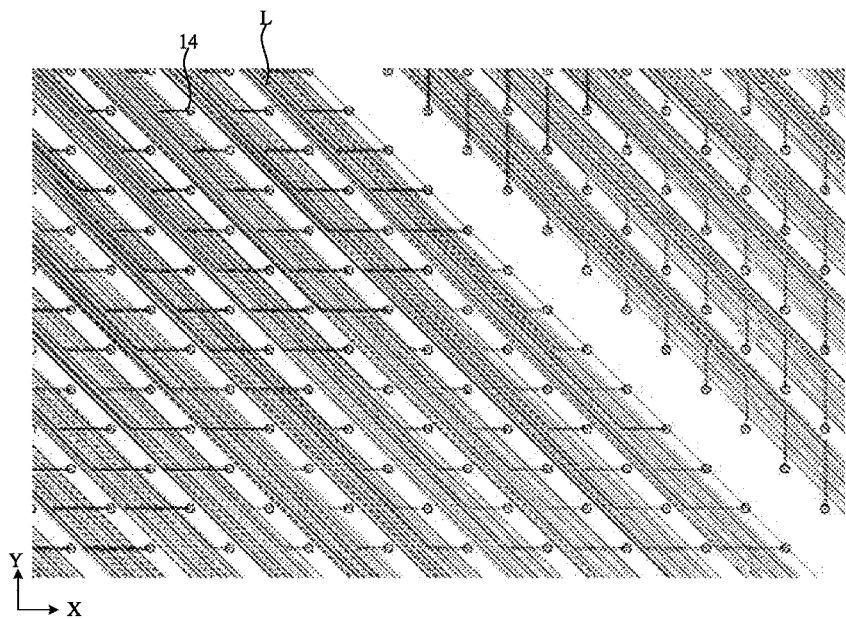
FIG. 18 is a schematic diagram of a trace of a transparent conductive line of a region P3 in FIG. 17.

FIG. 17 is another schematic diagram of a display substrate according to at least one embodiment of the present disclosure. FIG. 18 is a schematic diagram of a trace of a transparent conductive line of the region P3 in FIG. 17. In some exemplary implementations, as shown in FIG. 17, the second display areas A2a and A2b may be circles. Taking the second display area A2a as an example, the second display area A2a may be divided into four sub-display areas along a centerline of the third direction F3 and the fourth direction F4. The third direction F3 intersects with both the first direction X and the second direction Y, for example, an angle between the third direction F3 and the first direction X along the clockwise direction may be about 30 degrees to 60 degrees, for example, may be about 45 degrees. The fourth direction F4 intersects with the third direction F3, for example, the fourth direction F4 may be perpendicular to the third direction F3. For example, the second light emitting elements 14 in the two sub-display areas arranged along the first direction X may be electrically connected to adjacent second valid pixel circuits in the first display area A1 in the first direction X through transparent conductive lines L, and the second light emitting elements 14 in the two sub-display areas arranged along the second direction Y may be electrically connected to adjacent second valid pixel circuits in the first display area A1 along the second direction Y through the transparent conductive lines L. However, this embodiment is not limited thereto.

Figure 19:
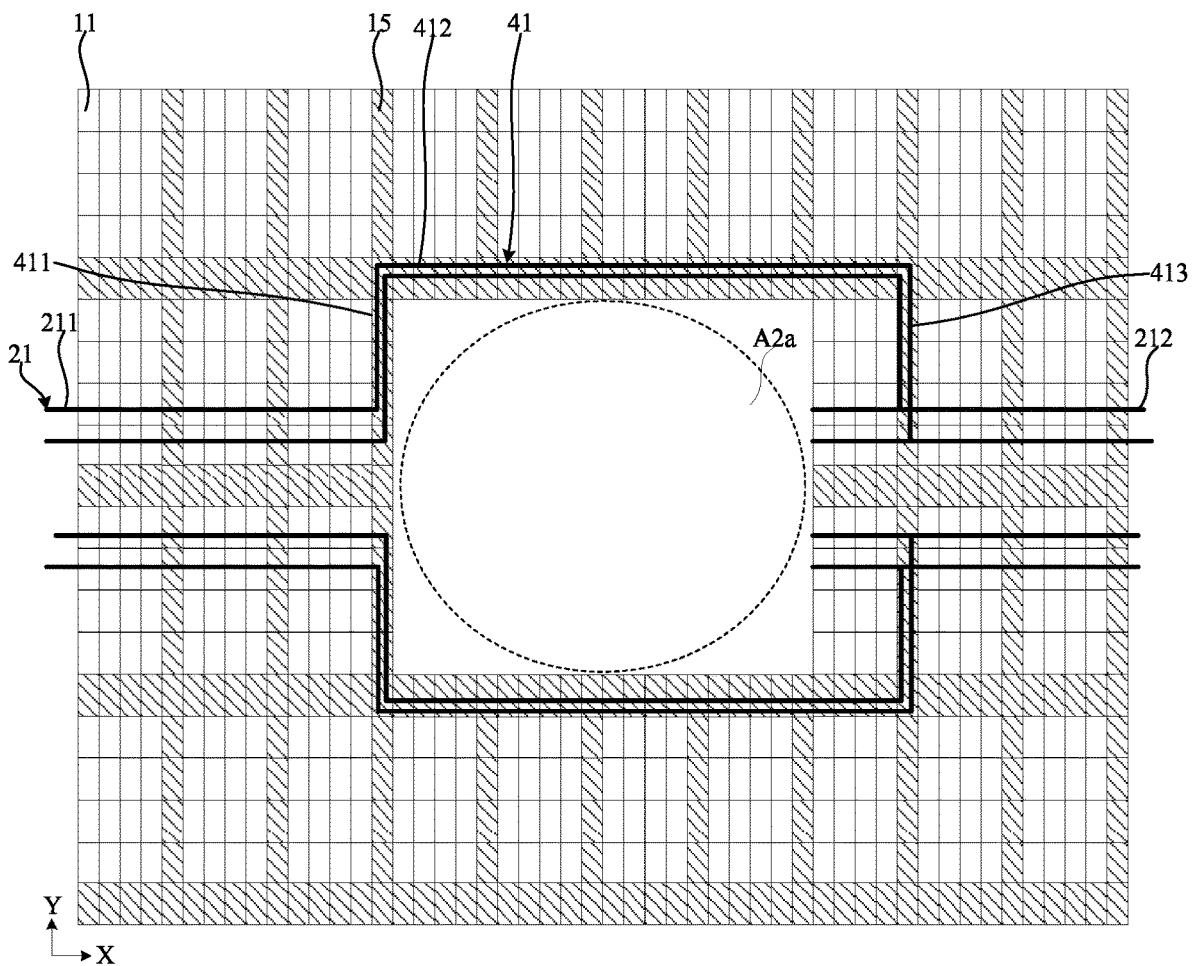
FIG. 19 is a schematic diagram of an arrangement of another trace of a first signal line according to at least one embodiment of the present disclosure.

FIG. 19 is a schematic diagram of an arrangement of another trace of a first signal line according to at least one embodiment of the present disclosure. In some examples, as shown in FIG. 17 to FIG. 19, the first signal line 21 partitioned by the second display area A2a and the second display area A2b may be electrically connected through a first connector line 41. The first connector line 41 may include a second line segment 412 extending along the first direction X, and a first line segment 411 and a third line segment 413 extending along the second direction Y. Orthographic projections of the first line segment 411 and the third line segment 413 on the base substrate may be overlapped with an orthographic projection of the multiple invalid pixel circuits 15 arranged along the second direction Y on the base substrate, and an orthographic projection of the second line segment 412 on the base substrate may be overlapped with the orthographic projection of the multiple invalid pixel circuits 15 arranged along the first direction X. In some examples, the multiple first signal lines 21 may include a first reset control line, a light emitting control line and a scan line. However, this embodiment is not limited thereto. In some other examples, the multiple first signal lines may include a first reset control line and a light emitting control line, and a connection mode of the scan lines partitioned by the second display area may refer to the description of the previous embodiment, and thus will not be repeated here.

Figure 20:
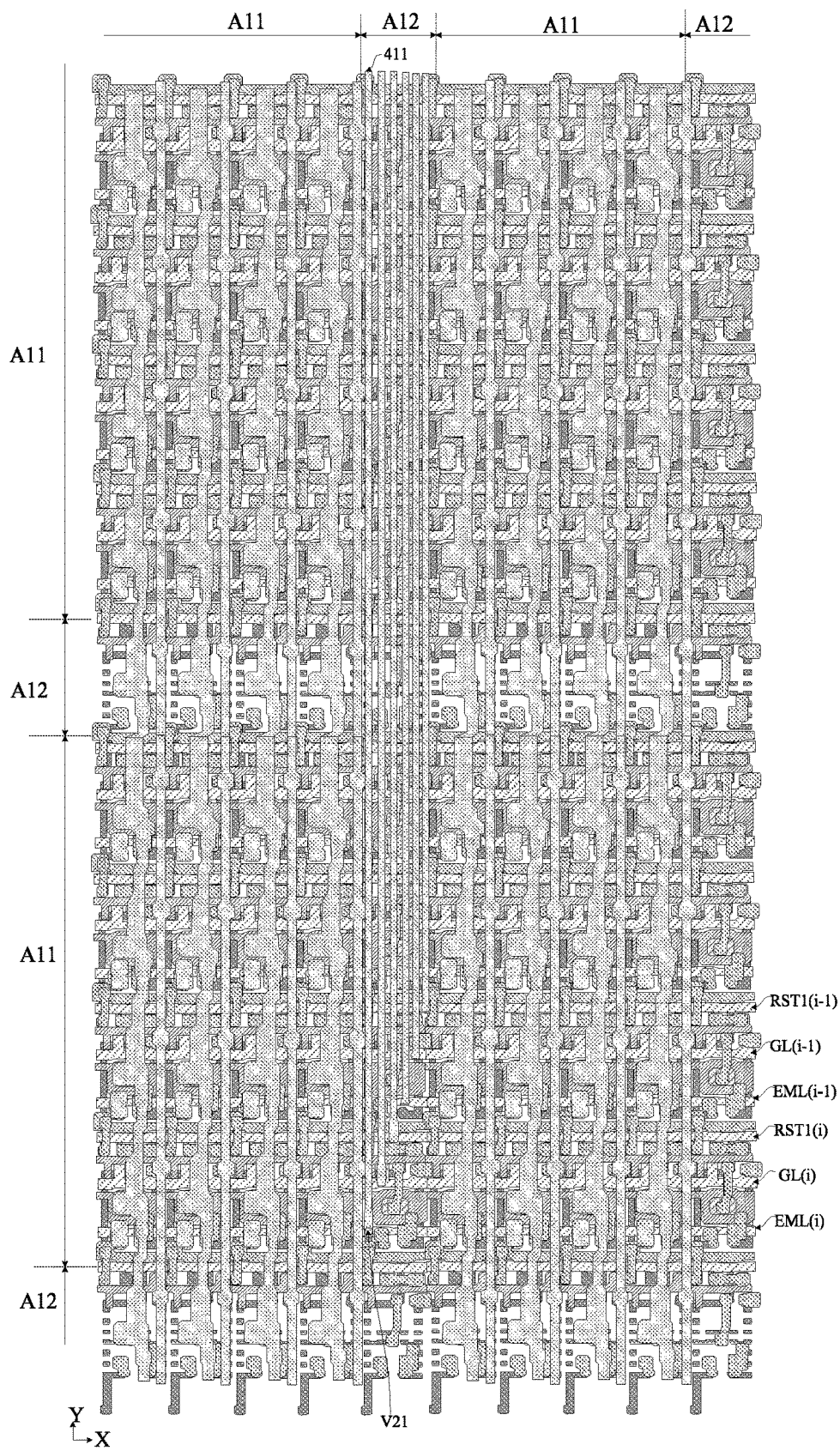
FIG. 20 is a partial top view of a display substrate according to at least one embodiment of the present disclosure.
Figure 21:
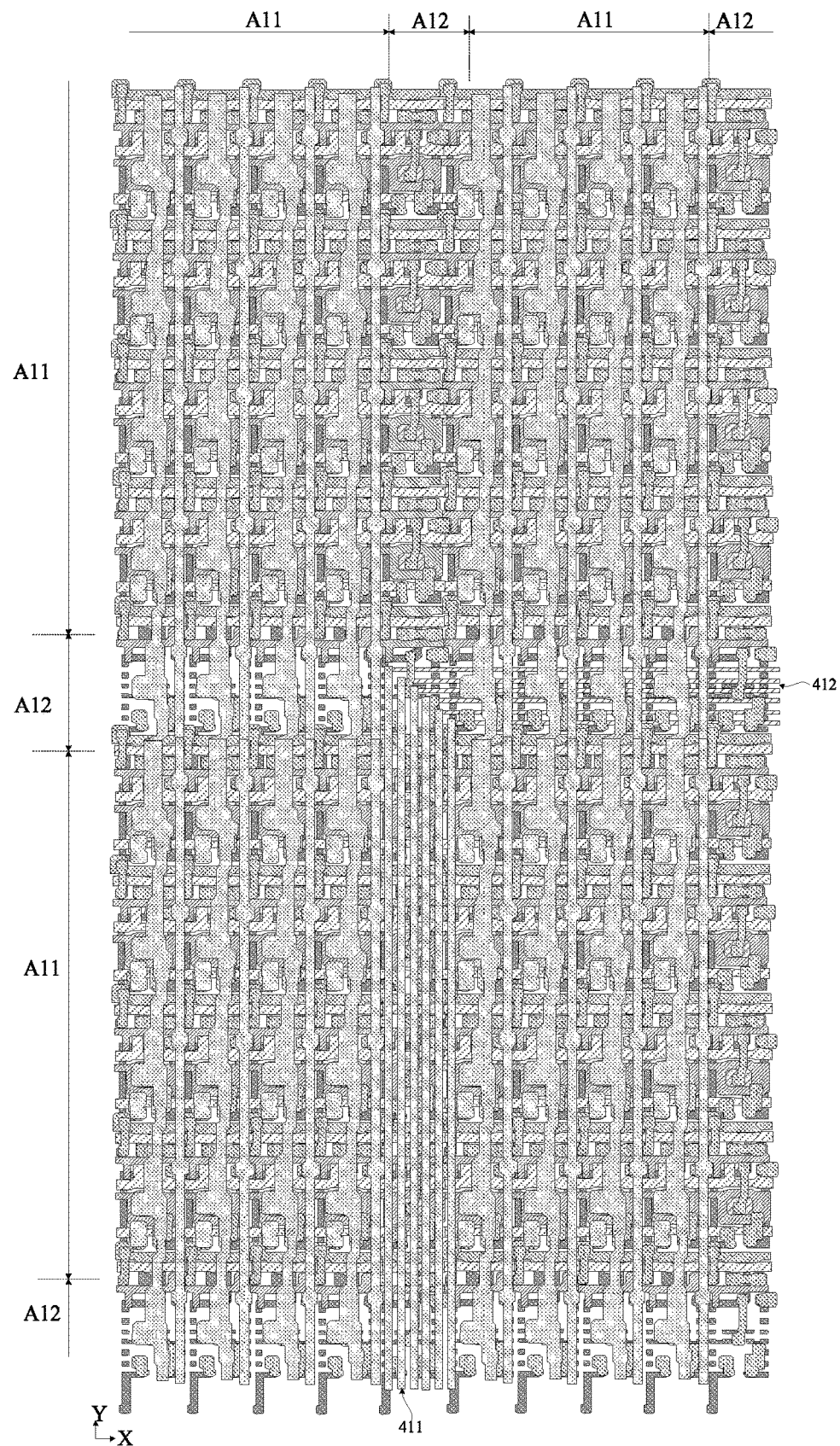
FIG. 21 is another partial top view of a display substrate according to at least one embodiment of the present disclosure.
Figure 22:
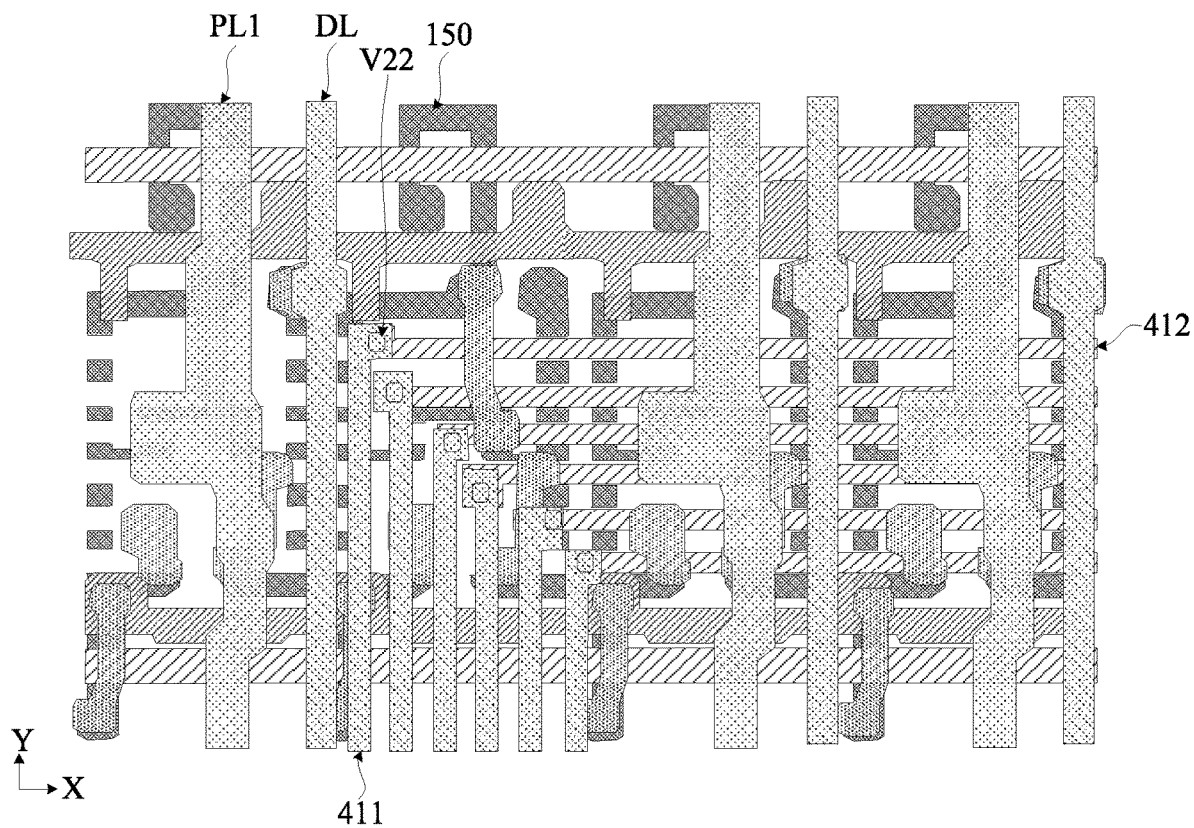
FIG. 22 is a partial enlarged schematic diagram of a connection position between a first line segment and a second line segment of a first connector line according to at least one embodiment of the present disclosure.

FIG. 20 and FIG. 21 are partial top views of a display substrate according to at least one embodiment of the present disclosure. In FIG. 20, a connection position between a first line segment of a first connector line and a first signal line is illustrated. In FIG. 21, a connection position between a first line segment and a second line segment of a first connector line is illustrated. FIG. 22 is a partial enlarged schematic diagram of a connection position of a first line segment and a second line segment of a first connector line according to at least one embodiment of the present disclosure.

In some exemplary implementations, as shown in FIG. 20 to FIG. 22, the first display area A1 may include a first circuit region A11 and a second circuit region A12. The multiple first circuit regions A11 are partitioned by the second circuit region A12 in both the first direction X and the second direction Y. One first circuit region A11 is provided with multiple first pixel circuits, and for example, one first circuit region A11 may be provided with first pixel circuits arranged in a 4×4 array. The second circuit region A12 is provided with multiple second pixel circuits (for example, including multiple invalid pixel circuits or including multiple second valid pixel circuits and multiple invalid pixel circuits).

In some examples, as shown in FIG. 19 to FIG. 22, one first connector line 41 may include a first line segment 411, a second line segment 412 and a third line segment 413 which are connected sequentially. The first line segment 411 and the third line segment 413 may be in a structure of a same layer, which are located, for example, in the fourth conductive layer, and the second line segment 412 may be located in the first conductive layer. The connection relationship between the first signal line and the first connector line is illustrated by taking the light emitting control line EML (i) as an example. As shown in FIG. 20, a first line segment 411 of the first connector line may be electrically connected to the light emitting control line EML (i) through the twenty-first via hole V21, and the fourth insulation layer, the third insulation layer, and the second insulation layer within the twenty-first via hole V21 may be removed to expose a surface of the light emitting control line EML (i) of the first conductive layer. The connection position between the first line segment 411 and the light emitting control line EML (i) may be located in the second circuit region A12. In this example, first line segments of six first connector lines may be arranged in one second circuit region A12 in the first direction X. The data line and the first power supply line of the fourth conductive layer of the second circuit region A12, where the invalid pixel circuit which is overlapped with the orthographic projection of the first line segment 411 on the base substrate is located, may be removed, and the via hole provided in the third insulation layer of the second circuit region A12 for connecting the electrode with the remaining film layers may be removed, so that arrangement space of the first line segment 411 may be provided, the influence on the connection of the first line segment 411 is avoided, and the trace capacitance of the first line segment 411 is reduced. However, this embodiment is not limited thereto. For example, the fourth conductive layer and the third conductive layer of the second circuit region, where the invalid pixel circuit which is overlapped with the orthographic projection of the first line segment on the base substrate is located, may be removed, and the via hole provided in the third insulation layer of the second circuit region for connecting the electrode with the remaining film layers may be removed.

In some examples, as shown in FIG. 21 and FIG. 22, the first line segment 411 may be electrically connected to the second line segment 412 located in the first conductive layer through the twenty-second via hole V22. The fourth insulation layer, the third insulation layer and the second insulation layer within the twenty-second via hole V22 may be removed. An orthographic projection of the second line segment 412 on the base substrate may be overlapped with an orthographic projection of the multiple invalid pixel circuits of the second circuit region on the base substrate. For example, the active layer, the first gate metal layer, and the second gate metal layer of multiple invalid pixel circuits arranged along the first direction X may be arranged discontinuously. The orthographic projection of the second line segment 412 on the base substrate may be not overlapped with the orthographic projections of the active layers and gates of the transistors of the invalid pixel circuits on the base substrate. The active layer of a transistor of an invalid pixel circuit which is overlapped with the orthographic projection of the second line segment 412 on the base substrate, may be partitioned by the second line segment 412, leaving only the active layer of the invalid pixel circuit which is not overlapped with the second line segment 412, so as to avoid the influence of the active layer of the invalid pixel circuit on the second line segment 412m and furthermore, traces located in the first conductive layer and the second conductive layer to which the invalid pixel circuit is electrically connected may be removed, thereby providing arrangement space for the second line segment 412 and reducing a trace capacitance of the second line segment. However, this embodiment is not limited thereto. In some other examples, the second line segment 412 may be located in the second conductive layer. The arrangement of the third line segment may refer to the illustration of the first line segment, and thus will not be repeated here.

The film layer structures of the display substrate according to this embodiment may refer to description of the aforementioned embodiments, and thus will not be repeated here.

In the display substrate according to this example, the first connector line is arranged in a region where the invalid pixel circuits are located, so that there is no need to occupy both the space of the valid pixel circuits and the space of the second display area, and both the drive control of the pixel circuit and the size of the second display area may be ensured. Furthermore, the first connector line may include a first line segment and a third line segment located in the fourth conductive layer and a second line segment located in the first conductive layer or the second conductive layer, and the first connector line may be made of a metal material, which can reduce the influence of resistance on the transmission of the gate drive signal. In addition, the film layer structures of the invalid pixel circuits which have an influence on the arrangement of the first connector line may be completely or partially removed, and the capacitance of the first connector line may be reduced to ensure signal transmission.

Figure 23:
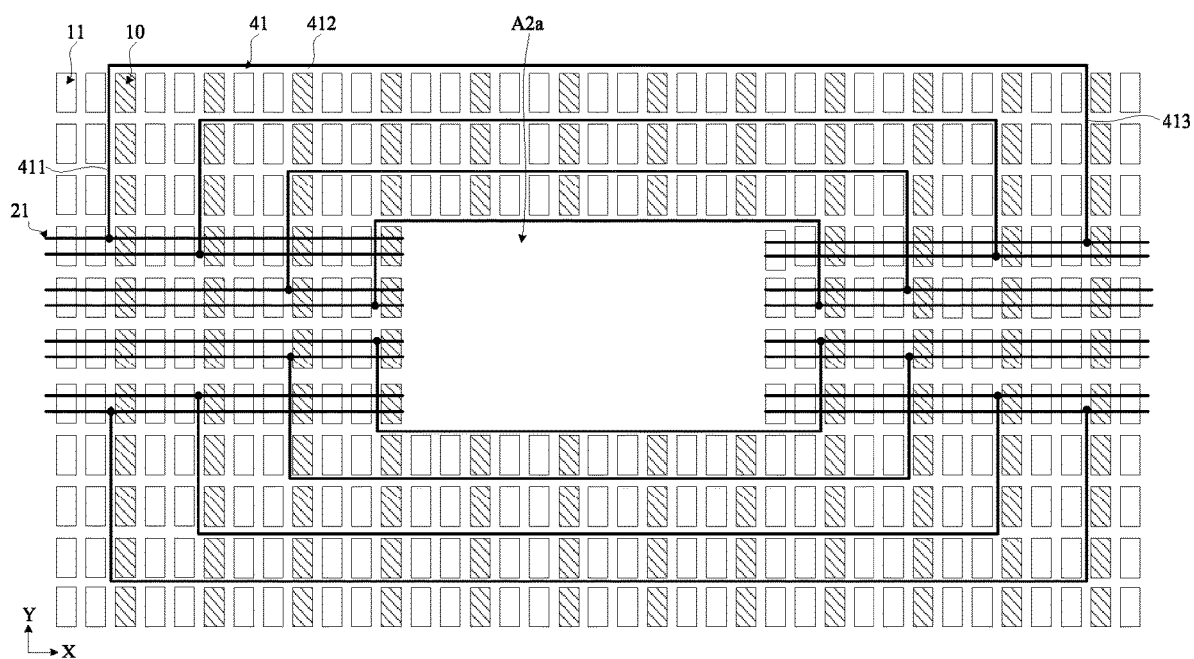
FIG. 23 is a schematic diagram of another arrangement of a first signal line according to at least one embodiment of the present disclosure.

FIG. 23 is a schematic diagram of another arrangement of a first signal line according to at least one embodiment of the present disclosure. In some examples, as shown in FIG. 23, a first connector line 41 to which a first signal line 21 is electrically connected may include a second line segment 412 extending along the first direction X, and a first line segment 411 and a third line segment 413 extending along the second direction Y. The first line segment 411 and the third line segment 413 may be arranged between adjacent pixel circuit columns, and the second line segment 412 may be arranged between adjacent pixel circuit columns. In this example, an orthographic projection of the first connector line 41 on the base substrate may be located between adjacent pixel circuits. Rest of the structure of the display substrate according to this embodiment may refer to descriptions of the aforementioned embodiments, and will not be repeated here.

Figure 24:
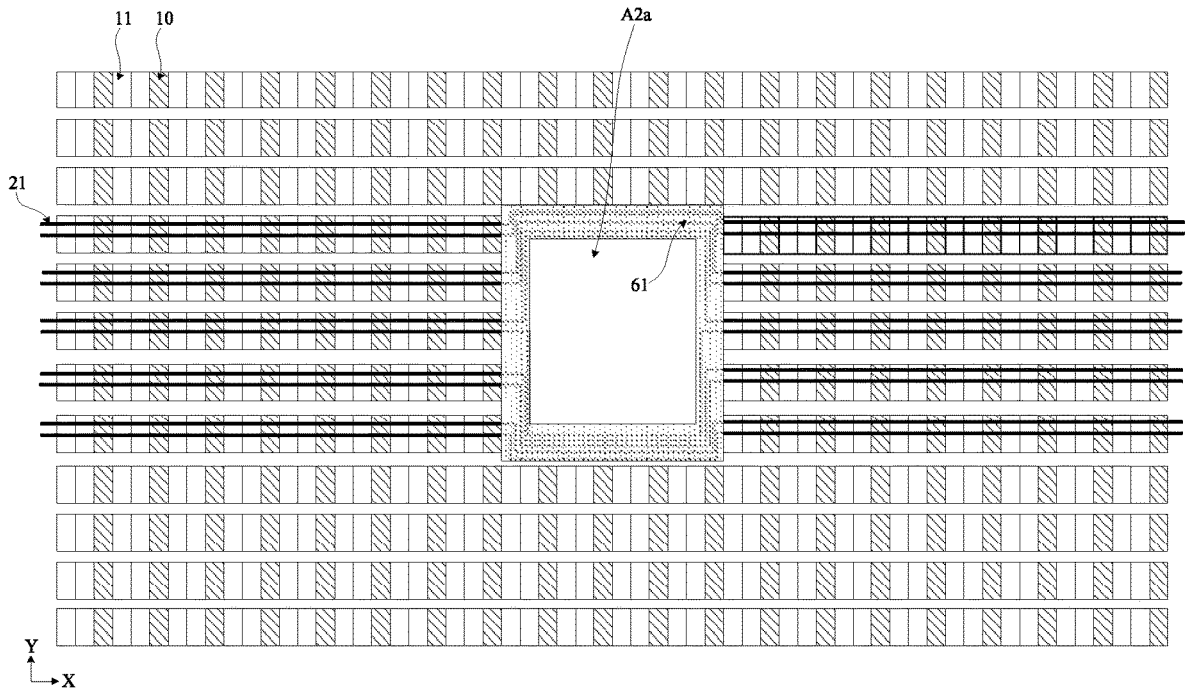
FIG. 24 is another schematic diagram of a display substrate according to at least one embodiment of the present disclosure.
Figure 25:
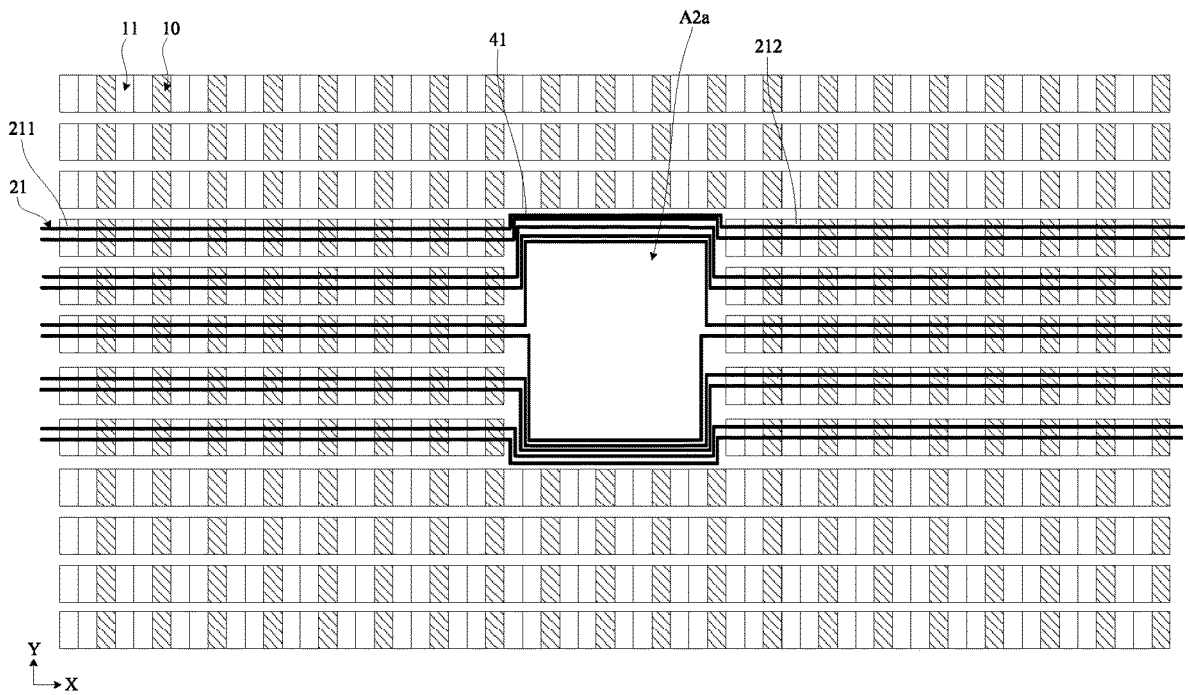
FIG. 25 is a schematic diagram of a first signal line in FIG. 24.

FIG. 24 is another schematic diagram of a display substrate according to at least one embodiment of the present disclosure. FIG. 25 is a schematic diagram of a first signal line in FIG. 24. In FIG. 24 and FIG. 25, only the arrangement of the first signal line around the second display area A2a is illustrated. An arrangement of the trace around the second display area A2b is similar to the arrangement of the trace around the second display area A2a, and thus will not be repeated here.

In some exemplary implementations, as shown in FIG. 24 and FIG. 25, the first signal line 21 may include three first sub-signal lines extending along the first direction X (for example, including a $1^{st}$ first sub-signal line 211, a $2^{nd}$ first sub-signal line 212 and a $3^{rd}$ first sub-signal line 212). The $1^{st}$ first sub-signal line 211 may be electrically connected to the $2^{nd}$ first sub-signal line 211 through a first connector line 41 to bypass the second display area A2a, and the $2^{nd}$ first sub-signal line 211 may be electrically connected to the $3^{rd}$ first sub-signal line through another first connector line to bypass the second display area A2b. For example, the first connector line 41 may first extend along the second direction Y, then extend along the first direction X and extend along the second direction Y. In this example, the first connector line 41 may be located in an edge region of the second display area A2a. For example, the $1^{st}$ first sub-signal line 211, the $2^{nd}$ first sub-signal line 211 and the first connector line 41 may be in an integral structure, which may be located, for example, in the first conductive layer or the second conductive layer. The first signal line of this example is wound by the first connector line arranged in the edge region of the second display area, so that the load of the first signal line may be reduced to improve the display uniformity.

In some examples, as shown in FIG. 24 and FIG. 25, the edge region of the second display area A2a may be provided with a shielding trace 61. An orthographic projection of the shielding trace 61 on the base substrate may cover an orthographic projection of the multiple first connector lines 41 on the base substrate. In some examples, the orthographic projection of the shielding trace 61 on the base substrate may be annular (e.g., a rectangular ring or a circular ring). In this example, a gap between the multiple first transfer lines 41 may be covered by the shielding trace 61, thereby avoiding an interference phenomenon.

In some examples, the shielding trace 61 may be electrically connected to the first power supply line. For example, the shielding trace 61 may be electrically connected with first power supply lines arranged in the first display area on the upper side and the lower side of the second display area A2a. The shielding trace 61 and the first power supply line are in a structure of a same layer. For example, the shielding trace 61 may be located in the third conductive layer, and the first signal line 21 may be located in the first conductive layer or the second conductive layer. In some other examples, the shielding trace 61 may be electrically connected with a first initial signal line or a second initial signal line. For example, the shielding trace 61 may be electrically connected to the first initial signal line or the second initial signal line arranged in the first display area on the left and right sides of the second display area A2a. The shielding trace 61 and the first initial signal line or and the second initial signal line may be in a structure of a same layer, which may be located, for example, in the second conductive layer, and the first signal line 21 may be located in the first conductive layer. In some other examples, the shielding trace 61 may be electrically connected to a second power supply line. However, this embodiment is not limited thereto. The shielding trace may be electrically connected with other traces that provide direct-current signals.

In some examples, the multiple first signal lines may include a scan line, a first reset control line and a light emitting control line. In some other examples, the multiple first signal lines 21 may include a scan line, a first reset control line, a light emitting control line, a first initial signal line and a second initial signal line. However, this embodiment is not limited thereto. In some other examples, the multiple first signal lines 21 may include a first initial signal line and a second initial signal line, and the scan line, the first reset control line and the light emitting control line may be arranged according to the aforementioned embodiments.

Figure 26:
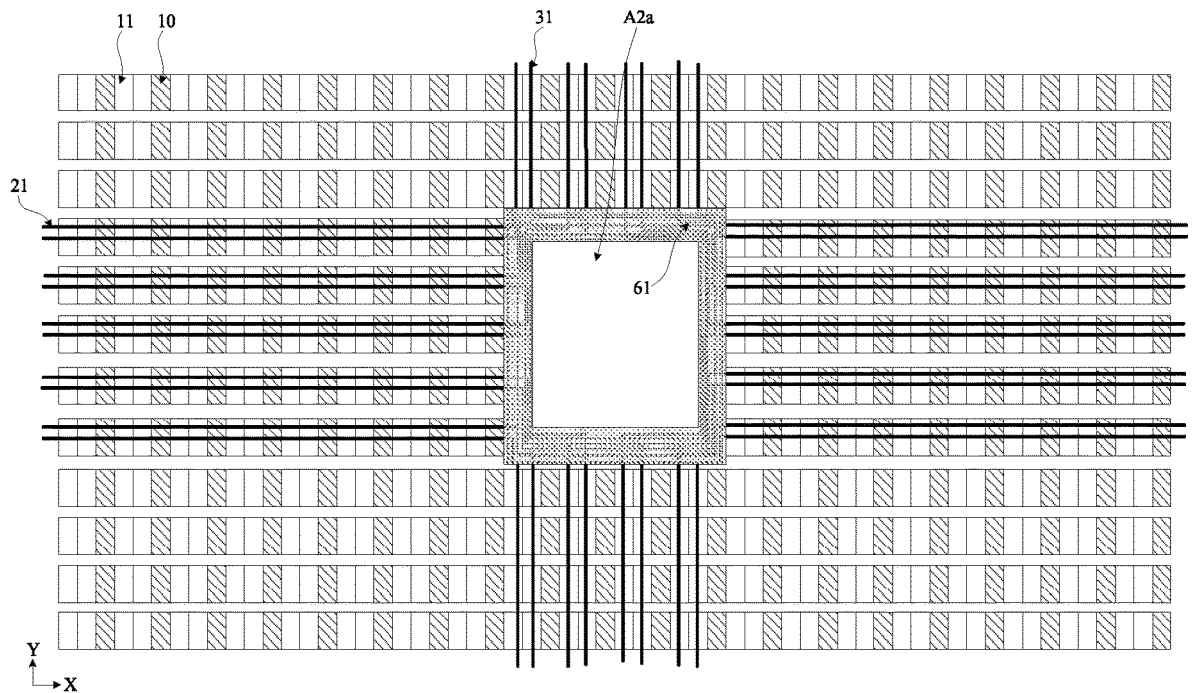
FIG. 26 is another schematic diagram of a display substrate according to at least one embodiment of the present disclosure.
Figure 27:
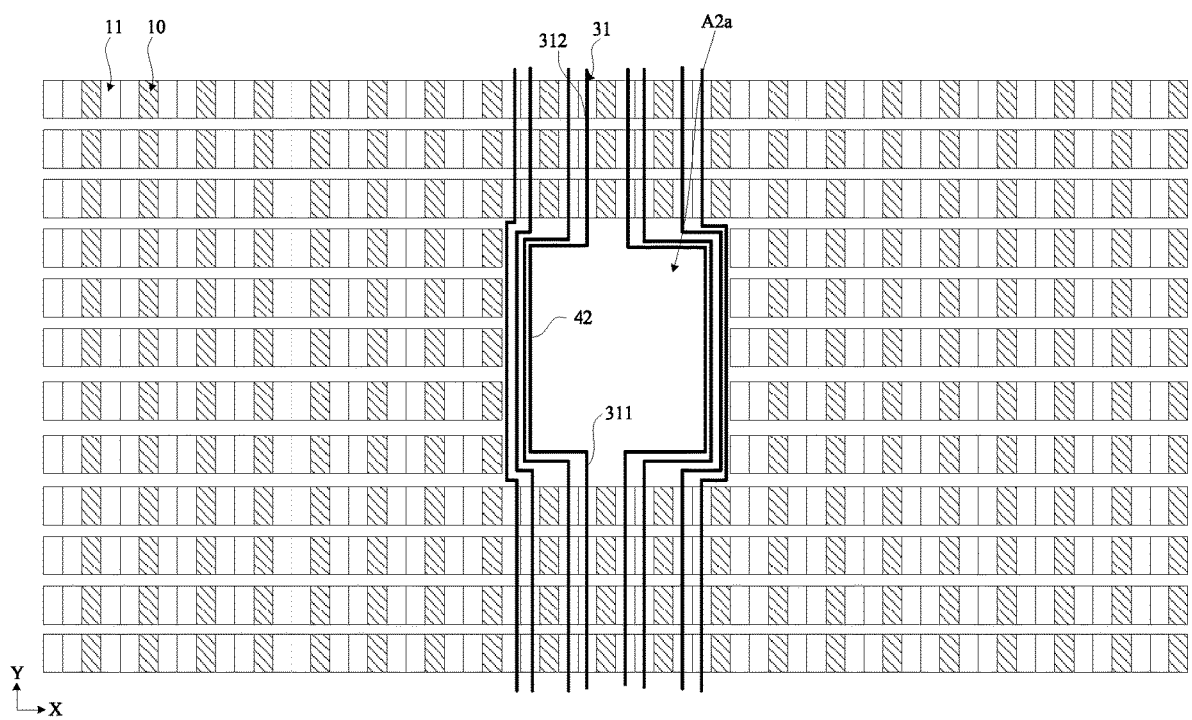
FIG. 27 is a schematic diagram of a second signal line in FIG. 26.

FIG. 26 is another schematic diagram of a display substrate according to at least one embodiment of the present disclosure. FIG. 27 is a schematic diagram of a second signal line in FIG. 26. In FIG. 26, only the arrangement of the first signal line and the second signal line around the second display area A2a is illustrated. An arrangement of the trace around the second display area A2b is similar to the arrangement of the trace around the second display area A2a, and thus will not be repeated here.

In some exemplary implementations, as shown in FIG. 26 and FIG. 27, the second signal line 31 may include two second sub-signal lines (for example, including a $1^{st}$ second sub-signal line 311 and a $2^{nd}$ second sub-signal line 312). The $1^{st}$ second sub-signal line 311 may be electrically connected to one column of first pixel circuits 11 in the first display area on the lower side of the second display area A2a, and the $2^{nd}$ second sub-signal line 312 may be electrically connected to one column of first pixel circuits 11 in the first display area on the upper side of the second display area A2a. A first pixel circuit to which the $1^{st}$ second sub-signal line 311 of one second signal line 31 is connected and a first pixel circuit to which the $2^{nd}$ second sub-signal line 312 is connected may be located in a same column. The 1st second sub-signal line 311 and the $2^{nd}$ second sub-signal line 312 may be electrically connected through a second connector line 42. For example, the second connector line 42 may first extend along the first direction X, then extend along the second direction Y, and then extend along the first direction X. In this example, the second connector line 42 may be located in an edge region of the second display area A2a. In some examples, the $1^{st}$ second sub-signal line 311, the $2^{nd}$ second sub-signal line 312, and the second connector line 42 of the second signal line 31 may be in an integral structure, which may be, for example, in the third conductive layer or the fourth conductive layer. The second signal line of this example bypasses the second display area by the second connector line in the edge region of the second display area, so that the load of the second signal line may be reduced to improve the display uniformity.

In some examples, as shown in FIG. 26, the edge region of the second display area A2a may be provided with a shielding trace 61. An orthographic projection of the shielding trace 61 on the base substrate may cover orthographic projections of the multiple first connector lines 41 and multiple second connector lines 42 on the base substrate. The illustration of the shielding trace 61 and the first signal line 21 may refer to the descriptions in the aforementioned embodiments, and thus will not be repeated here. In this example, a gap between the multiple first connector lines 41 and a gap between the multiple second connector lines 42 may be covered through the shielding trace 61, thereby avoiding an interference phenomenon.

In some examples, the second signal line 31 may include a data line which may be electrically connected to a same column of first pixel circuits in the first display area on the upper and lower sides of the second display area A2a, and the second valid pixel circuit in the second display area A2a, which is electrically connected to the same column of second light emitting elements as that column of first pixel circuits, may be electrically connected to another data line. However, this embodiment is not limited thereto. In some other examples, the second signal line may further include an initial signal line (for example, a first initial signal line and a second initial signal line).

In some exemplary implementations, the first signal line around the second display area A2a and the first signal line around the second display area A2b may be wound in a same manner or may be wound in different manners. For example, the first signal line around the second display area A2a may be wound in the manner shown in FIG. 6 or FIG. 19, and the first signal line around the second display area A2b may be wound in the manner shown in FIG. 25. For another example, the second signal line around the second display area A2a may be wound in a manner shown in FIG. 11, and the second signal line around the second display area A2b may be wound in a manner shown in FIG. 27. However, this embodiment is not limited thereto.

Figure 28:
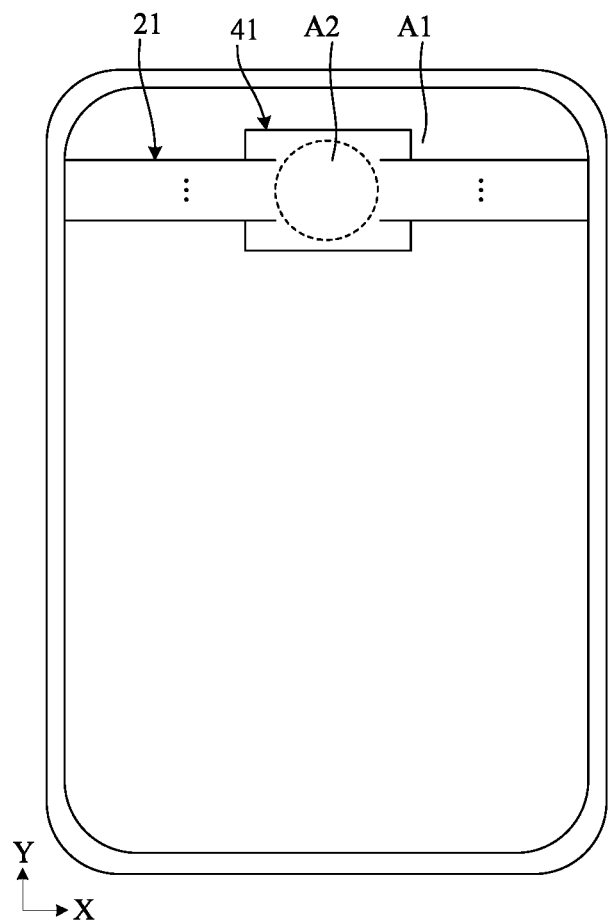
FIG. 28 is another schematic diagram of a display substrate according to at least one embodiment of the present disclosure.

FIG. 28 is another schematic diagram of a display substrate according to at least one embodiment of the present disclosure. In some examples, as shown in FIG. 28, the display area of the display substrate may include a first display area A1 and a second display area A2. The first display area A1 may surround the second display area A2. The first signal lines 21 partitioned by the second display area A2 may be electrically connected through the first connector lines 41 bypassing a side of second display area A2 in the second direction Y, thereby enabling a same row of pixel circuits on the left and right sides of the second display area A2 to receive a same signal. The arrangement modes of the first connector lines and the second signal lines of this embodiment may refer to the descriptions of the aforementioned embodiments, and thus will not be repeated here. However, this embodiment is not limited thereto. In some other examples, the display area of the display substrate may include three or more second display areas.

At least one embodiment of the present disclosure further provides a display device which includes the display substrate as described above.

Figure 29:
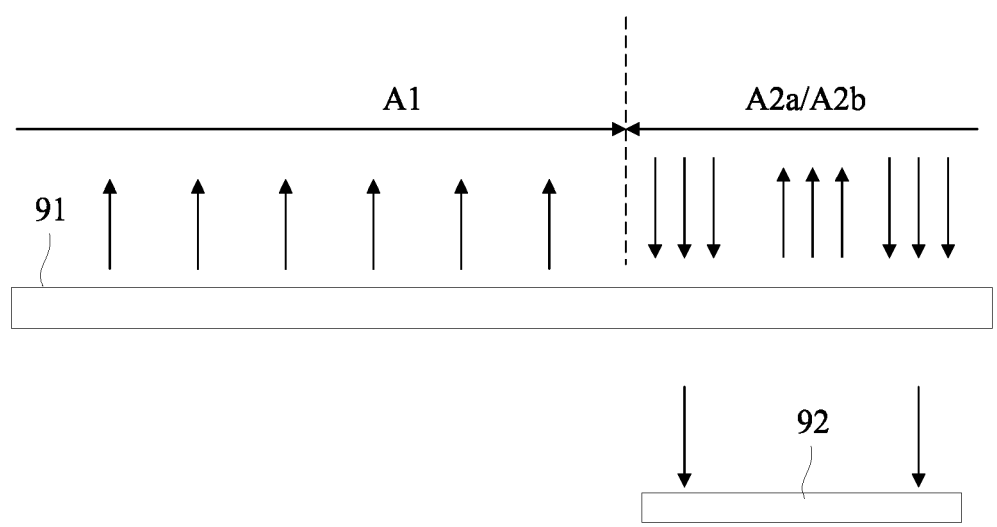
FIG. 29 is a schematic diagram of a display device according to at least one embodiment of the present disclosure.

FIG. 29 is a schematic diagram of a display device according to at least one embodiment of the present disclosure. As shown in FIG. 29, a display device is provide in this embodiment, which includes a display substrate 91 and a photosensitive sensor 92 located on a light exit side of a display structure layer away from the display substrate 91. An orthographic projection of the photosensitive sensor 92 on the display substrate 91 is overlapped with the second display areas A2a and A2b.

In some exemplary implementations, the display substrate 91 may be a flexible OLED display substrate, a QLED display substrate, a Micro-LED display substrate or a Mini-LED display substrate. The display device may be any product or component with a display function such as an OLED display, a cell phone, a tablet, a television, a display, a laptop, a digital photo frame, a navigator, and so on, which is not limited in the embodiments of the present disclosure.

The drawings of the present disclosure only involve structures involved in the present disclosure, and other structures may refer to conventional designs. The embodiments in the present disclosure, i.e., features in the embodiments, may be combined with each other to obtain new embodiments if there is no conflict. Those of ordinary skills in the art should understand that modifications or equivalent replacements of the technical solutions of the present disclosure may be made without departing from the spirit and scope of the technical solutions of the present disclosure, and shall all fall within the scope of the claims of the present disclosure.

The invention claimed is:

1. A display substrate, comprising:
    a base substrate comprising a first display area and at least one second display area, wherein the first display area at least partially surrounds the at least one second display area;
    a plurality of pixel circuits and a plurality of first light emitting elements located in the first display area; the plurality of pixel circuits comprise a plurality of first pixel circuits and a plurality of second pixel circuits, wherein the plurality of second pixel circuits comprise a plurality of second valid pixel circuits and a plurality of invalid pixel circuits;
    a plurality of second light emitting elements located in the at least one second display area; at least one first pixel circuit of the plurality of first pixel circuits is electrically connected to at least one first light emitting element of the plurality of first light emitting elements, and the at least one first pixel circuit is configured to drive the at least one first light emitting element to emit light; at least one second valid pixel circuit of the plurality of second valid pixel circuits is electrically connected to at least one second light emitting element of the plurality of second light emitting elements, and the at least one second valid pixel circuit is configured to drive the at least one second light emitting element to emit light;
    at least one first signal line extending along a first direction, located in the first display area and electrically connected to a plurality of pixel circuits of the first display area, wherein the at least one first signal line is partitioned into at least two first sub-signal lines by the at least one second display area;
    adjacent first sub-signal lines of the at least two first sub-signal lines are electrically connected through a first connector line; and at least part of line segments of the first connector line is located between the plurality of first pixel circuits.

2. The display substrate according to claim 1, wherein an orthographic projection of the first connector line on the base substrate satisfies at least one of the following:
    the orthographic projection of the first connector line on the base substrate is overlapped with an orthographic projection of at least one invalid pixel circuit of the first display area on the base substrate;
    the orthographic projection of the first connector line on the base substrate is located between the plurality of first pixel circuits and the plurality of second pixel circuits; and
    the orthographic projection of the first connector line on the base substrate is located in an edge region of the at least one second display area.

3. The display substrate according to claim 1, wherein the first connector line at least comprises: a first line segment, a second line segment and a third line segment which are connected sequentially; and an extension direction of the first line segment is the same as an extension direction of the third line segment, and an extension direction of the second line segment intersects with the extension direction of the first line segment.

4. The display substrate according to claim 3, wherein an orthographic projection of the first line segment and the third line segment on the base substrate are overlapped with an orthographic projection of the plurality of invalid pixel circuits of the first display signal line on the base substrate, and an orthographic projection of the second line segment on the base substrate is located between the plurality of pixel circuits; or
    an orthographic projection of the first line segment, the second line segment and the third line segment on the base substrate is overlapped with the orthographic projection of the plurality of invalid pixel circuits of the first display area on the base substrate.

5. The display substrate according to claim 3- or 4, wherein the first line segment, the second line segment and the third line segment are disposed in a same layer; or, the first line segment and the third line segment are disposed in a same layer, and the first line segment and the second line segment are located in different conductive layers.

6. The display substrate according to claim 4, wherein in a direction perpendicular to the display substrate, the pixel circuits at least comprises: an active layer, a first gate metal layer, a second gate metal layer and a first source-drain metal layer which are arranged on the base substrate; the active layer, the first gate metal layer and the second gate metal layer of the invalid pixel circuits are all arranged discontinuously; and the orthographic projection of the second line segment of the first connector line on the base substrate is located in a region where the invalid pixel circuits are located, and the orthographic projection of the second line segment on the base substrate is not overlapped with orthographic projections of the active layer, the first gate metal layer and the second gate metal layer of the invalid pixel circuits on the base substrate.

7. The display substrate according to claim 6, wherein the first source-drain metal layer of an invalid pixel circuit which is overlapped with the orthographic projection of the first line segment or the third line segment of the first connector line on the base substrate is not electrically connected to the active layer, the first gate metal layer, and the second gate metal layer of the invalid pixel circuit.

8. The display substrate according to claim 6- or 7, wherein the first line segment and the third line segment of the first connector line are located on a side of the first source-drain metal layer away from the base substrate, and the second line segment or the first gate metal layer or the second gate metal layer are disposed in a same layer.

9. The display substrate according to claim 2, wherein when the orthographic projection of the first connector line on the base substrate is located in the edge region of the at least one second display area, the edge region of the at least one second display area is provided with a shielding trace, and an orthographic projection of the shielding trace on the base substrate covers the orthographic projection of the first connector line on the base substrate.

10. The display substrate according to claim 1, wherein the at least one first signal line comprises at least one of the followings: a light emitting control line, a first reset control line, a second reset control line, a scan line, a first initial signal line and a second initial signal line.

11. The display substrate according to claim 1, further comprising at least one second signal line which is located in the first display area and extends along the second direction, wherein the second direction intersects with the first direction; and a second signal line is partitioned into at least two second sub-signal lines by the at least one second display area, and adjacent second sub-signal lines of the at least two second sub-signal lines are electrically connected through a second connector line.

12. The display substrate according to claim 11, wherein the at least one second signal line comprises a data line.

13. The display substrate according to claim 11, wherein in a direction perpendicular to the display substrate, the second connector line is located on a side of the at least one second signal line close to the base substrate.

14. The display substrate according to claim 11, wherein the first connector line is located on a side of the second connector line away from the second display area.

15. The display substrate according to claim 11, wherein an orthographic projection of the second connector line on the base substrate is located in an edge region of the at least one second display area; and the edge region of the at least one second display area is provided with a shielding trace, and an orthographic projection of the shielding trace on the base substrate covers the orthographic projection of the second connector line on the base substrate.

16. The display substrate according to claim 9, wherein the shielding trace is electrically connected to a first power supply line.

17. The display substrate according to claim 1, wherein a plurality of first signal lines are divided into two groups, and a second display area has a first side and a second side which are opposite in the second direction, wherein a first group of the first signal lines bypass the second display area from the first side of the second display area through the first connector line, and a second group of the first signal lines bypass the second display area from the second side of the second display area through the first connector line; and the second direction intersects with the first direction.

18. The display substrate according to claim 1, wherein the base substrate comprises two second display areas, and the two second display areas are aligned in the first direction.

19. The display substrate according to claim 18, wherein a first signal line is partitioned into three first sub-signal lines by the two second display areas; a $1^{st}$ first sub-signal line and a $2^{nd}$ first sub-signal line are electrically connected through a $1^{st}$ first connector line, and the $2^{nd}$ first sub-signal line and a $3^{rd}$ first sub-signal line are electrically connected through a $2^{nd}$ first connector line; and the $1^{st}$ first connector line bypasses a first one of the second display areas, and the $2^{nd}$ first connector line bypasses a second one of the second display areas; and the $1^{st}$ first connector line and the $2^{nd}$ first connector line are located on a same side of the two second display areas in the second direction, and the second direction intersects with the first direction.

20. A display device, comprising the display substrate according to claim 1.

* * * * *

UNITED STATES PATENT AND TRADEMARK OFFICE
CERTIFICATE OF CORRECTION

PATENT NO. : 12,490,589 B2
APPLICATION NO. : 18/034069
DATED : December 2, 2025
INVENTOR(S) : Qiwei Wang, Yuanjie Xu and Cong Liu It is certified that error appears in the above-identified patent and that said Letters Patent is hereby corrected as shown below:

In the Claims

Claim 5 should read:
5. The display substrate according to claim 3, wherein the first line segment, the second line segment and the third line segment are disposed in a same layer; or, the first line segment and the third line segment are disposed in a same layer, and the first line segment and the second line segment are located in different conductive layers.

Claim 8 should read:
8. The display substrate according to claim 6, wherein the first line segment and the third line segment of the first connector line are located on a side of the first source-drain metal layer away from the base substrate, and the second line segment or the first gate metal layer or the second gate metal layer are disposed in a same layer.

Signed and Sealed this
Tenth Day of February, 2026

John A. Squires
*Director of the United States Patent and Trademark Office*